United States Patent
Appelt et al.

(10) Patent No.: US 10,217,728 B2
(45) Date of Patent: Feb. 26, 2019

(54) SEMICONDUCTOR PACKAGE AND SEMICONDUCTOR PROCESS

(71) Applicant: Advanced Semiconductor Engineering, Inc., Kaohsiung (TW)

(72) Inventors: Bernd Karl Appelt, Kaohsiung (TW); Kay Stefan Essig, Kaohsiung (TW); You-Lung Yen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 28 days.

(21) Appl. No.: 15/359,403

(22) Filed: Nov. 22, 2016

(65) Prior Publication Data

US 2018/0145060 A1 May 24, 2018

(51) Int. Cl.
| | |
|---|---|
| *H01L 23/02* | (2006.01) |
| *H01L 25/10* | (2006.01) |
| *H01L 25/065* | (2006.01) |
| *H01L 25/00* | (2006.01) |

(52) U.S. Cl.
CPC ........ *H01L 25/105* (2013.01); *H01L 25/0652* (2013.01); *H01L 25/50* (2013.01); *H01L 2224/18* (2013.01); *H01L 2224/96* (2013.01); *H01L 2225/107* (2013.01); *H01L 2225/1035* (2013.01); *H01L 2225/1041* (2013.01); *H01L 2225/1058* (2013.01)

(58) Field of Classification Search
CPC ........... H01L 24/94; H01L 2224/04105; H01L 2224/32145; H01L 2225/1064; H01L 23/3107; H01L 2924/181; H01L 2224/73265

USPC ........ 257/686, 777, 787; 438/106, 107, 108, 438/109, 110, 125, 126, 127
See application file for complete search history.

(56) References Cited

U.S. PATENT DOCUMENTS

| | | | |
|---|---|---|---|
| 7,508,061 B2 | 3/2009 | Kang et al. | |
| 8,319,327 B2* | 11/2012 | Suh ....................... | H01L 21/561 257/686 |
| 2004/0156165 A1* | 8/2004 | Melody .................. | H01G 9/012 361/523 |
| 2010/0025833 A1* | 2/2010 | Pagaila ................. | H01L 21/561 257/686 |
| 2013/0256919 A1* | 10/2013 | Scholz .................. | H01L 21/561 257/777 |

(Continued)

*Primary Examiner* — S. V. Clark
(74) *Attorney, Agent, or Firm* — Foley & Lardner LLP; Cliff Z. Liu

(57) ABSTRACT

A semiconductor package includes a first semiconductor die, a first encapsulant, a first redistribution layer, a second encapsulant and a patterned conductive layer. The first encapsulant encloses the first semiconductor die and has a top surface and a lateral surface. The first redistribution layer is disposed on the top surface of the first encapsulant and electrically connected to the first semiconductor die, wherein a portion of the first redistribution layer is exposed from the lateral surface of the first encapsulant. The second encapsulant covers the first encapsulant and the first redistribution layer. The patterned conductive layer is disposed on at least one of the lateral surface of the first encapsulant or a lateral surface of the second encapsulant, and is electrically connected to the first redistribution layer.

47 Claims, 41 Drawing Sheets

(56) References Cited

U.S. PATENT DOCUMENTS

| | | | |
|---|---|---|---|
| 2015/0162310 A1* | 6/2015 | Vincent | H01L 25/50 257/777 |
| 2015/0325556 A1* | 11/2015 | Lai | H01L 23/49811 257/777 |
| 2016/0005718 A1 | 1/2016 | Cheah et al. | |
| 2016/0013076 A1* | 1/2016 | Vincent | H01L 23/16 257/777 |
| 2016/0181202 A1* | 6/2016 | Gong | H01L 23/5389 257/762 |

* cited by examiner

SEMICONDUCTOR PACKAGE AND SEMICONDUCTOR PROCESS

TECHNICAL FIELD

The present disclosure relates to a semiconductor package and semiconductor process, and more particularly to a semiconductor package including a patterned conductive layer on a lateral surface thereof and a semiconductor process for manufacturing the same.

BACKGROUND

In a package, a semiconductor die and/or electronic components (e.g., passive components) can be mounted to a top side of a substrate, and an encapsulant can be formed to cover the semiconductor die and/or electronic components and the top side of the substrate. Then, a plurality of pads can be formed on a bottom side of the substrate for external connection. In order to increase a number of external connections, additional pads and conductive circuitry may be formed on the top surface of the encapsulant or on the top surface of the semiconductor die. Further, in order to increase the input/output (I/O) count of the semiconductor die and/or electronic components, the semiconductor die and/or the electronic components may be incorporated inside the substrate. However, such techniques increase the difficulty and cost of a manufacturing process, and the number of the external connections and the input/output (I/O) count are still limited. Therefore, devices and techniques with improved number of the external connections and a larger count of input/output (I/O) connections are desired.

SUMMARY

In some embodiments, according to one aspect, a semiconductor package includes a first semiconductor die, a first encapsulant, a first redistribution layer, a second encapsulant and a patterned conductive layer. The first encapsulant encloses the first semiconductor die and has a top surface and a lateral surface. The first redistribution layer is disposed on the top surface of the first encapsulant and electrically connected to the first semiconductor die, wherein a portion of the first redistribution layer is exposed from the lateral surface of the first encapsulant. A second semiconductor die or passive component may be bonded on the first redistribution layer. The second encapsulant covers at least a portion of the first encapsulant and the first redistribution layer and the second semiconductor die. The patterned conductive layer is disposed on at least one of the lateral surface of the first encapsulant or a lateral surface of the second encapsulant, and is electrically connected to the first redistribution layer.

In some embodiments, according to one aspect, a semiconductor package includes a first semiconductor die, an encapsulant, a first redistribution layer, and a patterned conductive layer. The first semiconductor die has a bottom surface and a plurality of pads. The encapsulant has a lateral surface and encapsulates the first semiconductor die, such that the bottom surface of the first semiconductor die is exposed from the encapsulant. The first redistribution layer is electrically connected to the pads of the first semiconductor die, and a portion of the first redistribution layer is exposed from the lateral surface of the encapsulant. The patterned conductive layer is disposed on the lateral surface of the encapsulant, wherein the patterned conductive layer is electrically connected to the first redistribution layer.

In some embodiments, according to another aspect, a semiconductor manufacturing process includes: (a) disposing a first semiconductor die on a carrier, (b) forming a first encapsulant having a lateral surface, the first encapsulant enclosing the first semiconductor die, (c) forming a first redistribution layer disposed on the first encapsulant and the first semiconductor die to electrically connect the first semiconductor die, (d) forming a second encapsulant having a lateral surface, the second encapsulant covering the first encapsulant and the first redistribution layer, (e) singulating the first encapsulant and the second encapsulant so that a portion of the first redistribution layer is exposed from the lateral surface of the first encapsulant and the lateral surface of the second encapsulant, and (f) forming a patterned conductive layer on at least one of the lateral surface of the first encapsulant or the lateral surface of the second encapsulant, wherein the patterned conductive layer is electrically connected to the first redistribution layer.

In some embodiments, according to another aspect, a semiconductor package includes a first semiconductor die, a first encapsulant, a first redistribution layer, a second encapsulant, and a flexible substrate. The first encapsulant encloses the first semiconductor die and has a top surface and a lateral surface. The first redistribution layer is disposed over the top surface of the first encapsulant and electrically connected to the first semiconductor die, wherein a portion of the first redistribution layer is exposed from the lateral surface of the first encapsulant. The second encapsulant covers the first encapsulant and the first redistribution layer. The flexible substrate is disposed on at least one of the lateral surface of the first encapsulant or a lateral surface of the second encapsulant, and electrically connected to the first redistribution layer.

In some embodiments, according to another aspect, a semiconductor package includes a first semiconductor die, an encapsulant, a first redistribution layer, and a flexible substrate. The first semiconductor die has a bottom surface and a plurality of pads. The encapsulant encapsulates the first semiconductor die and has a lateral surface, wherein the bottom surface of the first semiconductor die is exposed from the encapsulant. The first redistribution layer electrically is connected to the pads of the first semiconductor die, wherein a portion of the first redistribution layer is exposed from the lateral surface of the encapsulant. The flexible substrate is disposed on the lateral surface of the encapsulant and electrically connected to the first redistribution layer.

In some embodiments, according to another aspect, a semiconductor manufacturing process includes (a) disposing a first semiconductor die on a carrier, (b) forming a first encapsulant to that encloses the first semiconductor die, (c) forming a first redistribution layer disposed on the first encapsulant and the first semiconductor die to that electrically connects to the first semiconductor die, (d) forming a second encapsulant to that covers the first encapsulant and the first redistribution layer, (e) singulating the first encapsulant and the second encapsulant so such that a portion of the first redistribution layer is exposed from a lateral surface of the first encapsulant and a lateral surface of the second encapsulant, and (f) disposing a flexible substrate on at least one of the lateral surface of the first encapsulant or the lateral surface of the second encapsulant, wherein the flexible substrate is electrically connected to the first redistribution layer.

Figure 1:
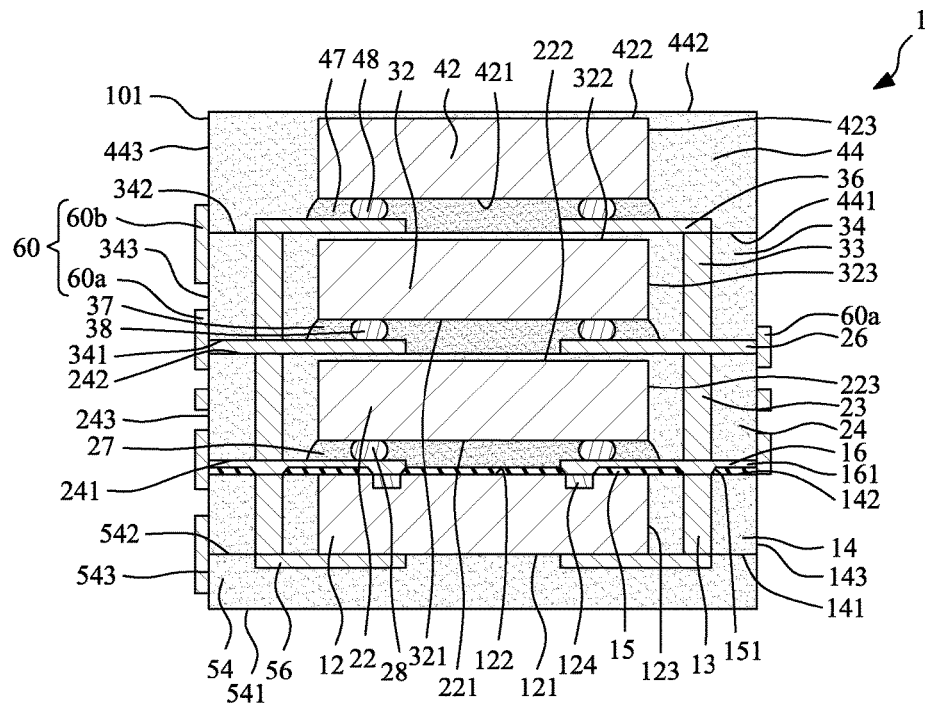
FIG. 1 depicts a cross-sectional view of an example of a semiconductor package according to some embodiments of the present disclosure.

The following detailed description, reference is made to the accompanying drawings, which form a part hereof. In the drawings, similar symbols identify similar components. The illustrative embodiments, described in the detailed description, drawings, and the claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

A new packaging technology is introduced herein. This technology is based on stacking semiconductor dice and encapsulants to form Cubic Packages (CuPs). These CuPs can be thought of as three dimensional (3D) building blocks. The blocks do not need to be of equal length, width or heights. These building blocks may have a small manufacturable size which can accommodate the encapsulated semiconductor dice and/or passive components.

A building block may be a suitable cluster of semiconductor dice that form a partial or full system (e.g., an electrical system) in a package (system in package, or "SiP"), or may be a package that improves the capacity/capability of a single semiconductor die. The building block may include passive components. As such, building blocks can be design optimized for performance and manufacturing (e.g., yield, or improved performance by providing for a functional combination of different semiconductor die/passive components from one or more sources). Generally, use of building blocks may speed up design time and manufacturing cycle times.

Building blocks can be from different sources, original equipment manufacturers (OEMs), or original design manufacturers (ODMs) to be combined into a useful design block and eventually assembled onto a motherboard or chassis or the like. The building blocks can be connected to each other in nearly any configuration, for example, bonded to each other in single or multiple planes. This may be done prior to mounting onto a motherboard/chassis or during a mounting process of one or more CuPs. The joined blocks may be of different sizes and need not be cubic.

Embodiments of processes for building the CuPs include but are not limited to the following. A process can be based on encapsulating a known good die (KGD) and applying redistribution layers on the die and/or encapsulant using a wafer level fan out (WL-FO) technique, or a similar technique. Such wafer level fan out techniques can be readily modified for strip or panel processing to attain economic efficiencies. The semiconductor dice are stacked and either connected using vias within the encapsulant and/or printed/patterned traces on one or more surfaces of the molded encapsulants. 3D inkjet printing of conductors and insulating dielectrics may be employed to the process for building the CuPs with external traces and connection pads. In addition, the CuPs may be wrapped at least in part in flexible circuitry to form external connections.

CuPs may employ external solder balls or other bumps for mounting to other surfaces, or, alternatively, may not employ any solder balls, instead employing land grid arrays or other configurations. 'Free' surfaces of the CuPs that include portions that can form an electrical connection may be used for further assembly of additional semiconductor dice/passive components included in the individual block. Alternatively, blocks may be bonded and may then be incorporated with the external components and/or connection bumps. The bonded blocks may form other three dimensional clusters.

Semiconductor packages and techniques for manufacturing the semiconductor packages discussed herein provide for a large number of external connections, a large input/output (I/O) count, and package functionality.

FIG. 1 depicts a cross-sectional view of an example of a semiconductor package 1 according to some embodiments of the present disclosure. The semiconductor package 1 includes a first semiconductor die 12, a first encapsulant 14, optionally a plurality of first vias 13, a first redistribution layer (RDL) 16, a second semiconductor die 22, a second encapsulant 24, a plurality of second vias 23, a second circuit layer 26, a third semiconductor die 32, a third encapsulant 34, a plurality of third vias 33, a third circuit layer 36, a fourth semiconductor die 42, a fourth encapsulant 44, optionally a bottom circuit layer 56, optionally a bottom encapsulant 54 and a patterned conductive layer 60.

The first semiconductor die 12 has a first surface 121, a second surface 122 opposite to the first surface 121, a lateral surface 123 and a plurality of first pads 124. The first surface 121 of the first semiconductor die 12 is a backside surface, which faces downward with reference to the orientation shown in FIG. 1. The backside surface (the first surface 121) of the first semiconductor die 12 may also be covered by a thin dielectric which is not shown here. The second surface 122 of the first semiconductor die 12 is an active surface, which faces upward toward the second semiconductor die 22 with reference to the orientation shown in FIG. 1. The lateral surface 123 of the first semiconductor die 12 extends between the first surface 121 and the second surface 122. The first pads 124 are disposed adjacent to the second surface 122 of the first semiconductor die 12.

The first encapsulant 14 encloses or encapsulates at least a portion of the first semiconductor die 12. The terms enclosing an object or encapsulating an object, as used herein, mean covering or surrounding at least a portion of the object, such as covering at least all of the lateral sides of the object. A material of the first encapsulant 14 may include a molding compound, such as epoxy resin with fillers, or a photo-imageable dielectric, such as solder mask or other suitable dielectric materials. The first encapsulant 14 has a first surface 141, a second surface 142 opposite to the first surface 141 and a lateral surface 143. The first surface 141 of the first encapsulant 14 is substantially coplanar with the first surface 121 of the first semiconductor die 12. That is, the first encapsulant 14 does not extend past the first surface 121 of the first semiconductor die 12. The second surface 142 of the first encapsulant 14 is substantially coplanar with the second surface 122 of the first semiconductor die 12. Thus the first semiconductor die 12 is embedded at least in part in the first encapsulant 14. The thickness of the first semiconductor die 12 is substantially equal to the thickness of the first encapsulant 14. The first surface 121 and the second surface 122 of the first semiconductor die 12 are exposed from the first surface 141 and the second surface 142 of the first encapsulant 14, respectively. The lateral surface 143 of the first encapsulant 14 extends between the first surface 141 and the second surface 142.

The first vias 13 extend through the first encapsulant 14 and electrically connect the first redistribution layer 16 and the bottom circuit layer 56. The bottom end and the top end of each of the first vias 13 are exposed from the first surface 141 and the second surface 142 of the first encapsulant 14, respectively. The length of each of the first vias 13 is substantially equal to the thickness of the first semiconductor die 12. The first vias 13 are disposed around or surround the first semiconductor die 12 as specified by electrical and/or mechanical design. At least a portion of the first encapsulant 14 may be disposed between the first semiconductor die 12 and one of the first vias 13.

As shown in FIG. 1, the semiconductor package 1 may further include a first passivation layer 15 disposed between the first encapsulant 14 and the second encapsulant 24. The first passivation layer 15 is disposed on at least a portion of the top surface (the second surface 142) of the first encapsulant 14 and the second surface 122 of the first semiconductor die 12, and defines a plurality of openings 151 that expose the first pads 124 of the first semiconductor die 12 and the top ends of the first vias 13.

The first redistribution layer 16 is disposed over a top surface of the first encapsulant 14 and on at least a portion of the first passivation layer 15 and in the openings 151. In some embodiments in which the first passivation layer 15 is omitted, the first redistribution layer 16 is disposed on at least a portion of the top surface (the second surface 142) of the first encapsulant 14 and the second surface 122 of the first semiconductor die 12. The first redistribution layer 16 is electrically connected to the first pads 124 of the first semiconductor die 12, the first vias 13 and the patterned conductive layer 60. A portion 161 of the first redistribution layer 16 extends to and is exposed from the lateral surface 143 of the first encapsulant 14. It is noted that the first redistribution layer 16 may include a plurality of fan-out traces formed by, for example, plating or ink jet printing. The first semiconductor die 12, the first encapsulant 14, the first vias 13, and the first redistribution layer 16 may be formed by wafer level packaging techniques and the like.

The second semiconductor die 22 has a first surface 221, a second surface 222 opposite to the first surface 221 and a lateral surface 223. The first surface 221 of the second semiconductor die 22 is an active surface, which faces downward toward the first semiconductor die 12 with reference to the orientation shown in FIG. 1, and is electrically connected to the first redistribution layer 16 through a plurality second bumps 28 by, for example, flip-chip bonding. A second adhesion layer 27 (e.g., underfill) may be further optionally included to adhere the first surface 221 of the second semiconductor die 22, a portion of the redistribution layer 16 and a portion of the first passivation layer 15 and to protect the second bumps 28. In one embodiment, one way to encapsulate the bumps and adhere the semiconductor die is to under and overmold the semiconductor die (not shown here). The second surface 222 of the second semiconductor die 22 is a backside surface, which faces upward toward the third semiconductor die 32 with reference to the orientation shown in FIG. 1. The lateral surface 223 of the second semiconductor die 22 extends between the first surface 221 and the second surface 222.

The second encapsulant 24 covers at least a portion of the first encapsulant 14 and the first redistribution layer 16, and encloses at least a portion of the second semiconductor die 22. A material of the second encapsulant 24 may include a molding compound, such as epoxy resin with fillers, or a photo-imageable dielectric, such as solder mask. The material of the second encapsulant 24 may be the same as or different from the material of the first encapsulant 14. The second encapsulant 24 has a first surface 241, a second surface 242 opposite to the first surface 241 and a lateral surface 243. The first surface 241 of the second encapsulant 24 covers at least a portion of the first redistribution layer 16. The second surface 242 of the second encapsulant 24 is disposed above at least a portion of the second surface 222 of the second semiconductor die 22. The lateral surface 243 of the second encapsulant 24 extends between the first surface 241 and the second surface 242. In one or more embodiments, the second surface 222 of the second semiconductor die 22 may be exposed from the second surface 242 of the second encapsulant 24. As shown in FIG. 1, an end of the first redistribution layer 16, a lateral surface of the first passivation layer 15, the lateral surface 143 of the first encapsulant 14 and the lateral surface 243 of the second encapsulant 24 are substantially coplanar.

The second vias 23 extend through the second encapsulant 24 and, as specified by design, electrically connect the first redistribution layer 16 and the second circuit layer 26. The bottom end and the top end of each of the second vias 23 are exposed from the first surface 241 and the second surface 242 of the second encapsulant 24, respectively. The length of each of the second vias 23 is greater than the thickness of the second semiconductor die 22 (thus, as depicted in FIG. 1, the second vias 23 are more vertically extended than is the second semiconductor die 22). The second vias 23 surround or are disposed around the second semiconductor die 22. At least a portion of the second encapsulant 24 may be disposed between the second semiconductor die 22 and one of the second vias 23.

The second circuit layer 26 is disposed on at least a portion of the second surface 242 of the second encapsulant 24. In an embodiment in which the second surface 222 of the second semiconductor die 22 is exposed from the second surface 242 of the second encapsulant 24, a portion of the second circuit layer 26 is disposed on at least a portion of the second surface 222 of the second semiconductor die 22. The second circuit layer 26 is electrically connected to the second vias 23 and the patterned conductive layer 60. A portion of the second circuit layer 26 extends to and is exposed from the lateral surface 243 of the second encapsulant 24. It is noted that the second circuit layer 26 may be, for example, an RDL or a plurality of fan-out traces formed by, for example, plating or ink jet printing. In one or more embodiments, a passivation layer may further be included between the second circuit layer 26 and the second surface 242 of the second encapsulant 24.

The third semiconductor die 32 has a first surface 321, a second surface 322 opposite to the first surface 321 and a lateral surface 323. The first surface 321 of the third semiconductor die 32 is an active surface, which faces downward toward the second semiconductor die 22 with reference to the orientation shown in FIG. 1, and is electrically connected to the second circuit layer 26 through a plurality third bumps 38 by, for example, flip-chip bonding. A third adhesion layer 37 may be further optionally included to adhere the first surface 321 of the third semiconductor die 32, a portion of the second circuit layer 26 and the second surface 242 of the second encapsulant 24, and to protect the third bumps 38.

The second surface 322 of the third semiconductor die 32 is a backside surface, which faces upward toward the fourth semiconductor die 42 with reference to the orientation shown in FIG. 1. The lateral surface 323 of the second semiconductor die 32 extends between the first surface 321 and the second surface 322.

The third encapsulant 34 covers at least a portion of the second encapsulant 24 and the second circuit layer 26, and encloses the third semiconductor die 32. A material of the third encapsulant 34 may include a molding compound, such as epoxy resin with fillers, or a photo-imageable dielectric, such as solder mask. The material of the third encapsulant 34 may be the same as or different from the material of the second encapsulant 24. The third encapsulant 34 has a first surface 341, a second surface 342 opposite to the first surface 341 and a lateral surface 343. The first surface 341 of the third encapsulant 34 covers at least a portion of the second circuit layer 26. The second surface 342 of the third encapsulant 34 is disposed above at least a portion of the second surface 322 of the third semiconductor die 32. The lateral surface 343 of the third encapsulant 34 extends between the first surface 341 and the second surface 342. In one or more embodiments, the second surface 322 of the third semiconductor die 32 may be exposed from the second surface 342 of the third encapsulant 34. As shown in FIG. 1, the lateral surface 343 of the third encapsulant 34 and the lateral surface 243 of the second encapsulant 24 are substantially coplanar.

The third vias 33 extend through the third encapsulant 34 and, as specified by design, electrically connect the second circuit layer 26 and the third circuit layer 36. The bottom end and the top end of each of the third vias 33 are exposed from the first surface 341 and the second surface 342 of the third encapsulant 34, respectively. The length of each of the third vias 33 is greater than the thickness of the third semiconductor die 32. The third vias 33 surround or are disposed around the third semiconductor die 32. At least a portion of the third encapsulant 34 may be disposed between the third semiconductor die 32 and one of the third vias 33.

The third circuit layer 36 is disposed on at least a portion of the second surface 342 of the third encapsulant 34. In an embodiment in which the second surface 322 of the third semiconductor die 32 is exposed from the second surface 342 of the third encapsulant 34, a portion of the third circuit layer 36 is disposed on at least a portion of the second surface 322 of the third semiconductor die 32. The third circuit layer 36 is electrically connected to the third vias 33. As shown in FIG. 1, the third circuit layer 36 does not extend to the lateral surface 343 of the third encapsulant 34. However, in other embodiments, a portion of the third circuit layer 36 may extend to and be exposed from the lateral surface 343 of the third encapsulant 34. It is noted that the third circuit layer 36 may be, for example, an RDL or a plurality of fan-out traces formed by, for example, plating or ink jet printing. In one or more embodiments, a passivation layer may further be included between the third circuit layer 36 and the second surface 342 of the third encapsulant 34.

The fourth semiconductor die 42 has a first surface 421, a second surface 422 opposite to the first surface 421 and a lateral surface 423. The first surface 421 of the fourth semiconductor die 42 is an active surface, which faces downward toward the third semiconductor die 32 with reference to the orientation shown in FIG. 1, and is electrically connected to the third circuit layer 36 through a plurality fourth bumps 48 by, for example, flip-chip bonding. A fourth adhesion layer 47 may be further optionally included to adhere the first surface 421 of the fourth semiconductor die 42, a portion of the third circuit layer 36 and the second surface 342 of the third encapsulant 34, and to protect the fourth bumps 48. The second surface 422 of the fourth semiconductor die 42 is a backside surface, which faces upward with reference to the orientation shown in FIG. 1. The lateral surface 423 of the fourth semiconductor die 42 extends between the first surface 421 and the second surface 422. The types and sizes of the first semiconductor die 12, the second semiconductor die 22, the third semiconductor die 32 and the fourth semiconductor die 42 may be the same or different from each other. While not shown explicitly, each trace layer may extend to the lateral surfaces as desired.

The fourth encapsulant 44 covers at least a portion of the third encapsulant 34 and the third circuit layer 36, and encloses at least a portion of the fourth semiconductor die 42. Optionally, the backside 422 of the fourth die may be exposed. A material of the fourth encapsulant 44 may include a molding compound, such as epoxy resin with fillers, or a photo-imageable dielectric, such as solder mask. The material of the fourth encapsulant 44 may be the same as or different from the material of the third encapsulant 34. The fourth encapsulant 44 has a first surface 441, a second surface 442 opposite to the first surface 441 and a lateral surface 443. The first surface 441 of the fourth encapsulant 44 covers at least a portion of the third circuit layer 36. The second surface 442 of the fourth encapsulant 44 is disposed above at least a portion of the second surface 422 of the fourth semiconductor die 42. The lateral surface 443 of the fourth encapsulant 44 extends between the first surface 441 and the second surface 442. In one or more embodiments, the second surface 422 of the fourth semiconductor die 42 may be exposed from the second surface 442 of the fourth encapsulant 44. As shown in FIG. 1, the lateral surface 443 of the fourth encapsulant 44 and the lateral surface 343 of the third encapsulant 34 are substantially coplanar.

The bottom circuit layer 56 is disposed on at least a portion of the first surface 141 of the first encapsulant 14 and the first surface 121 of the first semiconductor die 12. The bottom circuit layer 56 is electrically connected to the first vias 13. As shown in FIG. 1, the bottom circuit layer 56 does not extend to the lateral surface 143 of the first encapsulant 14. However, in other embodiments, a portion of the bottom circuit layer 56 may extend to and be exposed from the lateral surface 143 of the first encapsulant 14. It is noted that the bottom circuit layer 56 may be, for example, an RDL or a plurality of fan-out traces formed by, for example, plating or ink jet printing. In one or more embodiments, a passivation layer may further be included between the bottom circuit layer 56 and the first surface 121 of the first semiconductor die 12.

The bottom encapsulant 54 covers at least a portion of the first encapsulant 14 and the bottom circuit layer 56. A material of the bottom encapsulant 54 may be the same as or different from the material of the first encapsulant 14. The bottom encapsulant 54 has a first surface 541, a second surface 542 opposite to the first surface 541 and a lateral surface 543. The second surface 542 of the bottom encapsulant 54 covers at least a portion of the first surface 122 of the first semiconductor die 12, the bottom circuit layer 56 and the first surface 141 of the first encapsulant 14. The lateral surface 543 of the bottom encapsulant 54 extends between the first surface 541 and the second surface 542. As shown in FIG. 1, the lateral surfaces 543, 143, 243, 343, 443 are substantially coplanar with each other to form a lateral surface 101 of the semiconductor package 1.

The patterned conductive layer 60 includes a plurality of bonding pads 60a and a plurality of routing traces 60b, and is disposed on at least a portion of the lateral surface 101 (including the lateral surface 143 of the first encapsulant 14 corresponding to the lateral surface 123 of the first semiconductor die 12, the lateral surface 243 of the second encapsulant 24 corresponding to the lateral surface 223 of the second semiconductor die 22, the lateral surface 343 of the third encapsulant 34 corresponding to the lateral surface 323 of the third semiconductor die 32 and/or the lateral surface 443 of the fourth encapsulant 44 corresponding to the lateral surface 423 of the fourth semiconductor die 42). That is, the patterned conductive layer 60 spans over more than portions of the lateral surface 101 that correspond to two lateral surfaces of two semiconductor dice. The patterned conductive layer 60 is electrically connected to the first redistribution layer 16 and the second circuit layer 26.

In the embodiment illustrated in FIG. 1, the semiconductor package 1 is a cubic package (CuP), and the left side lateral surface and the right side lateral surface of the semiconductor package 1 are 'free' surfaces may be used for further assembly of additional semiconductor die/passive components or be assembled onto a motherboard. Thus, the patterned conductive layer 60 on its lateral surface can increase the number of the external connection and the input/output (I/O) count of the package. While in these cross-sectional drawings two lateral sides of a CuP are shown, all four lateral sides (or any number of sides, including more or less than four sides in non-cubic shaped CuPs) may be populated with traces and connection pads. In one embodiment, the patterned conductive layer 60 may be disposed on at least a portion of all four lateral surfaces 101, a top side and a bottom side of the semiconductor package 1. Further the traces, and partially the connection pads, can be protected by a dielectric material.

While all drawings show four layers of semiconductor dice and/or passive components, it should be noted that any number of layers equal to two or more can be built.

Figure 2:
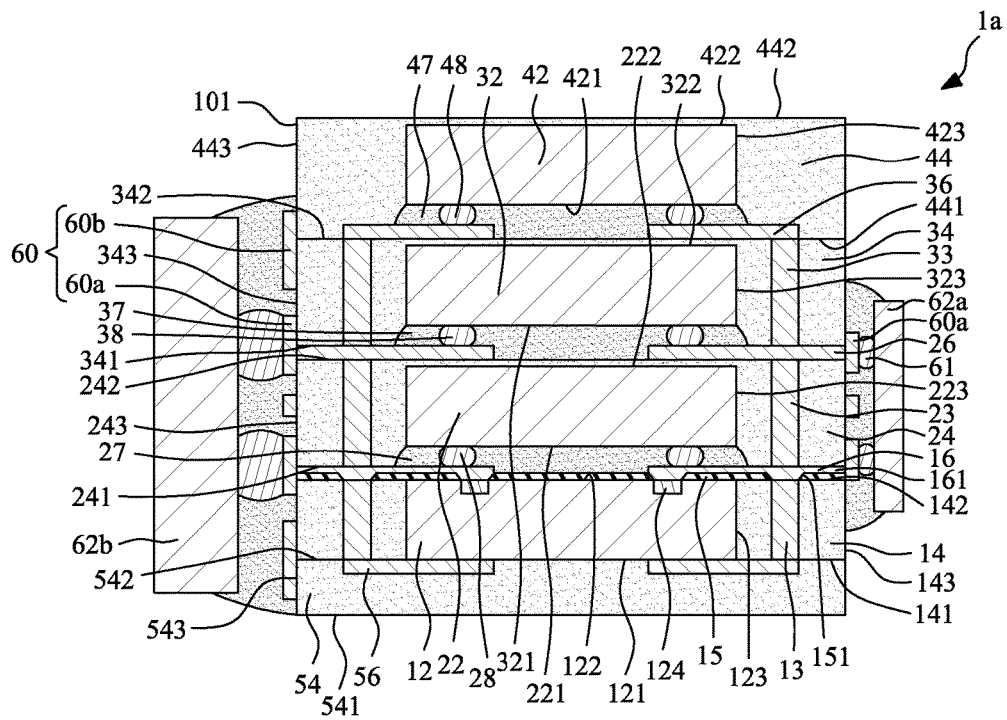
FIG. 2 depicts a cross-sectional view of an example of a semiconductor package according to some embodiments of the present disclosure.

FIG. 2 depicts a cross-sectional view of an example of a semiconductor package 1a according to some embodiments of the present disclosure. The semiconductor package 1a is similar to the semiconductor package 1 shown in FIG. 1, and similar features are numbered alike and not further described with respect to FIG. 2. The semiconductor package 1a further includes at least one side electrical component (including the first side electrical component 62a and the second side electrical component 62b) bonded to the patterned conductive layer 60. The first side electrical component 62a is a passive component, and is bonded to the bonding pads 60a of the patterned conductive layer 60 through solder bumps 61. The second side electrical component 62b is a semiconductor die which is bonded to the bonding pads 60a of the patterned conductive layer 60 by, for example, flip-chip bonding.

It should be noted that a surface of a CuP mounted on a mother board or to another CuP can be any surface of the CuP.

Figure 3:
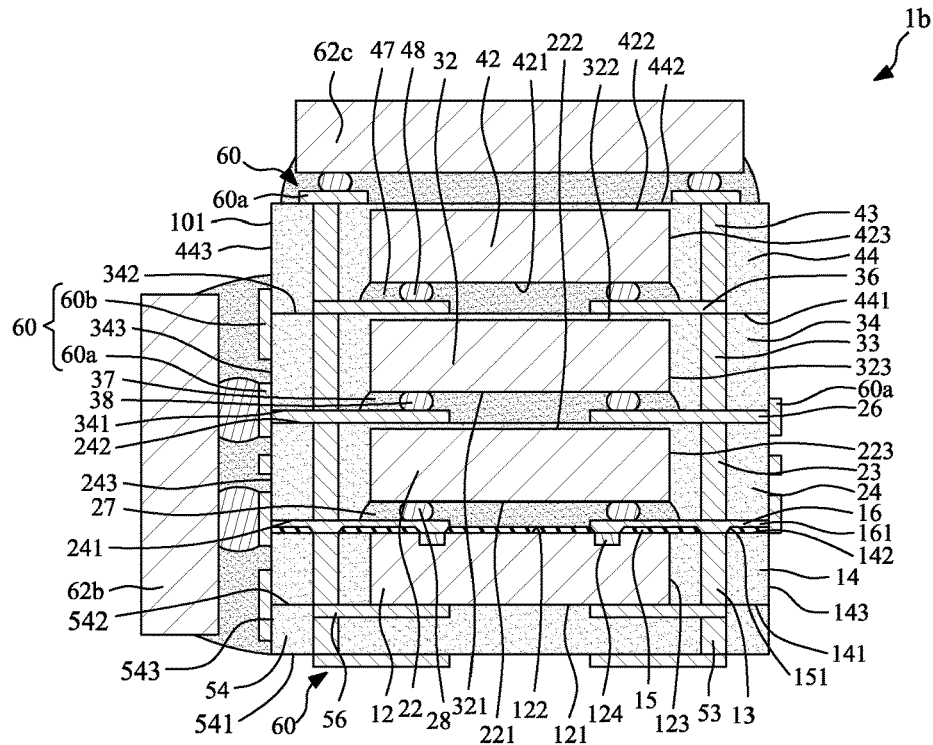
FIG. 3 depicts a cross-sectional view of an example of a semiconductor package according to some embodiments of the present disclosure.

FIG. 3 depicts a cross-sectional view of an example of a semiconductor package 1b according to some embodiments of the present disclosure. The semiconductor package 1b is similar to the semiconductor package 1a shown in FIG. 2, and similar features are numbered alike and not further described with respect to FIG. 3. In FIG. 3, the patterned conductive layer 60 is further disposed on at least a portion of the first surface 541 of the bottom encapsulant 54 and the second surface 442 of the fourth encapsulant 44. The semiconductor package 1b further includes a plurality of fourth vias 43, a plurality of bottom vias 53 and a third side electrical component 62c. The fourth vias 43 extend through the fourth encapsulant 44 and electrically connect the third circuit layer 36 and the patterned conductive layer 60. The fourth vias 43 surround or are disposed around the fourth semiconductor die 42. At least a portion of the fourth encapsulant 44 may be disposed between the fourth semiconductor die 42 and one of the fourth vias 43. The bottom vias 53 extend through the bottom encapsulant 54 and electrically connect the bottom circuit layer 56 and the patterned conductive layer 60. The third side electrical component 62c is bonded to the patterned conductive layer 60 on the second surface 442 of the fourth encapsulant 44 by, for example, flip-chip bonding.

Figure 4:
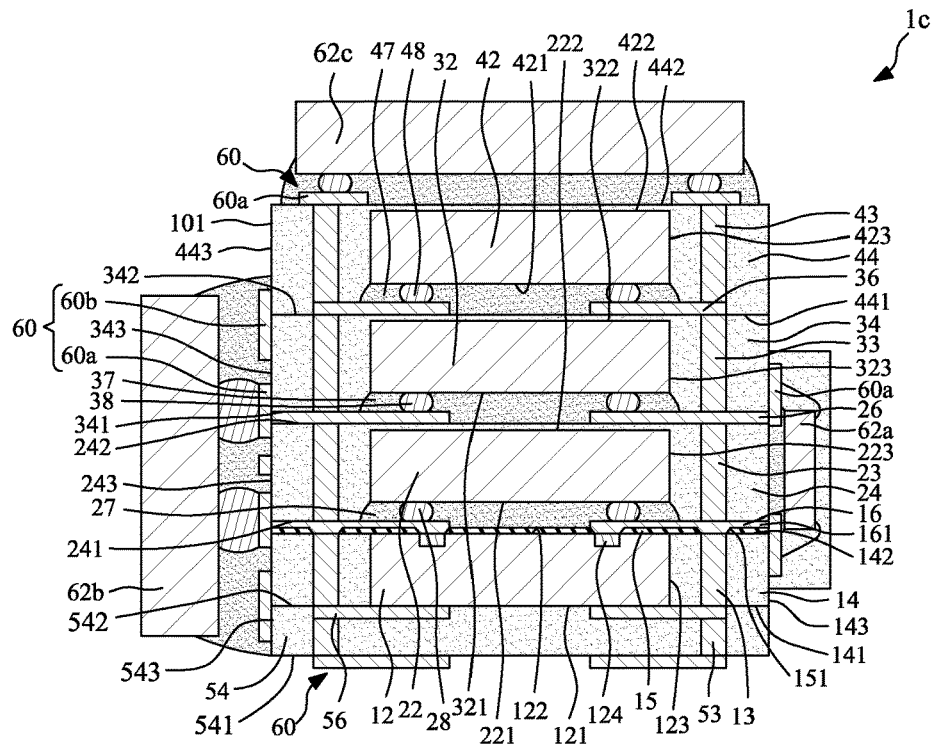
FIG. 4 depicts a cross-sectional view of an example of a semiconductor package according to some embodiments of the present disclosure.

FIG. 4 depicts a cross-sectional view of an example of a semiconductor package 1c according to some embodiments of the present disclosure. The semiconductor package 1c is similar to the semiconductor package 1b shown in FIG. 3, and similar features are numbered alike and not further described with respect to FIG. 4. In FIG. 4, the first side electrical component 62a is a semiconductor die which is bonded to the bonding pads 60a of the patterned conductive layer 60 by wire bonding.

Figure 5:
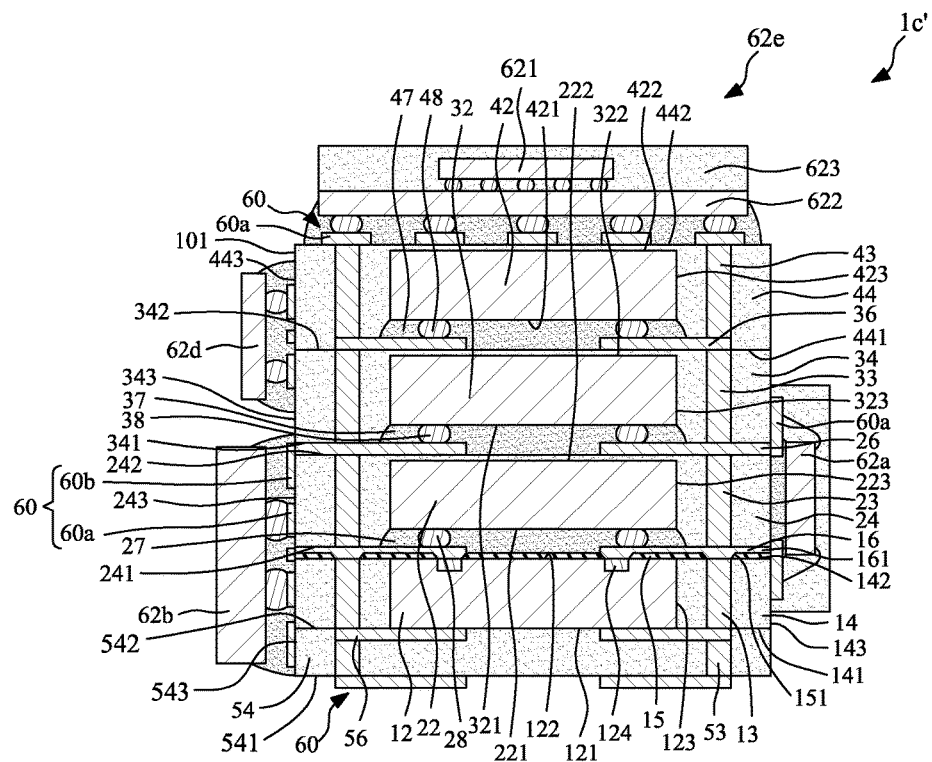
FIG. 5 depicts a cross-sectional view of an example of a semiconductor package according to some embodiments of the present disclosure.

FIG. 5 depicts a cross-sectional view of an example of a semiconductor package 1c' according to some embodiments of the present disclosure. The semiconductor package 1c' is similar to the semiconductor package 1c shown in FIG. 4, and similar features are numbered alike and not further described with respect to FIG. 5. In FIG. 5, the second side electrical component 62b (a semiconductor die) and a fourth side electrical component 62d (a passive component) are bonded to the same lateral surface 101 of the semiconductor package 1c'. In addition, the third side electrical component 62c is replaced by a fifth side electrical components 62e. The fifth side electrical components 62e is a package structure, and includes a semiconductor die 621 bonded to a package substrate 622 and encapsulated by an encapsulant 623. The package substrate 622 is electrically connected to the bonding pads 60a of the patterned conductive layer 60.

Figure 6:
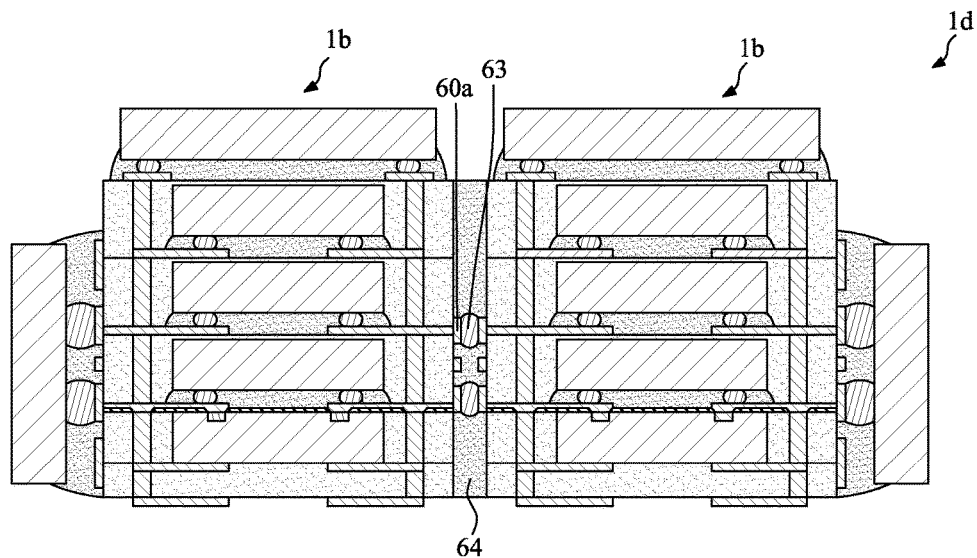
FIG. 6 depicts a cross-sectional view of an example of a semiconductor package assembly according to some embodiments of the present disclosure.

FIG. 6 depicts a cross-sectional view of an example of a semiconductor package assembly 1d according to some embodiments of the present disclosure. The semiconductor package assembly 1d is similar to the semiconductor package 1b shown in FIG. 3, and similar features are numbered alike and not further described with respect to FIG. 6. In FIG. 6, the semiconductor package assembly 1d includes two symmetrical semiconductor packages 1b that are bonded together through solder bumps 63 and adhesion layer 64. The solder bumps 63 connect the bonding pads 60a of the patterned conductive layer 60 of the semiconductor packages 1b. The adhesion layer 64 is disposed between the lateral surfaces of the semiconductor packages 1b so as to adhere the two semiconductor packages 1b and protect the solder bumps 63.

Figure 7:
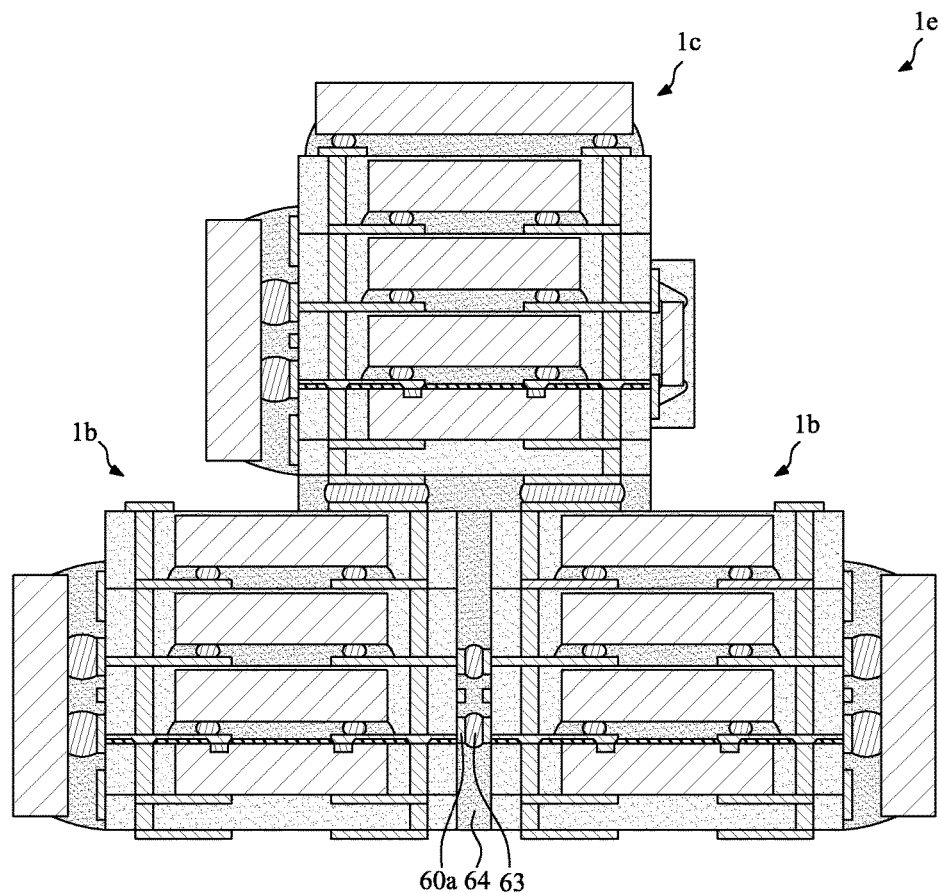
FIG. 7 depicts a cross-sectional view of an example of a semiconductor package assembly according to some embodiments of the present disclosure.
Figure 8:
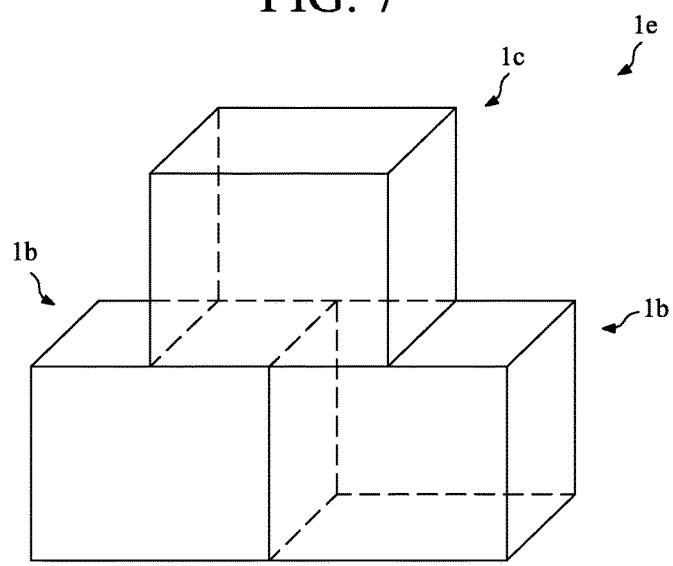
FIG. 8 depicts a schematic perspective view of the semiconductor package assembly of FIG. 7.

FIG. 7 depicts a cross-sectional view of an example of a semiconductor package assembly 1e according to some embodiments of the present disclosure. FIG. 8 depicts a schematic perspective view of the semiconductor package assembly 1e of FIG. 7. The semiconductor package assembly 1e is similar to the semiconductor package assembly 1d shown in FIG. 6, and further includes a third semiconductor package 1c, and similar features are numbered alike and not further described with respect to FIG. 7. In FIG. 7, the semiconductor package assembly 1e includes three semiconductor packages. The bottom two semiconductor packages of the semiconductor package assembly 1e are similar to the two semiconductor packages 1b of the semiconductor package assembly 1d shown in FIG. 6 except that the third side electrical component 62c are omitted. The top semiconductor package of the semiconductor package assembly 1e is similar to the semiconductor package 1c shown in FIG. 4 and is stacked on the bottom two semiconductor packages 1b. That is, the top semiconductor package 1c of the semiconductor package assembly 1e is disposed over at least a portion of each of the bottom two semiconductor packages 1b. The patterned conductive layer 60 on the bottom surface of the top semiconductor package 1c is electrically connected to the patterned conductive layer 60 on the top surfaces of the bottom two semiconductor packages 1b. The sizes of the top semiconductor package 1c and the bottom two semiconductor packages 1b are substantially the same. It is understood that the top semiconductor package 1c may be replaced by another semiconductor package or electrical component, such as the semiconductor package 1b, or any semiconductor package or electrical component described herein.

Figure 9:
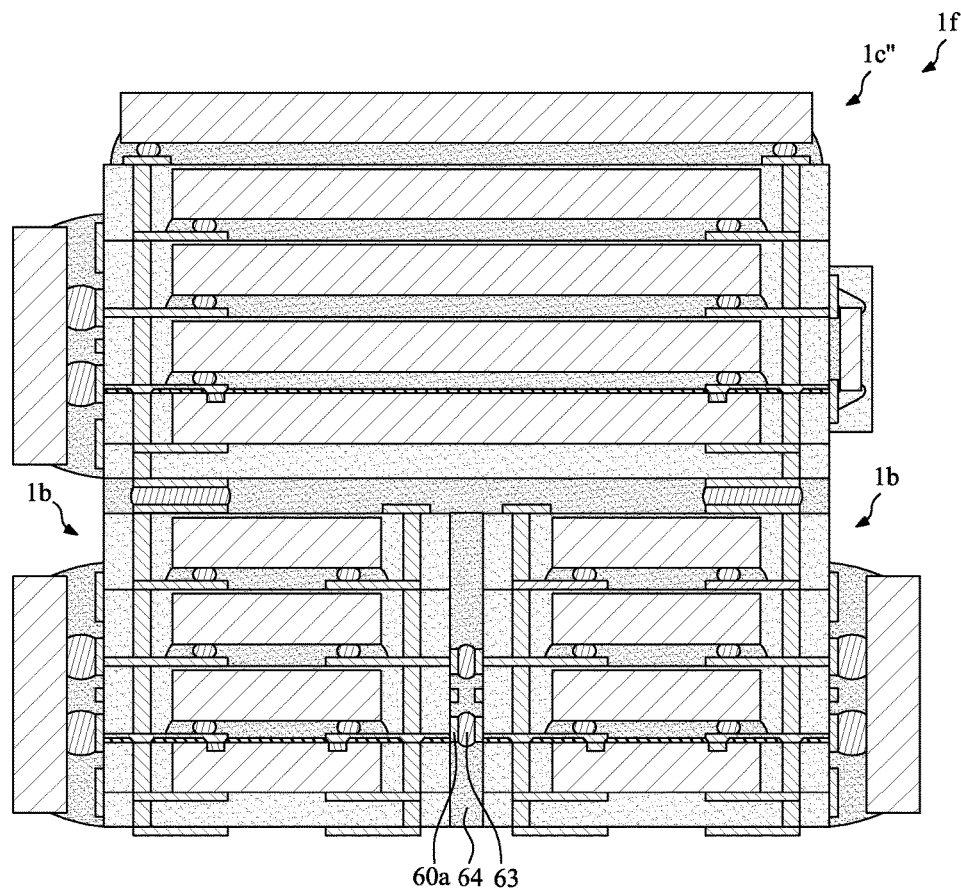
FIG. 9 depicts a cross-sectional view of an example of a semiconductor package assembly according to some embodiments of the present disclosure.
Figure 10:
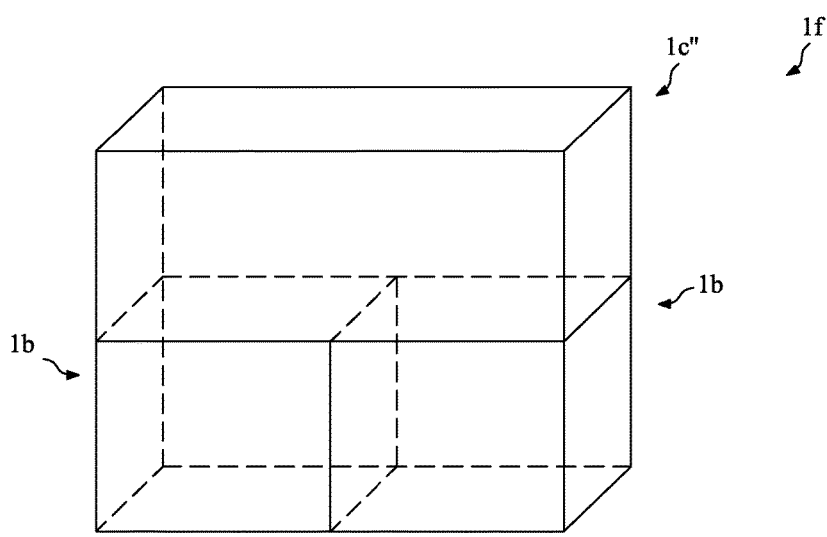
FIG. 10 depicts a schematic perspective view of the semiconductor package assembly of FIG. 9.

FIG. 9 depicts a cross-sectional view of an example of a semiconductor package assembly 1f according to some embodiments of the present disclosure. FIG. 10 depicts a schematic perspective view of the semiconductor package assembly 1f of FIG. 9. The semiconductor package assembly 1f is similar to the semiconductor package assembly 1e shown in FIG. 7, and similar features are numbered alike and not further described with respect to FIG. 9. In FIG. 9, the top semiconductor package 1c'' of the semiconductor package assembly 1f is about twice as wide as the top semiconductor package 1c of the semiconductor package assembly 1e (depicted in FIG. 7). That is, as shown in FIG. 9, the top semiconductor package 1c'' of the semiconductor package assembly if is about two times as wide as each of the bottom semiconductor packages 1b. A circumferential lateral surface of the top semiconductor package 1c'' is substantially coplanar with a circumferential lateral surface of the combined bottom two semiconductor packages 1b. In other words, all of the one or more lateral surfaces of the top semiconductor package 1c'' are substantially coplanar with one or more lateral surfaces of the bottom two semiconductor packages 1b. Although some particular example configurations are depicted herein, numerous semiconductor packages 1b, 1c, 1c'' of equal or different sizes may be bonded together to form a semiconductor package assembly as desired.

Figure 11:
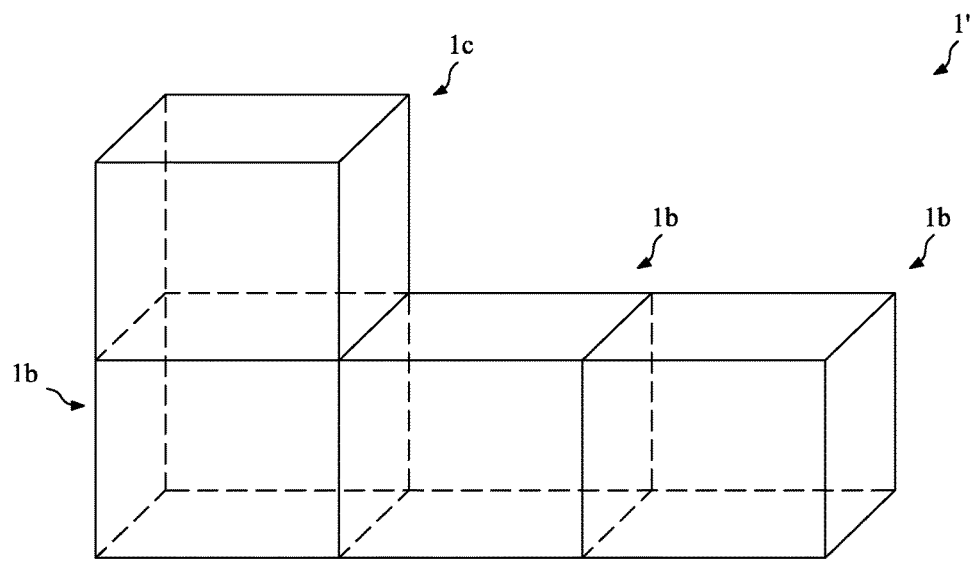
FIG. 11 depicts a schematic perspective view of an example of a semiconductor package assembly according to some embodiments of the present disclosure.

FIG. 11 depicts a schematic perspective view of an example of a semiconductor package assembly 1' according to some embodiments of the present disclosure. The semiconductor package assembly 1' is similar to the semiconductor package assembly 1e shown in FIGS. 7 and 8, and similar features are numbered alike and not further described with respect to FIG. 11. In FIG. 11, three semiconductor packages 1b are bonded together to form a row, and a semiconductor packages 1c is bonded to a top of the leftmost semiconductor package 1b. Thus, the semiconductor package assembly 1' is in an "L" shape from the front view.

Figure 12:
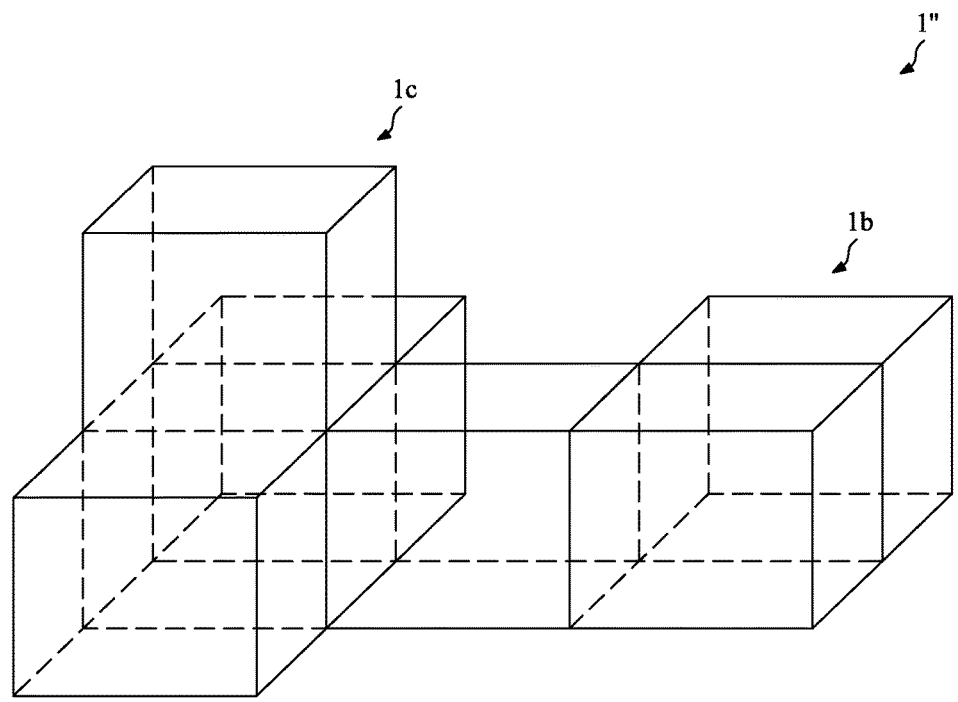
FIG. 12 depicts a schematic perspective view of an example of a semiconductor package assembly according to some embodiments of the present disclosure.

FIG. 12 depicts a schematic perspective view of an example of a semiconductor package assembly 1'' according to some embodiments of the present disclosure. The semiconductor package assembly 1'' is similar to the semiconductor package assembly 1' shown in FIG. 11, and similar features are numbered alike and not further described with respect to FIG. 12. In FIG. 12, two semiconductor packages 1b are further bonded to lateral sides of the leftmost semiconductor package 1b along the horizontal plane. In addition, one semiconductor package 1b is further bonded to a lateral side of the rightmost semiconductor package 1b along the horizontal plane.

Figure 13:
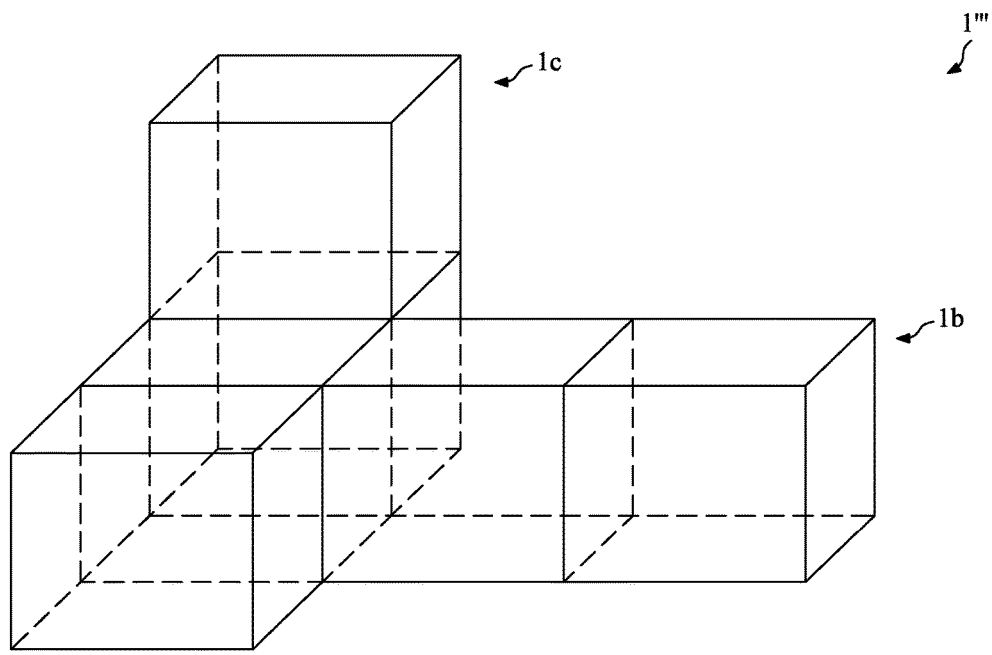
FIG. 13 depicts a schematic perspective view of an example of a semiconductor package assembly according to some embodiments of the present disclosure.

FIG. 13 depicts a schematic perspective view of an example of a semiconductor package assembly 1''' according to some embodiments of the present disclosure. The semiconductor package assembly 1''' is similar to the semiconductor package assembly 1' shown in FIG. 11, and similar features are numbered alike and not further described with respect to FIG. 13. In FIG. 13, two semiconductor packages 1b are further bonded to lateral sides of the leftmost semiconductor package 1b along the horizontal plane. In addition, the semiconductor package 1c is bonded to the top of the furthest back (furthest disposed along an axis that goes into the page) and left-most semiconductor package 1b, rather than being bonded to the top of the semiconductor package 1b on which the semiconductor package 1c is disposed in FIG. 11.

Figure 14:
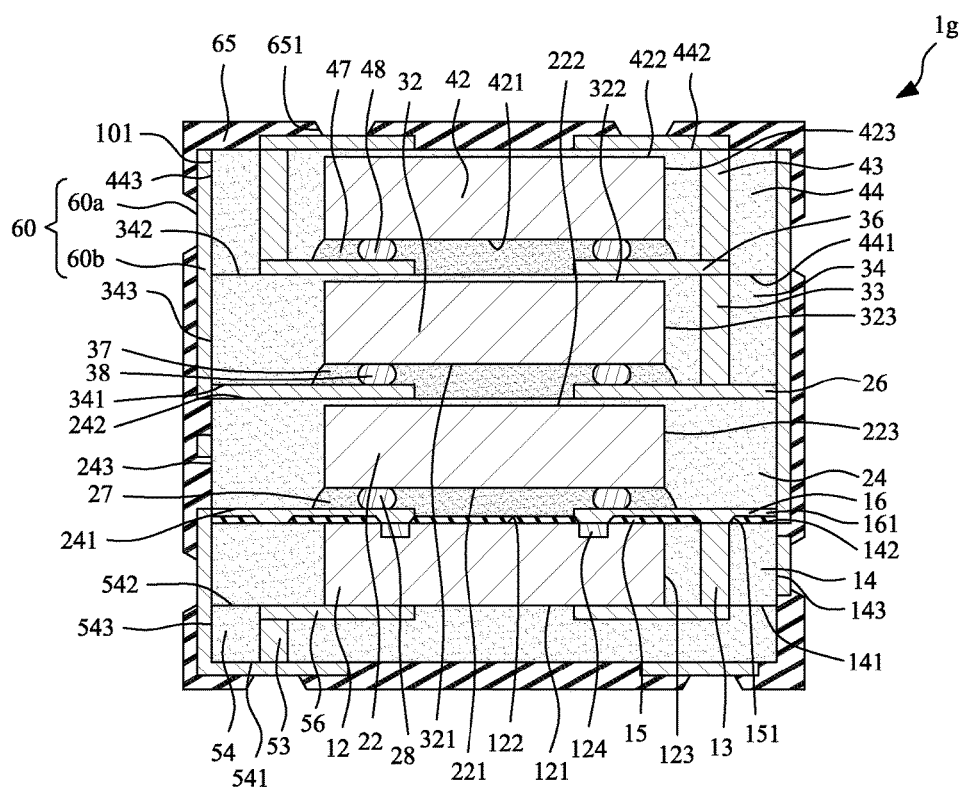
FIG. 14 depicts a cross-sectional view of an example of a semiconductor package according to some embodiments of the present disclosure.

FIG. 14 depicts a cross-sectional view of an example of a semiconductor package 1g according to some embodiments of the present disclosure. The semiconductor package 1g is similar to the semiconductor package 1b shown in FIG. 3, and similar features are numbered alike and not further described with respect to FIG. 14. In FIG. 14, the second side electrical component 62b, the third side electrical component 62c and the second vias 23 are omitted, and the semiconductor package 1g further includes a dielectric protection layer 65 such as a solder mask. The protection layer 65 covers at least a portion of the patterned conductive layer 60 on all side surfaces (including lateral surfaces, top surface and bottom surface), and defines a plurality of openings 651 that expose the bonding pads 60a for external connection.

Figure 15:
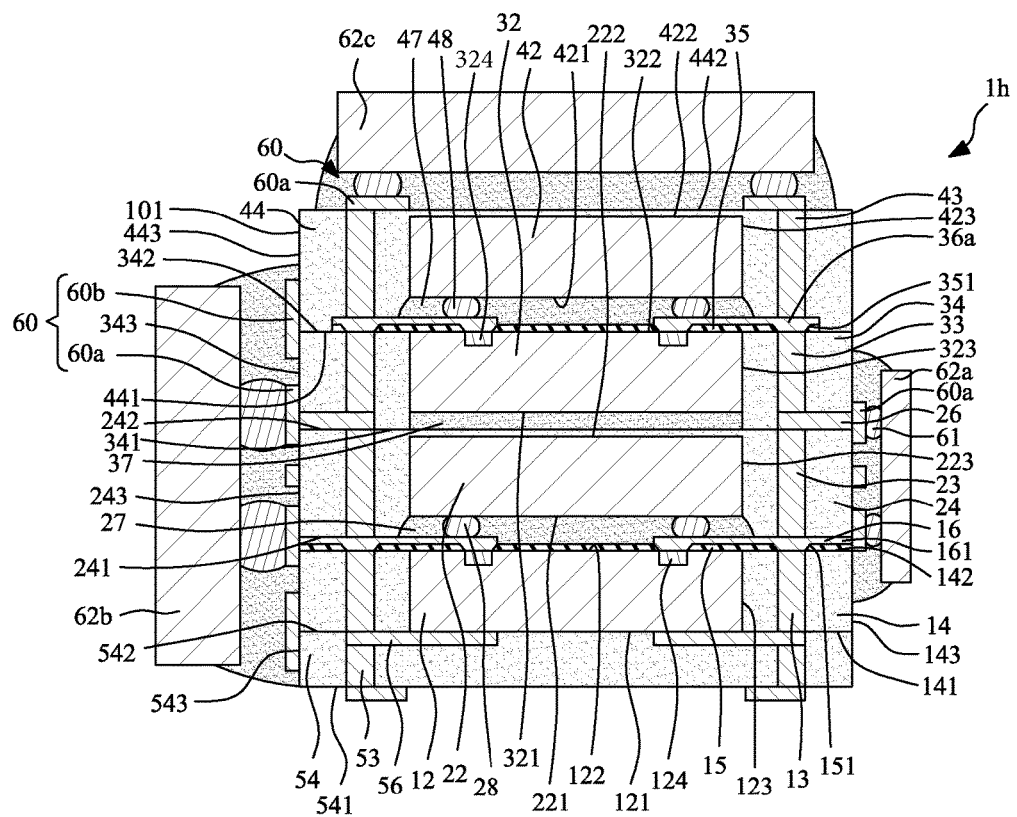
FIG. 15 depicts a cross-sectional view of an example of a semiconductor package according to some embodiments of the present disclosure.

FIG. 15 depicts a cross-sectional view of an example of a semiconductor package 1h according to some embodiments of the present disclosure. The semiconductor package 1h is similar to the semiconductor package 1c shown in FIG. 4, and similar features are numbered alike and not further described with respect to FIG. 15. In FIG. 15, the orientation of the third semiconductor die 32 is different from the orientation of the third semiconductor die 32 of FIG. 4. As shown in FIG. 15, the first surface 321 of the third semiconductor die 32 is a backside surface, which faces downward toward the second semiconductor die 22 with reference to the orientation shown in FIG. 15. The first surface 321 of the third semiconductor die 32 is adhered to the second surface 242 of the second encapsulant 24 through the third adhesion layer 37. The second surface 322 of the third semiconductor die 32 is an active surface, which faces upward toward the fourth semiconductor die 42 with reference to the orientation shown in FIG. 15. The third pads 324 are disposed adjacent to the second surface 322 of the third semiconductor die 32.

The second surface 342 of the third encapsulant 34 is substantially coplanar with the second surface 322 of the third semiconductor die 32. That is, the second surface 322 of the third semiconductor die 32 is exposed from the second surface 342 of the third encapsulant 34. The third vias 33 extend through the third encapsulant 34 and electrically connect the third redistribution layer 36a and the second circuit layer 26. The top end of each of the third vias 33 is exposed from the second surface 342 of the third encapsulant 34. As shown in FIG. 15, the semiconductor package 1h may further include a third passivation layer 35 disposed between the third encapsulant 34 and the fourth encapsulant 44. The third passivation layer 35 is disposed on at least a portion of the top surface (the second surface 342) of the third encapsulant 34 and the second surface 322 of the third semiconductor die 32, and defines a plurality of openings 351 that expose the third pads 324 of the third semiconductor die 32 and the top ends of the third vias 33. The RDL 16 may independently connect to terminals of either die 1 or die 2, or connect to both jointly. Correspondingly, RDL 36 may connect to die three and four in a similar fashion.

The third redistribution layer 36a is disposed on at least a portion of the third passivation layer 35 and in the openings 351. In an embodiment in which the third passivation layer 35 is omitted, the third redistribution layer 36a is disposed on at least a portion of the top surface (the second surface 342) of the third encapsulant 34 and the second surface 322 of the third semiconductor die 32. The third redistribution layer 36a is electrically connected to the third pads 324 of the third semiconductor die 32 and the third vias 33. The third redistribution layer 36a may or may not extend to and be exposed from the lateral surface 343 of the third encapsulant 34.

FIG. 15 shows an example of one orientation of the third semiconductor die 32. It is noted that any of the semiconductor dice may assume different orientations (e.g., may be flipped from the depicted orientation), and that more than one semiconductor die may be flipped within the stack. Any semiconductor die may also have its own RDL instead of a routing layer.

Figure 16:
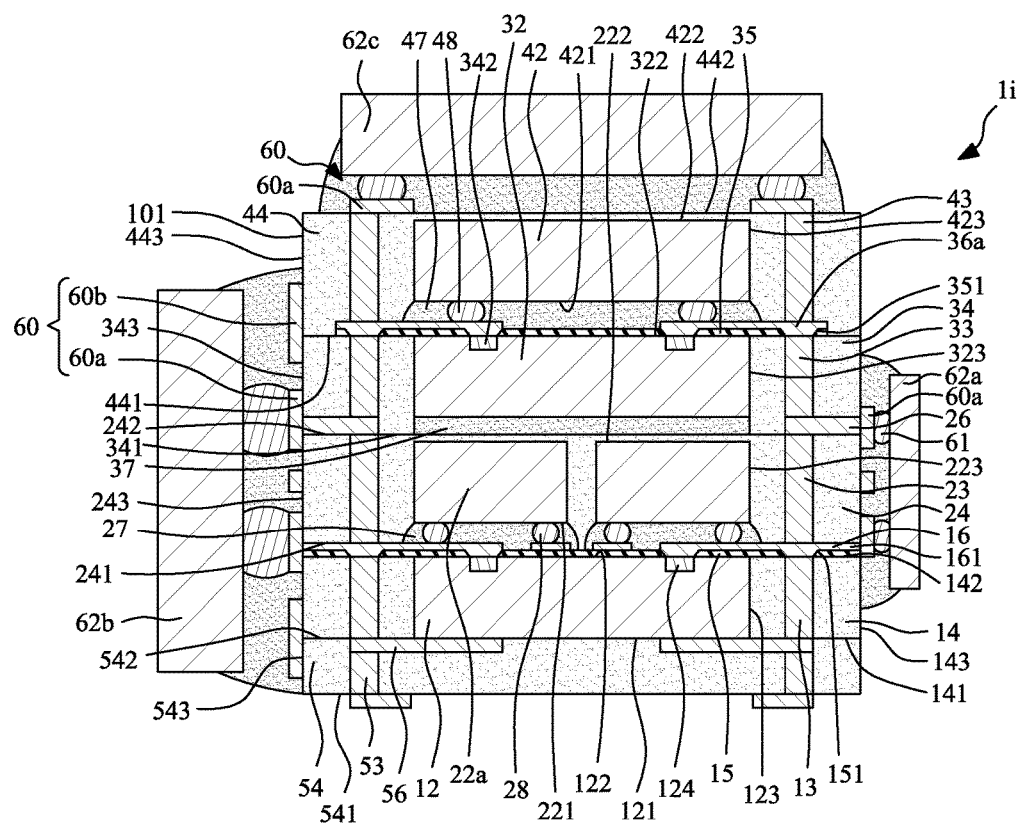
FIG. 16 depicts a cross-sectional view of an example of a semiconductor package according to some embodiments of the present disclosure.

FIG. 16 depicts a cross-sectional view of an example of a semiconductor package 1i according to some embodiments of the present disclosure. The semiconductor package 1i is similar to the semiconductor package 1h shown in FIG. 15, and similar features are numbered alike and not further described with respect to FIG. 16. In FIG. 16, the semiconductor package 1i further includes at least two second semiconductor dice 22a. The size of the second semiconductor die 22a of FIG. 16 is smaller than the size of the second semiconductor die 22 of FIG. 15. Multiple dice and/or passive components may be incorporated on any plane, level or layer of a CuP, such as in place of any individual dice or passive components depicted in the drawings.

Figure 17:
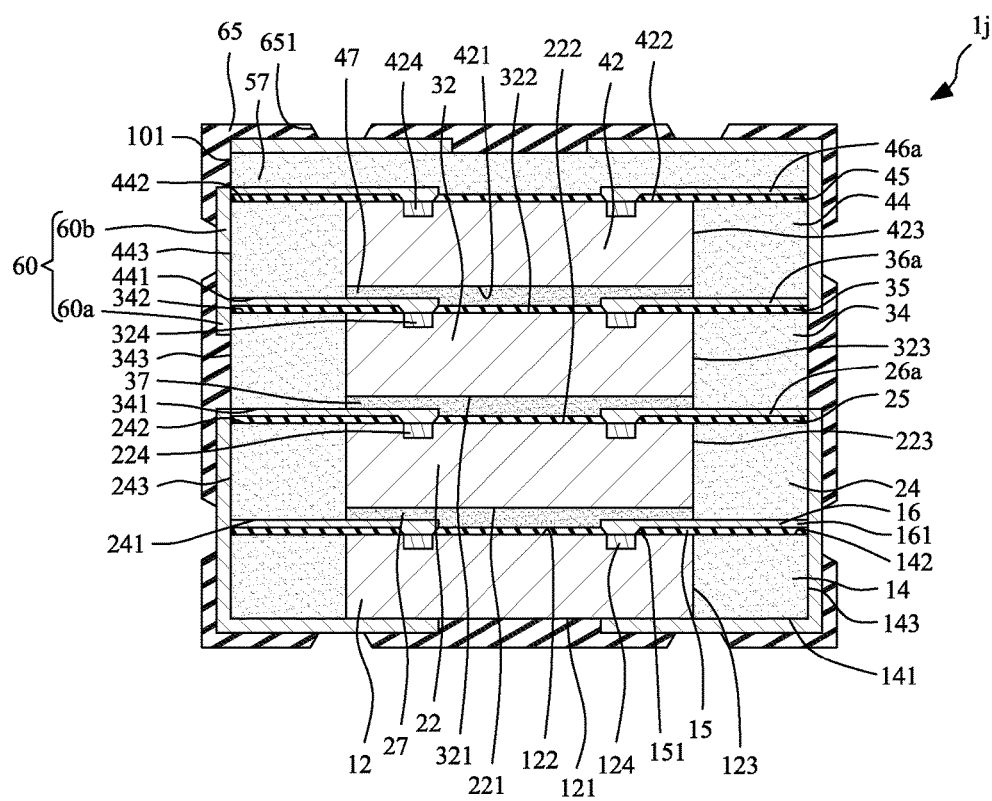
FIG. 17 depicts a cross-sectional view of an example of a semiconductor package according to some embodiments of the present disclosure.

FIG. 17 depicts a cross-sectional view of an example of a semiconductor package 1j according to some embodiments of the present disclosure. The semiconductor package 1j is similar to the semiconductor package 1g shown in FIG. 14, and similar features are numbered alike and not further described with respect to FIG. 17. In FIG. 17, the semiconductor package 1j does not include the first vias 13, the second vias 23, the third vias 33, the fourth vias 43, the bottom vias 53 and the bottom encapsulant 54. In FIG. 17, the orientations of the second semiconductor die 22, the third semiconductor die 32 and the fourth semiconductor die 42 are different from the orientations of the second semiconductor die 22, the third semiconductor die 32 and the fourth semiconductor die 42 of FIG. 14. The semiconductor package 1j further includes a second passivation layer 25, a second redistribution layer 26a, a third passivation layer 35, a third redistribution layer 36a, a fourth passivation layer 45, a fourth redistribution layer 46a and a top encapsulant 57.

As shown in FIG. 17, the first surface 221 of the second semiconductor die 22 is a backside surface, which faces downward toward the first semiconductor die 12 with reference to the orientation shown in FIG. 17. The first surface 221 of the second semiconductor die 22 is adhered to the first passivation layer 15 and the first redistribution layer 16 through the second adhesion layer 27. The second surface 222 of the second semiconductor die 22 is an active surface, which faces upward toward the third semiconductor die 32 with reference to the orientation shown in FIG. 17. The second pads 224 are disposed adjacent to the second surface 222 of the second semiconductor die 22. The second surface 242 of the second encapsulant 24 is substantially coplanar with the second surface 222 of the second semiconductor die 22. The second passivation layer 25 is disposed on at least a portion of the top surface (the second surface 242) of the second encapsulant 24 and the second surface 222 of the second semiconductor die 22, and defines a plurality of openings that expose the second pads 224 of the second semiconductor die 22. The second redistribution layer 26a is disposed on at least a portion of the second passivation layer 25 and in the openings defined by the second passivation layer 25. The second redistribution layer 26a is electrically connected to the second pads 224 of the second semiconductor die 22 and the patterned conductive layer 60. The second redistribution layer 26a extends to and is exposed from the lateral surface 243 of the second encapsulant 24.

The first surface 321 of the third semiconductor die 32 is a backside surface, which faces downward toward the second semiconductor die 22 with reference to the orientation shown in FIG. 17. The first surface 321 of the third semiconductor die 32 is adhered to the second passivation layer 25 and the second redistribution layer 26 through the third adhesion layer 37. The second surface 322 of the third semiconductor die 32 is an active surface, which faces upward toward the fourth semiconductor die 42 with reference to the orientation shown in FIG. 17. The third pads 324 are disposed adjacent to the second surface 322 of the third semiconductor die 32. The second surface 342 of the third encapsulant 34 is substantially coplanar with the second surface 322 of the third semiconductor die 32. The third passivation layer 35 is disposed on at least a portion of the top surface (the second surface 342) of the third encapsulant 34 and the second surface 322 of the third semiconductor die 32, and defines a plurality of openings that expose the third pads 324 of the third semiconductor die 32. The third redistribution layer 36a is disposed on at least a portion of the third passivation layer 35 and in the openings defined by the third passivation layer 35. The third redistribution layer 36a is electrically connected to the third pads 324 of the third semiconductor die 32 and the patterned conductive layer 60. The third redistribution layer 36a extends to and is exposed from the lateral surface 343 of the third encapsulant 34.

The first surface 421 of the fourth semiconductor die 42 is a backside surface, which faces downward toward the third semiconductor die 32 with reference to the orientation shown in FIG. 17. The first surface 421 of the fourth semiconductor die 42 is adhered to the third passivation layer 35 and the third redistribution layer 36 through the fourth adhesion layer 47. The second surface 422 of the fourth semiconductor die 42 is an active surface, which faces upward with reference to the orientation shown in FIG. 17. The fourth pads 424 are disposed adjacent to the second surface 422 of the fourth semiconductor die 42. The second surface 442 of the fourth encapsulant 44 is substantially coplanar with the second surface 422 of the fourth semiconductor die 42. The fourth passivation layer 45 is disposed on at least a portion of the top surface (the second surface 442) of the fourth encapsulant 44 and the second surface 422 of the fourth semiconductor die 42, and defines a plurality of openings that expose the fourth pads 424 of the fourth semiconductor die 42. The fourth redistribution layer 46a is disposed on at least a portion of the fourth passivation layer 45 and the openings defined by the fourth passivation layer 45. The fourth redistribution layer 46a is electrically connected to the fourth pads 424 of the fourth semiconductor die 42 and the patterned conductive layer 60. The fourth redistribution layer 46a extends to and is exposed from the lateral surface 443 of the fourth encapsulant 44. The top encapsulant 57 covers at least a portion of the fourth passivation layer 45 and the fourth redistribution layer 46a. The protection layer 65 covers at least a portion of the patterned conductive layer 60 on all side surfaces (including lateral surfaces, top surface and bottom surface), and defines a plurality of openings 651 that expose the bonding pads 60a for external connection. For sake of simplicity, the same die orientation for each layer of the semiconductor package 1j has been depicted, but dice may be oriented differently within the semiconductor package 1j (e.g., flipped)as described above in reference to FIG. 15.

Figure 18:
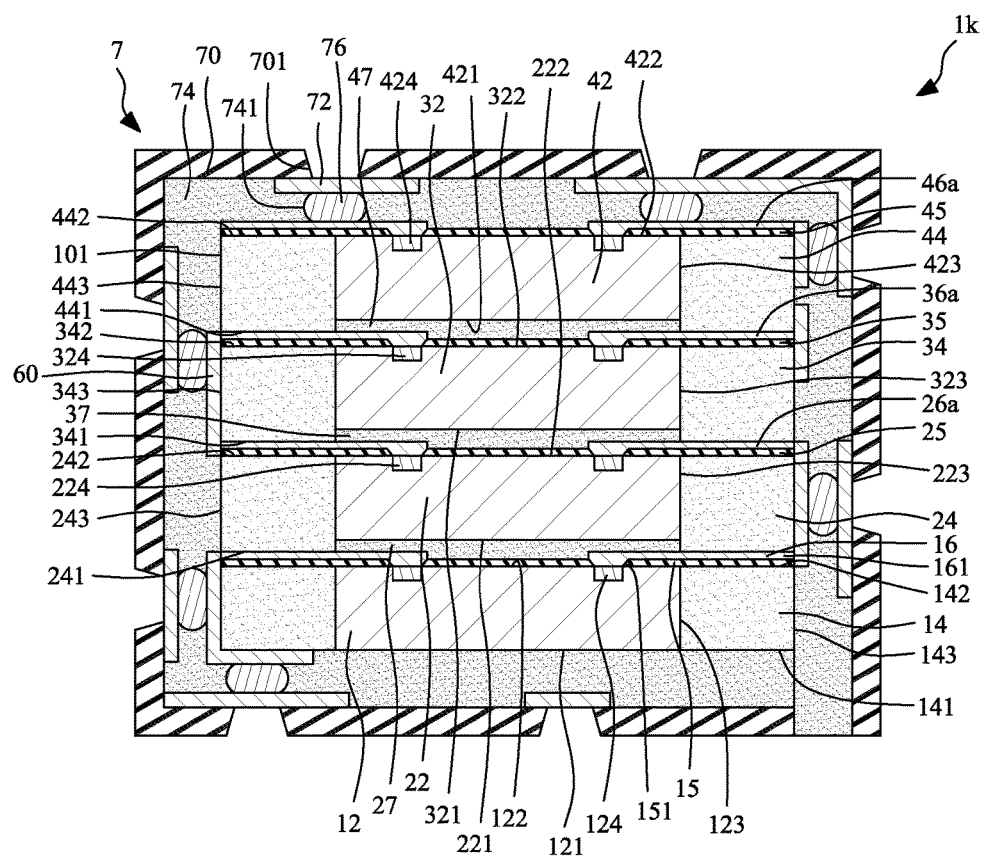
FIG. 18 depicts a cross-sectional view of an example of a semiconductor package according to some embodiments of the present disclosure.

FIG. 18 depicts a cross-sectional view of an example of a semiconductor package 1k according to some embodiments of the present disclosure. The semiconductor package 1k is similar to the semiconductor package 1j shown in FIG. 17, and similar features are numbered alike and not further described with respect to FIG. 18. In FIG. 18, the protection layer 65 is omitted, and at least one substrate 7 is bonded to the patterned conductive layer 60 of the semiconductor package 1j. The substrate 7 is a flexible substrate, and includes a main layer 70, at least one circuit layer 72, an adhesion layer 74 and a plurality of conductive bumps 76. The main layer 70 includes a dielectric material or an insulation material, and defines a plurality of openings 701 that expose a portion of the circuit layer 72 for external connection. The circuit layer 72 is disposed on at least a portion of or embedded in the main layer 70. The adhesion layer 74 covers at least a portion of the main layer 70 and the circuit layer 72, and defines a plurality of openings 741 that expose a portion of the circuit layer 72. The conductive bumps 76 are disposed in the openings 741 of the adhesion layer 74 and contact the circuit layer 72. The substrate 7 is attached to the semiconductor package 1j shown in FIG. 17 through the adhesion layer 74, and the conductive bumps 76 are electrically connected to the patterned conductive layer 60 of the semiconductor package 1j. It is noted that a line width/space (L/S) (also referred to herein as line width and/or spacing) of the patterned conductive layer 60 (e.g., a width of conductive material which constitutes at least a portion of the patterned conductive layer 60 and/or spacing between such conductive material) may be substantially equal to a line width/space (L/S) of the circuit layer 72 of the substrate 7. In one embodiment, the substrate 7 covers all four lateral surfaces 101, the top side and the bottom side of the semiconductor package 1j.

Figure 19:
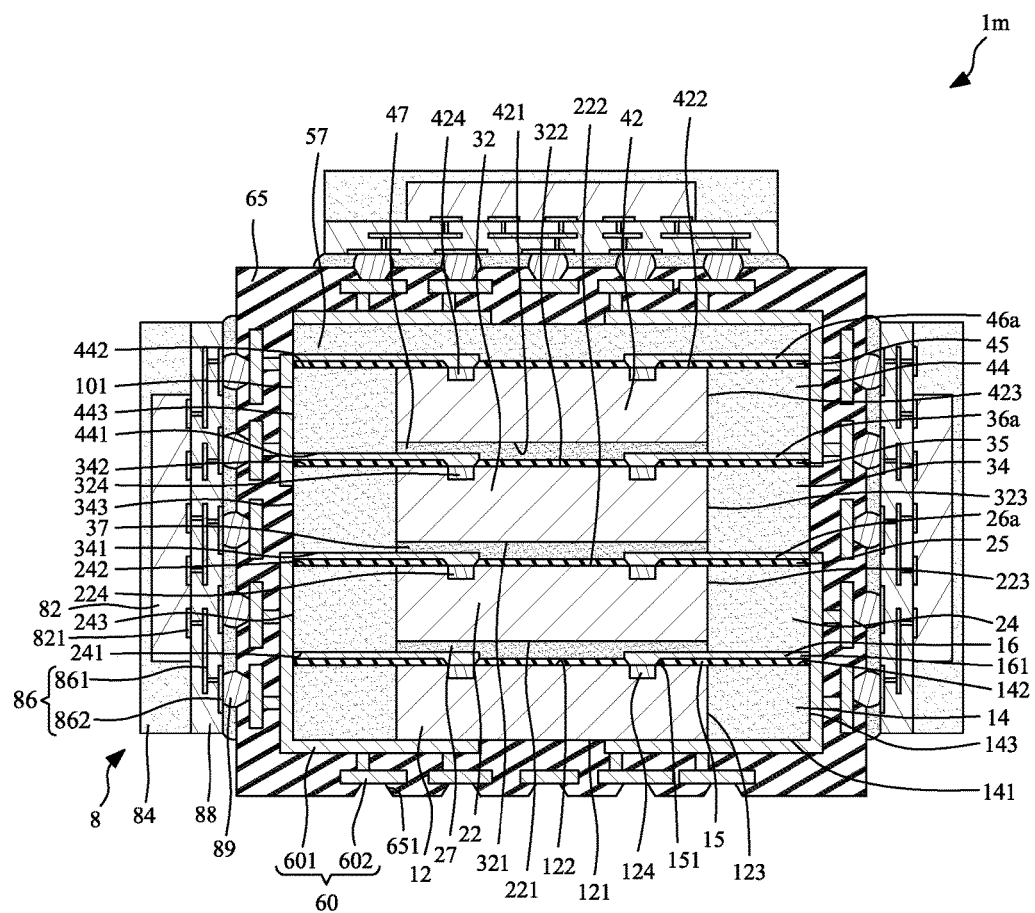
FIG. 19 depicts a cross-sectional view of an example of a semiconductor package according to some embodiments of the present disclosure.

FIG. 19 depicts a cross-sectional view of an example of a semiconductor package 1m according to some embodiments of the present disclosure. The semiconductor package 1m is similar to the semiconductor package 1j shown in FIG. 17, and similar features are numbered alike and not further described with respect to FIG. 19. In FIG. 19, the patterned conductive layer 60 includes a plurality of laminated circuit layers such as a first circuit layer 601 and a second circuit layer 602 electrically connected to the first circuit layer 601. The openings 651 defined by the protection layer 65 expose a portion of the second circuit layer 602 for external connection. The first circuit layer 601 is close to the first encapsulant 14 and/or the second encapsulant 24 (e.g., is disposed on at least a portion of the first encapsulant 14 or the second encapsulant 24), and the second circuit layer 602 is farther away from the first encapsulant 14 and/or the second encapsulant 24 (e.g., is disposed such that the first circuit layer 601 is disposed between the second circuit layer 602 and the first encapsulant 14 and/or the second encapsulant 24). The line width/space (L/S) of the first circuit layer 601 is greater than the line width/space (L/S) of the second circuit layer 602. For example, the line width/space (L/S) of the first circuit layer 601 may be greater than about 10 micrometers (μm)/about 10 μm, such as about 25 μm/about 25 μm, about 35 μm/about 35 μm, about 45 μm/about 45 μm, or greater, and the line width/space (L/S) of the second circuit layer 602 may be greater than about 2 μm/about 2 μm and less than about 10 μm/about 10 μm. As used herein, the descriptor a first width/space being "greater than" a second line width/space may refer to either the width or the space, or both, of the first width/space being greater than the corresponding width or space of the second width/space. Although examples are provided here in which the line width and the line space are equal to each other, they need not be. In other embodiments, the line width/space (L/S) of the first circuit layer 601 may be less than the line width/space (L/S) of the second circuit layer 602. For example, the line width/space (L/S) of the first circuit layer 601 may be greater than about 10 μm/about 10 μm, and the line width/space (L/S) of the second circuit layer 602 may be less than about 25 μm/about 25 μm.

As shown in FIG. 19, the semiconductor package 1m further includes a side package 8 bonded to the second circuit layer 602 through the solder bumps 89. In one embodiment, the side package 8 is a fan-out wafer level device, and includes a semiconductor die 82, an encapsulant 84, a conductor structure 86 and a dielectric structure 88. The semiconductor die 82 includes a plurality of pads 821 disposed adjacent to the active surface thereof. The encapsulant 84 covers the semiconductor die 82 except for the active surface of the semiconductor die 82. The dielectric structure 88 covers the active surface of the semiconductor die 82 and at least a portion of the encapsulant 84. The conductor structure 86 is embedded in the dielectric structure 88, and includes a plurality of laminated circuit layers such as a first circuit layer 861 and a second circuit layer 862 electrically connected to the first circuit layer 861. A portion of the second circuit layer 862 is exposed from the dielectric structure 88 and contacts the solder bumps 89. The first circuit layer 861 is closer to the active surface of the semiconductor die 82 than is the second circuit layer 862, and the first circuit layer 861 is farther from encapsulants of a main stack of encapsulants that includes, for example, the first encapsulant 14, the second encapsulant 24, the third encapsulant 34, the fourth encapsulant 44, and the top encapsulant 57. The line width/space (L/S) of the first circuit layer 861 can be less than the line width/space (L/S) of the second circuit layer 862. For example, the line width/space (L/S) of the first circuit layer 861 may be less than about 2 μm/about 2 μm, such as about 1 μm/about 1 μm, about 0.5 μm/about 0.5 μm, or less, and the line width/space (L/S) of the second circuit layer 862 may be greater than about 2 μm/about 2 μm and less than about 10 μm/about 10 μm. It is noted that the line width/space (L/S) of the second circuit layer 862 of the side package 8 may be substantially equal to the line width/space (L/S) of the second circuit layer 602 of the patterned conductive layer 60. In the depicted embodiments, the first circuit layer 601 and the second circuit layer 602 can be formed by a substrate level process rather than a wafer level process, thus keeping a manufacturing cost is low. That is, the conductive structure including the line width/space (L/S) in the range from about 10 μm/about 10 μm to about 25 μm/about 25 μm can be produced by a lower cost substrate level process. Forming a circuit layer with a line width/space (L/S) of about 25 μm/about 25 μm on the dielectric structure 88 directly by a wafer level process is not required, and thus, the manufacturing cost is kept low. In addition, since the line width/space (L/S) of the second circuit layer 862 may be less than about 10 μm/about 10 μm, the input/output (I/O) count can be relative greater than a circuit layer with a line width/space (L/S) of about 25 μm/about 25 μm.

Figure 20:
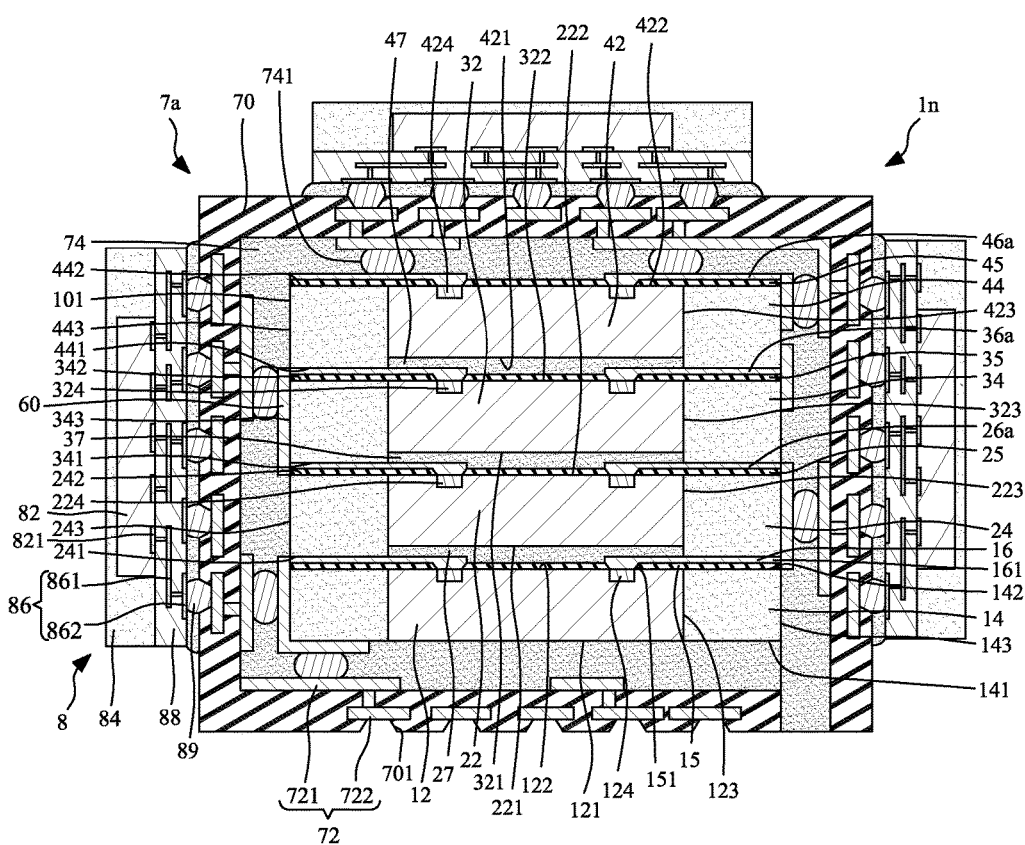
FIG. 20 depicts a cross-sectional view of an example of a semiconductor package according to some embodiments of the present disclosure.

FIG. 20 depicts a cross-sectional view of an example of a semiconductor package 1n according to some embodiments of the present disclosure. The semiconductor package 1n is similar to the semiconductor package 1k shown in FIG. 18, and similar features are numbered alike and not further described with respect to FIG. 20. In FIG. 20, the substrate 7a includes a plurality of laminated circuit layers such as a first circuit layer 721 and a second circuit layer 722 electrically connected to the first circuit layer 721. The first circuit layer 721 and the second circuit layer 722 are embedded in or on the main layer 70. The openings 701 defined by the main layer 70 expose at least one portion of the second circuit layer 722 for external connection. The first circuit layer 721 is closer to the first encapsulant 14 and/or the second encapsulant 24 than is the second circuit layer 722. The line width/space (L/S) of the first circuit layer 721 is greater than the line width/space (L/S) of the second circuit layer 722. For example, the line width/space (L/S) of the first circuit layer 721 may be greater than about 10 μm/about 10 μm, such as about 25 μm/about 25 μm, about 35 μm/about 35 μm, about 45 μm/about 45 μm, or greater, and the line width/space (L/S) of the second circuit layer 722 may be greater than about 2 μm/about 2 μm and less than about 10 μm/about 10 μm.

As shown in FIG. 20, the semiconductor package 1n further includes the side package 8 as depicted in FIG. 19. The side package 8 is bonded to the second circuit layer 722 through the solder bumps 89. It is noted that the line width/space (L/S) of the second circuit layer 862 of the side package 8 may be substantially equal to the line width/space (L/S) of the second circuit layer 722 of the substrate 7a.

Figure 21:
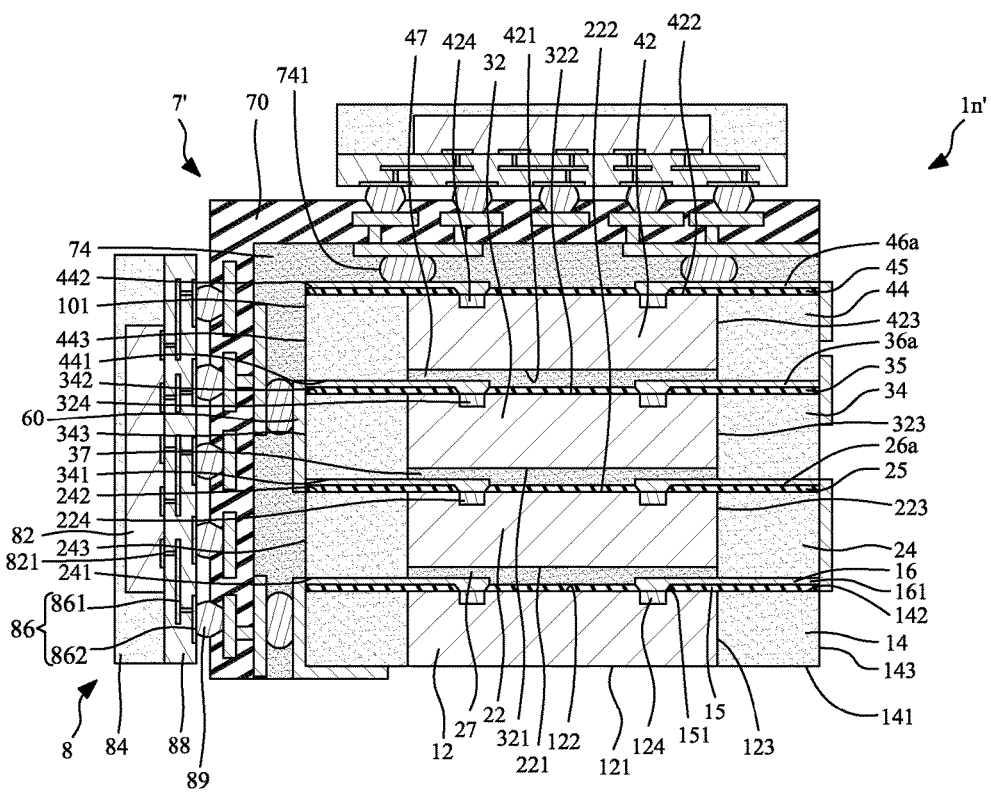
FIG. 21 depicts a cross-sectional view of an example of a semiconductor package according to some embodiments of the present disclosure.

FIG. 21 depicts a cross-sectional view of an example of a semiconductor package 1n' according to some embodiments of the present disclosure. The semiconductor package 1n' is similar to the semiconductor package 1n shown in FIG. 20, and similar features are numbered alike and not further described with respect to FIG. 21. In FIG. 21, the substrate 7' does not cover all four lateral surfaces 101, the top side and the bottom side of the semiconductor package 1j. In some embodiments, the right lateral surface 101 and the bottom side of the semiconductor package 1j are exposed from the substrate 7'.

Figure 22:
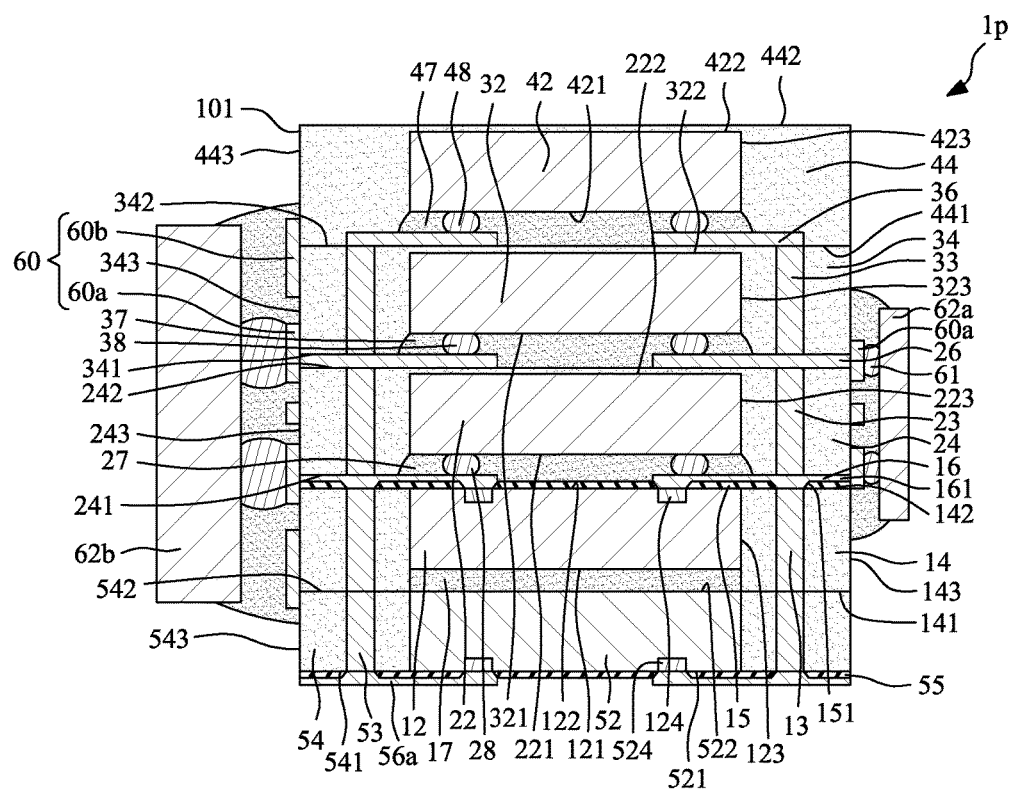
FIG. 22 depicts a cross-sectional view of an example of a semiconductor package according to some embodiments of the present disclosure.

FIG. 22 depicts a cross-sectional view of an example of a semiconductor package 1p according to some embodiments of the present disclosure. The semiconductor package 1p is similar to the semiconductor package 1a shown in FIG. 2, and similar features are numbered alike and not further described with respect to FIG. 22. In FIG. 22, the bottom circuit layer 56 is omitted, and the semiconductor package 1p further includes a bottom semiconductor die 52, a plurality of bottom vias 53, a bottom passivation layer 55 and a bottom redistribution layer 56a.

The bottom semiconductor die 52 has a first surface 521, a second surface 522 opposite to the first surface 521 and a plurality of bottom pads 524. The first surface 521 of the bottom semiconductor die 52 is an active surface, which faces downward with reference to the orientation shown in FIG. 22. The second surface 522 of the bottom semiconductor die 52 is a backside surface, which faces upward toward the first semiconductor die 12 with reference to the orientation shown in FIG. 22. The bottom pads 524 are disposed adjacent to the first surface 521 of the bottom semiconductor die 52.

The bottom encapsulant 54 encloses at least a portion of the bottom semiconductor die 52. The first surface 541 of the bottom encapsulant 54 is substantially coplanar with the first surface 521 of the bottom semiconductor die 52. That is, the bottom encapsulant 54 does not extend past the first surface 521 of the bottom semiconductor die 52. The second surface 542 of the bottom encapsulant 54 is substantially coplanar with the second surface 522 of the bottom semiconductor die 52. That is, the bottom semiconductor die 52 is embedded in the bottom encapsulant 54. The thickness of the bottom semiconductor die 52 is substantially equal to the thickness of the bottom encapsulant 54. The first surface 521 and the second surface 522 of the bottom semiconductor die 52 are exposed from the first surface 541 and the second surface 542 of the bottom encapsulant 54, respectively. The first surface 121 of the first semiconductor die 12 is adhered to the second surface 522 of the bottom semiconductor die 52 through the first adhesion layer 17. In one or more embodiments, the bottom encapsulant 54 covers the second surface 522 of the bottom semiconductor die 52, and the first surface 121 of the first semiconductor die 12 is adhered to the second surface 542 of the bottom encapsulant 54.

The bottom vias 53 extend through the bottom encapsulant 54 and electrically connect the bottom redistribution layer 56a and the first vias 13. The bottom end and the top end of each of the bottom vias 53 are exposed from the first surface 541 and the second surface 542 of the bottom encapsulant 54, respectively. The length of each of the bottom vias 53 is substantially equal to the thickness of the bottom semiconductor die 52. The bottom vias 53 surround or are disposed around the bottom semiconductor die 52. At least a portion of the bottom encapsulant 54 may be disposed between the bottom semiconductor die 52 and one of the bottom vias 53.

As shown in FIG. 22, the bottom passivation layer 55 is disposed on at least a portion of the first surface 541 of the bottom encapsulant 54 and the first surface 521 of the bottom semiconductor die 52, and defines a plurality of openings that expose the bottom pads 524 of the bottom semiconductor die 52 and the top ends of the bottom vias 53. The bottom redistribution layer 56a is disposed on at least a portion of the bottom passivation layer 55 and in the openings defined by the bottom passivation layer 55. In an embodiment in which the bottom passivation layer 55 is omitted, the bottom redistribution layer 56a is disposed on at least a portion of the first surface 541 of the bottom encapsulant 54 and the first surface 521 of the bottom semiconductor die 52. The bottom redistribution layer 56a is electrically connected to the bottom pads 524 of the bottom semiconductor die 52 and the bottom vias 53. The bottom redistribution layer 56a is a portion of the patterned conductive layer 60. A dielectric protection layer (not shown) can be applied over the bottom RDL 56a and can define openings that expose at least a portion of the bottom RDL 56a.

Figure 23:
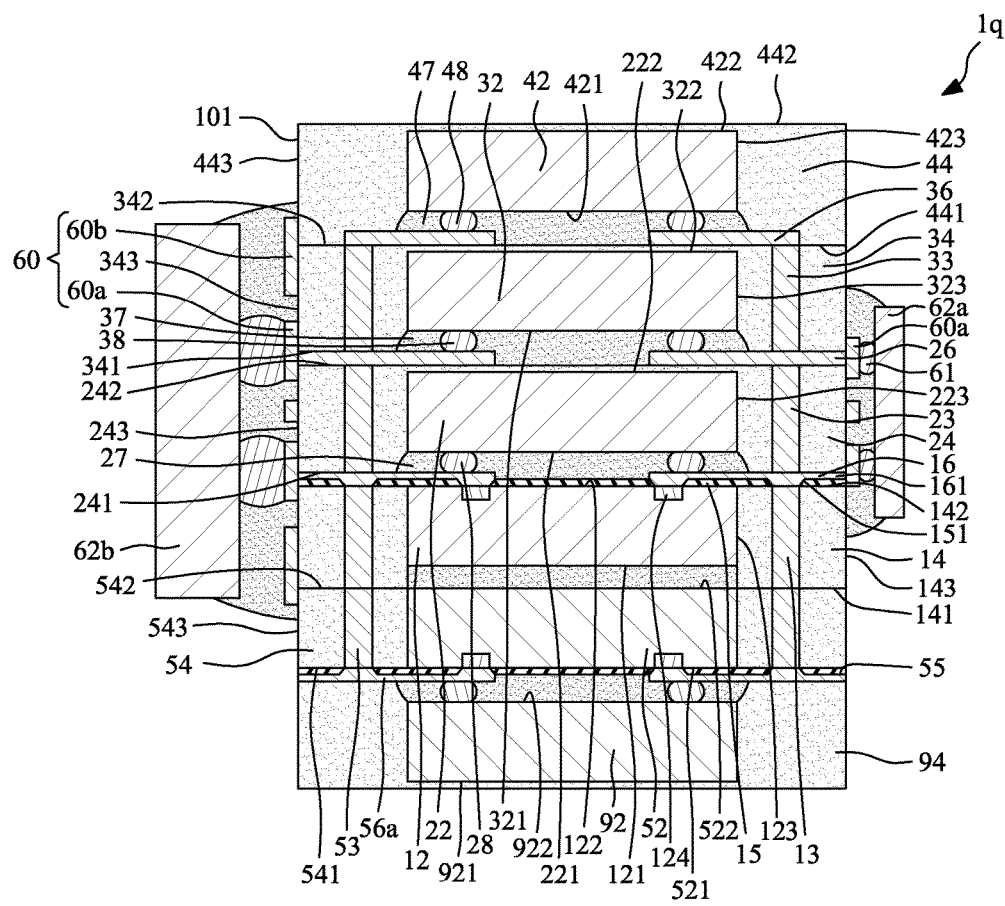
FIG. 23 depicts a cross-sectional view of an example of a semiconductor package according to some embodiments of the present disclosure.

FIG. 23 depicts a cross-sectional view of an example of a semiconductor package 1q according to some embodiments of the present disclosure. The semiconductor package 1q is similar to the semiconductor package 1p shown in FIG. 22, and similar features are numbered alike and not further described with respect to FIG. 23. In FIG. 23, the semiconductor package 1q further includes a sixth semiconductor die 92 and a sixth encapsulant 94. The sixth semiconductor die 92 has a first surface 921 and a second surface 922 opposite to the first surface 921. The first surface 921 of the sixth semiconductor die 92 is a backside surface, which faces downward with reference to the orientation shown in FIG.

23. The second surface 922 of the six semiconductor die 92 is an active surface, which faces upward toward the bottom semiconductor die 52 with reference to the orientation shown in FIG. 23, and electrically connected to the bottom redistribution layer 56a. The sixth encapsulant 94 covers at least a portion of the sixth semiconductor die 92 and the bottom redistribution layer 56a.

Figure 24:
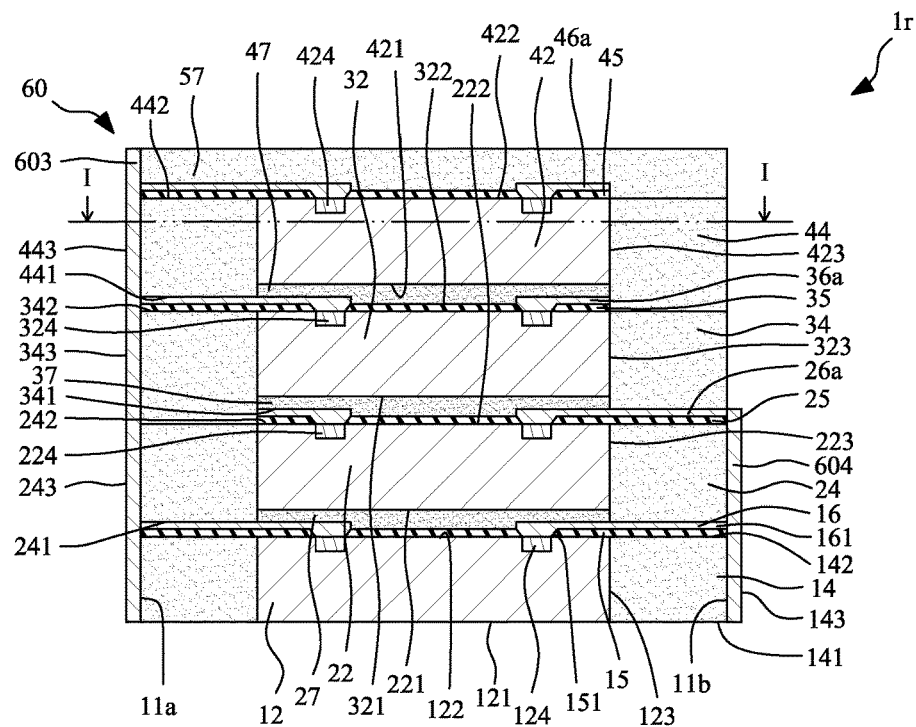
FIG. 24 depicts a cross-sectional view of an example of a semiconductor package according to some embodiments of the present disclosure.
Figure 25:
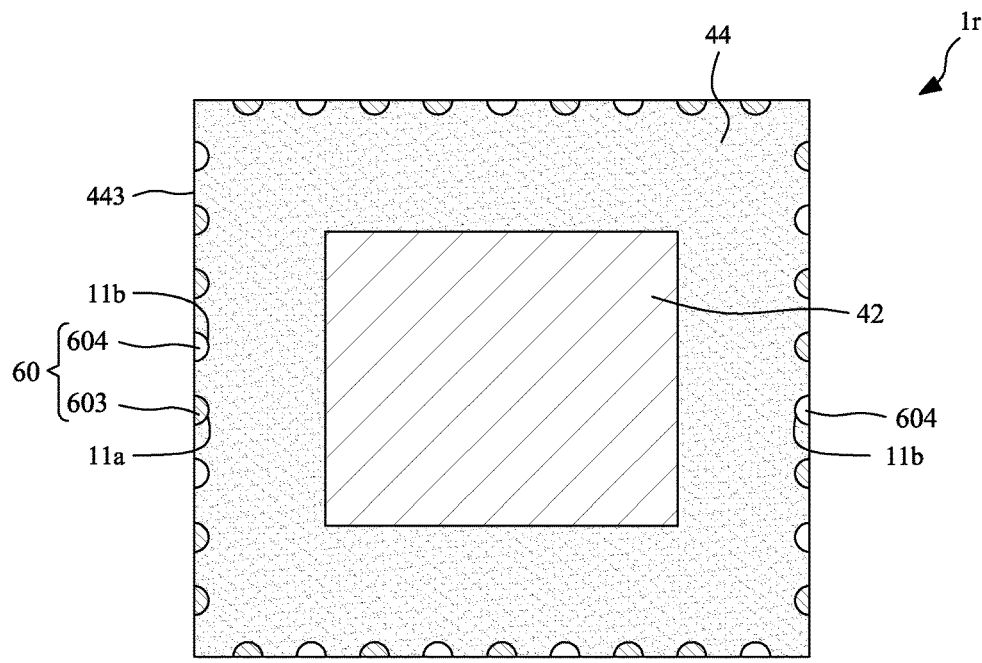
FIG. 25 depicts a cross-sectional view taken along line I-I of FIG. 24.

FIG. 24 depicts a cross-sectional view of an example of a semiconductor package 1r according to some embodiments of the present disclosure. FIG. 25 depicts a cross-sectional view taken along line I-I of FIG. 24. The semiconductor package 1r is similar to the semiconductor package 1j shown in FIG. 17, and similar features are numbered alike and not further described with respect to FIGS. 24 and 25. In FIGS. 24 and 25, the semiconductor package 1r includes a plurality of first grooves (or through holes) 11a and second grooves (or through holes) 11b defined by components of the semiconductor package 1r, including, for example, the first encapsulant 14, the second encapsulant 24, the third encapsulant 34, the fourth encapsulant 44, and the top encapsulant 57. The first grooves 11a and second grooves 11b extend from a top surface of the semiconductor package 1r to a bottom surface the semiconductor package 1r, and are located adjacent to one or more lateral surfaces of one or more components of the semiconductor package 1r, including the lateral surface 143 of the first encapsulant 14, the lateral surface 243 of the second encapsulant 24, the lateral surface 343 of the third encapsulant 34 and the lateral surface 443 of the fourth encapsulant 44 of the semiconductor package 1r. The patterned conductive layer 60 includes a first portion 603 and a second portion 604. The first portion 603 of the patterned conductive layer 60 is disposed in the first groove 11a, and can be cut from a solid via. As shown in FIG. 24, the first portion 603 extends from the top surface of the semiconductor package 1r to the bottom surface the semiconductor package 1r, and electrically connect the first redistribution layer 16, the third redistribution layer 36a and the fourth redistribution layer 46a. The second portion 604 of the patterned conductive layer 60 is selectively disposed in a lower portion of the second groove 11b. Thus, the second portion 604 does not extend from the top surface of the semiconductor package 1r to the bottom surface the semiconductor package 1r. During a manufacturing process, the second groove 11b can cut from an empty through hole; then, the second portion 604 of the patterned conductive layer 60 can be formed in a desired position of the groove 11b by selectively plating or printing. As shown in FIG. 24, the second portion 604 of the patterned conductive layer 60 is disposed in the lower portion of the second groove 11b so as to electrically connect the first redistribution layer 16 and the second redistribution layer 26a. The first portion 603 and the second portion 604 of the patterned conductive layer 60 may, in some embodiments, protrude from the grooves in which they are respectively disposed.

Figure 26:
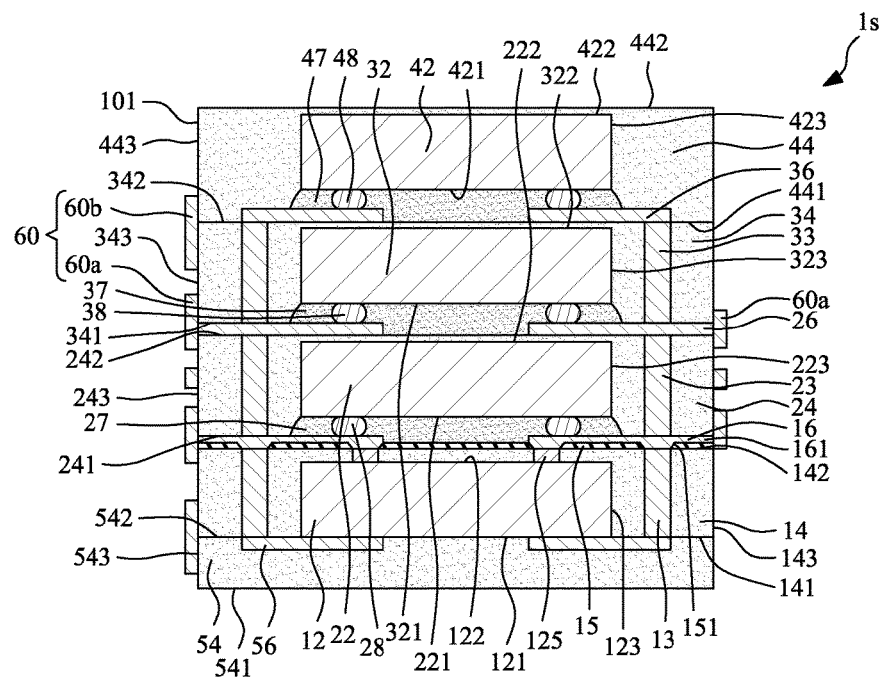
FIG. 26 depicts a cross-sectional view of an example of a semiconductor package according to some embodiments of the present disclosure.

FIG. 26 depicts a cross-sectional view of an example of a semiconductor package 1s according to some embodiments of the present disclosure. The semiconductor package 1s is similar to the semiconductor package 1 shown in FIG. 1, and similar features are numbered alike and not further described with respect to FIG. 26. In FIG. 26, the first semiconductor die 12 includes a plurality of pillars 125 protruding from the second surface 122 of the first semiconductor die 12. The first encapsulant 14 covers the second surface 122 of the first semiconductor die 12 except for the pillars 125. The openings 151 defined by the first passivation layer 15 expose top ends of the pillars 125, and the first redistribution layer 16 electrically connects to the pillars 125.

Figure 27:
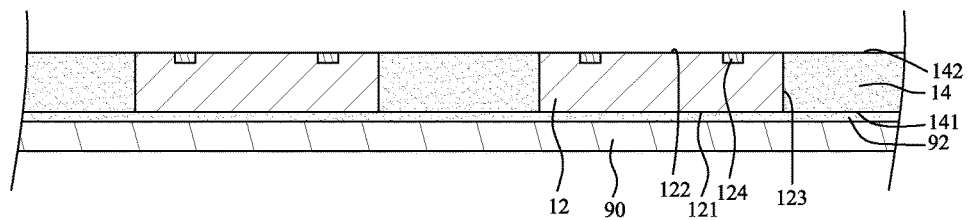
FIG. 27, FIG. 28, FIG. 29, FIG. 30, FIG. 31, FIG. 32, FIG. 33, FIG. 34, FIG. 35, FIG. 36, FIG. 37, FIG. 38, FIG. 39, FIG. 40 and FIG. 41 depict cross-sectional views of an example semiconductor package at various stages during an example method for manufacturing the semiconductor package, according to some embodiments of the present disclosure.

FIGS. 27-41 depict cross-sectional views of an example semiconductor package at various stages during an example method for manufacturing the semiconductor package, according to some embodiments of the present disclosure. Referring to FIG. 27, in the die face-up process, a carrier 90 with an adhesion layer 92 on a surface of the carrier 90 is provided. Then, a plurality of first semiconductor dice 12 are disposed on the adhesion layer 92 of the carrier 90. The first semiconductor die 12 has a first surface 121, a second surface 122 opposite to the first surface 121, a lateral surface 123 and a plurality of first pads 124. The first surface 121 of the first semiconductor die 12 is a backside surface, which faces downward and is adhered to the adhesion layer 92. The second surface 122 of the first semiconductor die 12 is an active surface, which faces upward. The lateral surface 123 of the first semiconductor die 12 extends between the first surface 121 and the second surface 122. The first pads 124 are disposed adjacent to the second surface 122 of the first semiconductor die 12. The carrier 90 may be circular (wafer or the like) or rectangular (strip or panel), and may include a material that has a low coefficient of thermal expansion (CTE) to minimize mechanical stress and warpage.

Then, a first encapsulant 14 is formed to enclose at least a portion of the first semiconductor die 12. A material of the first encapsulant 14 may include a molding compound, such as epoxy resin with fillers, or a photo-imageable dielectric, such as solder mask. The first encapsulant 14 has a first surface 141 and a second surface 142 opposite to the first surface 141. The first surface 141 of the first encapsulant 14 is substantially coplanar with the first surface 121 of the first semiconductor die 12. The second surface 142 of the first encapsulant 14 is substantially coplanar with the second surface 122 of the first semiconductor die 12. Thus, the first semiconductor die 12 is embedded in the first encapsulant 14. The second surface 122 of the first semiconductor die 12 is exposed from the second surface 142 of the first encapsulant 14. Planarization steps may be performed to expose the die pads 124. Optionally, in the die face-up process, the dice are bonded face-down on the carrier adhesive and then overmolded. After molding and optional back grinding, the carrier is released and another carrier is bonded to the revealed backside. This results in a similar structure as results from the face-up process. All further processing is similar for both processes.

Figure 28:
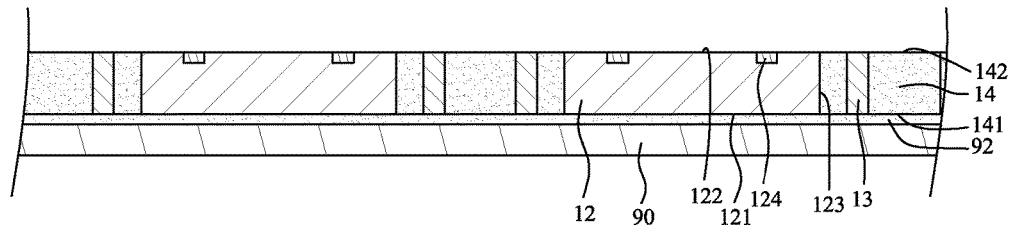

Referring to FIG. 28, a plurality of first vias 13 are formed which extend through the first encapsulant 14. The bottom end and the top end of each of the first vias 13 are exposed from the first surface 141 and the second surface 142 of the first encapsulant 14, respectively. The first vias 13 surround or are disposed around the first semiconductor die 12. At least a portion of the first encapsulant 14 may be disposed between the first semiconductor die 12 and one of the first vias 13. In one or more embodiments, a plurality of holes are formed in the first encapsulant 14 by laser drilling, and then, a metal material is plated to fill the holes to form the first vias 13. In one embodiment in which the first encapsulant 14 is a photo-imageable dielectric, the holes are formed by exposure. The adhesive dielectric may be retained on the die, such as when the adhesive dielectric is thin and voltage bias may penetrate the adhesive dielectric.

Figure 29:
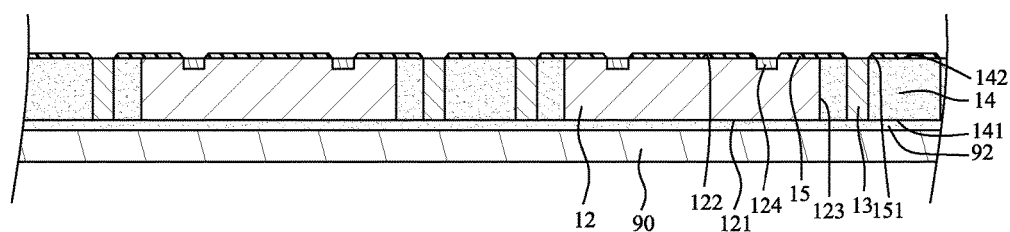

Referring to FIG. 29, a first passivation layer 15 is formed on at least a portion of the top surface (the second surface 142) of the first encapsulant 14 and the second surface 122 of the first semiconductor die 12, and defines a plurality of openings 151 that expose the first pads 124 of the first semiconductor die 12 and the top ends of the first vias 13.

Figure 30:
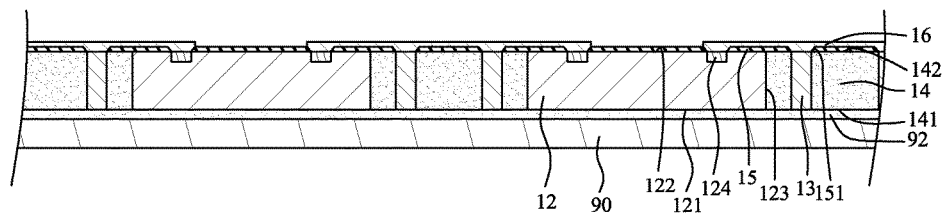

Referring to FIG. 30, a first redistribution layer 16 is formed on at least a portion of the first passivation layer 15 and in the openings 151. In an embodiment in which the first passivation layer 15 is omitted, the first redistribution layer 16 is formed on at least a portion of the top surface (the second surface 142) of the first encapsulant 14 and the second surface 122 of the first semiconductor die 12. The first redistribution layer 16 is electrically connected to the first pads 124 of the first semiconductor die 12 and the first vias 13. It is noted that the first redistribution layer 16 may include a plurality of fan-out traces formed by, for example, plating or ink jet printing. The first semiconductor die 12, the first encapsulant 14, the first vias 13, and the first redistribution layer (RDL) 16 are formed by wafer level packaging techniques and the like.

Figure 31:
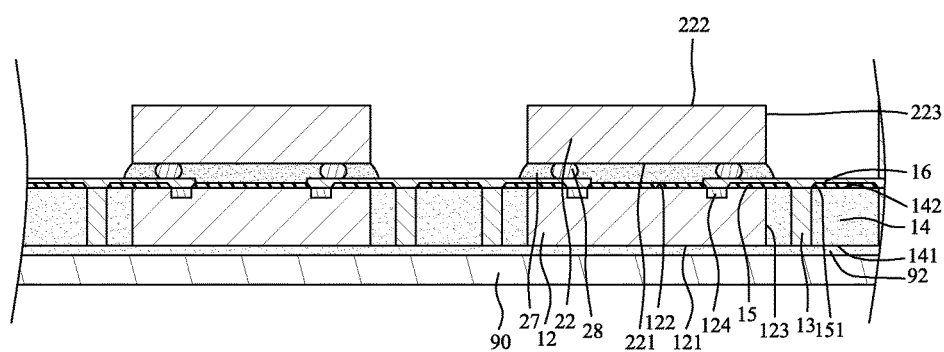

Referring to FIG. 31, a second semiconductor die 22 is provided and bonded to the first redistribution layer 16. The second semiconductor die 22 has a first surface 221, a second surface 222 opposite to the first surface 221 and a lateral surface 223. The first surface 221 of the second semiconductor die 22 is an active surface, which faces downward toward the first semiconductor die 12 with reference to the orientation shown in FIG. 31, and is electrically connected to the first redistribution layer 16 through a plurality second bumps 28 by, for example, flip-chip bonding. Terminals from each die may connect to the same or different fan-out traces. Then, a second adhesion layer 27 (e.g., underfill) may be further optionally provided to adhere the first surface 221 of the second semiconductor die 22, a portion of the redistribution layer 16 and a portion of the first passivation layer 15 and to protect the second bumps 28. It is noted that the second adhesion layer 27 may be pre-applied on the first surface 221 of the second semiconductor die 22, and then be attached to the redistribution layer 16 and the first passivation layer 15. The second surface 222 of the second semiconductor die 22 is a backside surface, which faces upward with reference to the orientation shown in FIG. 31. The lateral surface 223 of the second semiconductor die 22 extends between the first surface 221 and the second surface 222. Optionally, the adhesion layer may be formed by overmolding or undermolding of the encapsulant 24.

Figure 32:
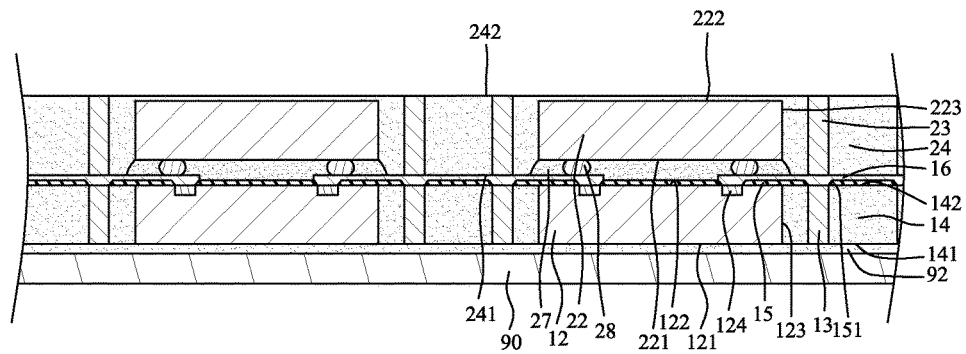

Referring to FIG. 32, a second encapsulant 24 is formed and covers at least a portion of the first encapsulant 14 and the first redistribution layer 16, and encloses at least a portion of the second semiconductor die 22. A material of the second encapsulant 24 may include a molding compound, such as epoxy resin with fillers, a photo-imageable dielectric, such as solder mask, or other suitable dielectric. When using molding compound, the underfill may be omitted. A material of the second encapsulant 24 may include the same as or different material than is included in the first encapsulant 14. The second encapsulant 24 has a first surface 241 and a second surface 242 opposite to the first surface 241. The first surface 241 of the second encapsulant 24 covers at least a portion of the first redistribution layer 16. The second surface 242 of the second encapsulant 24 covers at least a portion of the second surface 222 of the second semiconductor die 22. In one or more embodiments, the second surface 222 of the second semiconductor die 22 may be exposed from the second surface 242 of the second encapsulant 24.

Then, a plurality of second vias 23 are formed to extend through the second encapsulant 24 and electrically connect the first redistribution layer 16. The bottom end and the top end of each of the second vias 23 are exposed from the first surface 241 and the second surface 242 of the second encapsulant 24, respectively. The second vias 23 surround or are disposed around the second semiconductor die 22. At least a portion of the second encapsulant 24 may be disposed between the second semiconductor die 22 and one of the second vias 23.

Figure 33:
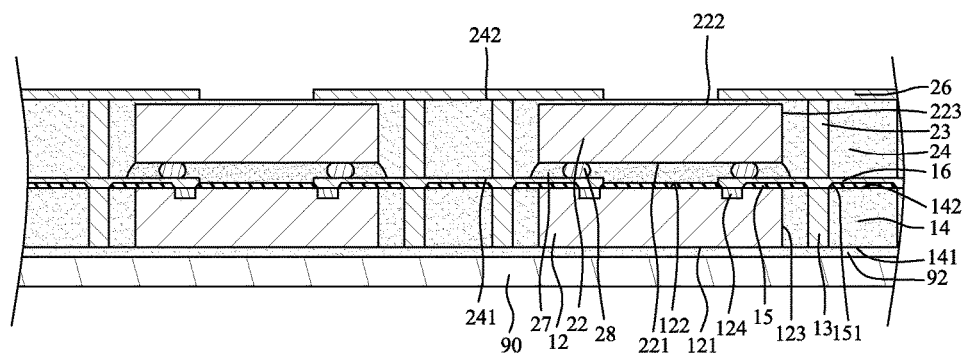

Referring to FIG. 33, a second circuit layer 26 is formed on at least a portion of the second surface 242 of the second encapsulant 24. In an embodiment in which the second surface 222 of the second semiconductor die 22 is exposed from the second surface 242 of the second encapsulant 24, a portion of the second circuit layer 26 is formed on at least a portion of the second surface 222 of the second semiconductor die 22. The second circuit layer 26 is electrically connected to the second vias 23. It is noted that the second circuit layer 26 may be a redistribution layer (RDL) or a plurality of fan-out traces formed by, for example, plating or ink jet printing. In one or more embodiments, a passivation layer may further be included between the second circuit layer 26 and the second surface 242 of the second encapsulant 24.

Figure 34:
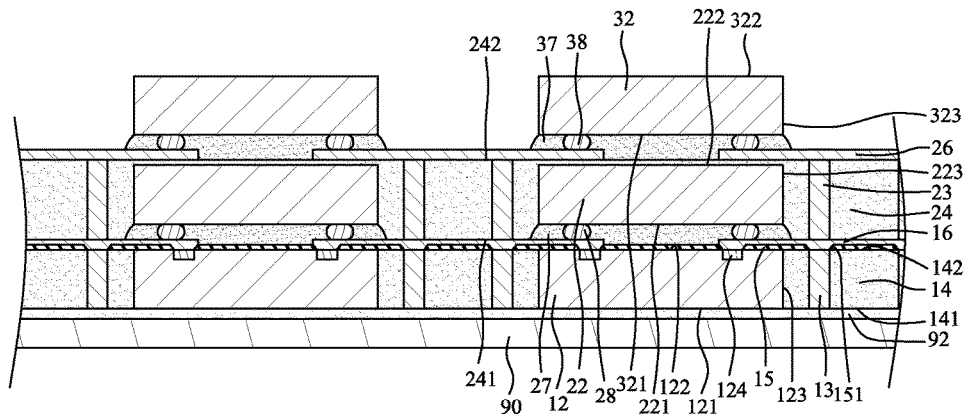

Referring to FIG. 34, a third semiconductor die 32 is provided to and bonded to the second circuit layer 26. The third semiconductor die 32 has a first surface 321, a second surface 322 opposite to the first surface 321 and a lateral surface 323. The first surface 321 of the third semiconductor die 32 is an active surface, which faces downward toward the second semiconductor die 22 with reference to the orientation shown in FIG. 34, and is electrically connected to the second circuit layer 26 through a plurality third bumps 38 by, for example, flip-chip bonding. A third adhesion layer 37 may be further optionally included to adhere the first surface 321 of the third semiconductor die 32, a portion of the second circuit layer 26 and the second surface 242 of the second encapsulant 24, and to protect the third bumps 38. The second surface 322 of the third semiconductor die 32 is a backside surface, which faces upward with reference to the orientation shown in FIG. 34. The lateral surface 323 of the second semiconductor die 32 extends between the first surface 321 and the second surface 322.

Figure 35:
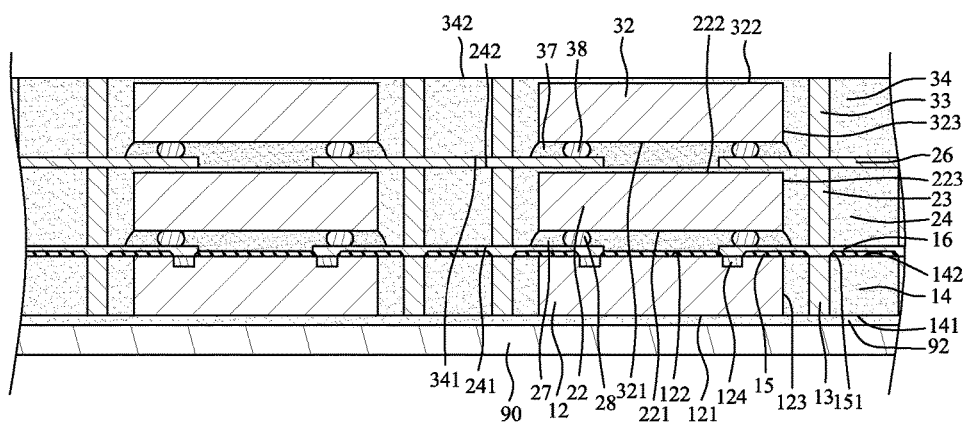

Referring to FIG. 35, a third encapsulant 34 is formed and covers at least a portion of the second encapsulant 24 and the second circuit layer 26, and encloses at least a portion of the third semiconductor die 32. The third encapsulant 34 has a first surface 341 and a second surface 342 opposite to the first surface 341. The first surface 341 of the third encapsulant 34 covers the second circuit layer 26. The second surface 342 of the third encapsulant 34 covers the second surface 322 of the third semiconductor die 32. In one or more embodiments, the second surface 322 of the third semiconductor die 32 may be exposed from the second surface 342 of the third encapsulant 34.

Then, a plurality of third vias 33 are formed which extend through the third encapsulant 34 and electrically connect the second circuit layer 26. The bottom end and the top end of each of the third vias 33 are exposed from the first surface 341 and the second surface 342 of the third encapsulant 34, respectively. The third vias 33 surround or are disposed around the third semiconductor die 32. At least a portion of the third encapsulant 34 may be disposed between the third semiconductor die 32 and one of the third vias 33.

Figure 36:
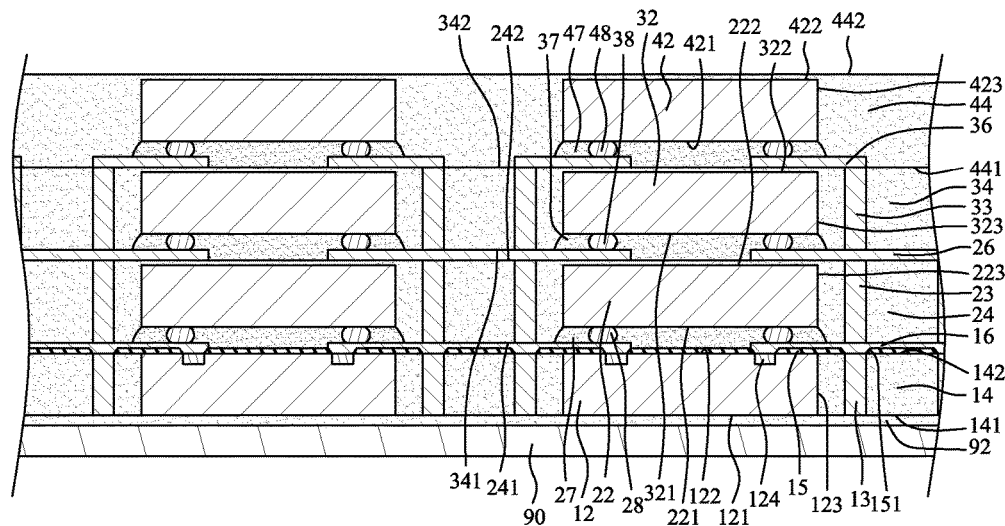

Referring to FIG. 36, a third circuit layer 36 is formed on at least a portion of the second surface 342 of the third encapsulant 34. In an embodiment in which the second surface 322 of the third semiconductor die 32 is exposed from the second surface 342 of the third encapsulant 34, a portion of the third circuit layer 36 is disposed on at least a portion of the second surface 322 of the third semiconductor die 32. The third circuit layer 36 is electrically connected to the third vias 33.

Then, a fourth semiconductor die 42 is provided and bonded to the third circuit layer 36. The fourth semiconductor die 42 has a first surface 421, a second surface 422 opposite to the first surface 421 and a lateral surface 423. The first surface 421 of the fourth semiconductor die 42 is an active surface, which faces downward toward the third semiconductor die 32 with reference to the orientation shown in FIG. 36, and is electrically connected to the third circuit layer 36 through a plurality fourth bumps 48 by, for example, flip-chip bonding. A fourth adhesion layer 47 may be further optionally included to adhere the first surface 421 of the fourth semiconductor die 42, a portion of the third circuit layer 36 and the second surface 342 of the third encapsulant 34, and to protect the fourth bumps 48. The second surface 422 of the fourth semiconductor die 42 is a backside surface, which faces upward with reference to the orientation shown in FIG. 36.

Then, a fourth encapsulant 44 is formed and covers at least a portion of the third encapsulant 34 and the third circuit layer 36, and encloses at least a portion of the fourth semiconductor die 42. The fourth encapsulant 44 has a first surface 441 and a second surface 442 opposite to the first surface 441. The first surface 441 of the fourth encapsulant 44 covers at least a portion of the third circuit layer 36. Optionally, the second surface 442 of the fourth encapsulant 44 covers the second surface 422 of the fourth semiconductor die 42.

Figure 37:
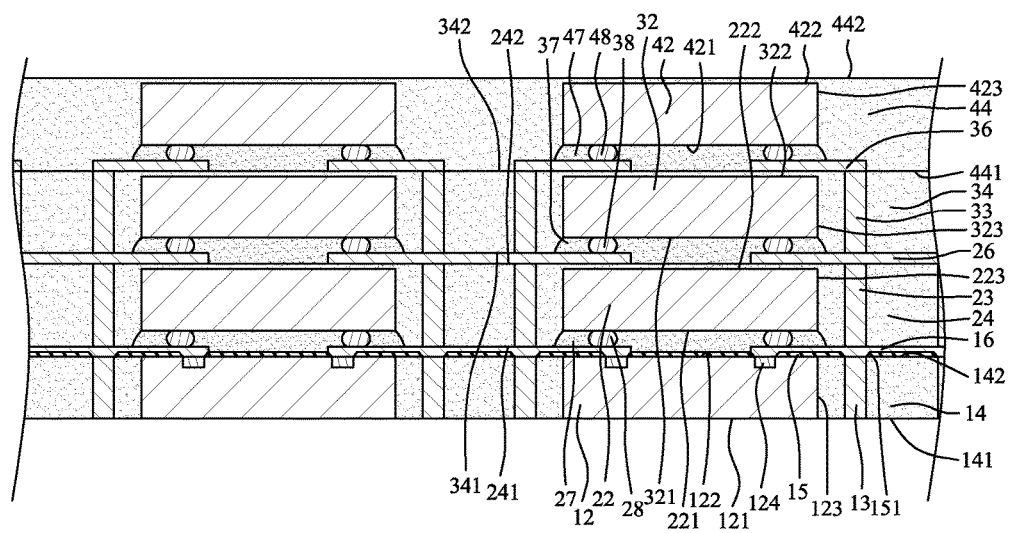

Referring to FIG. 37, the carrier 90 and the adhesion layer 92 are removed such that that the first surface 121 of the first semiconductor die 12, the first surface 141 of the first encapsulant 14 and the bottom ends of the first vias 13 are exposed. The adhesive can be retained in place, such as in cases where it is formed of a suitably thin dielectric material and a voltage bias may penetrate the dielectric. The forward processing is similar with or without the dielectric. The drawings assume the dielectric to be part of the bottom side of die and encapsulant.

Figure 38:
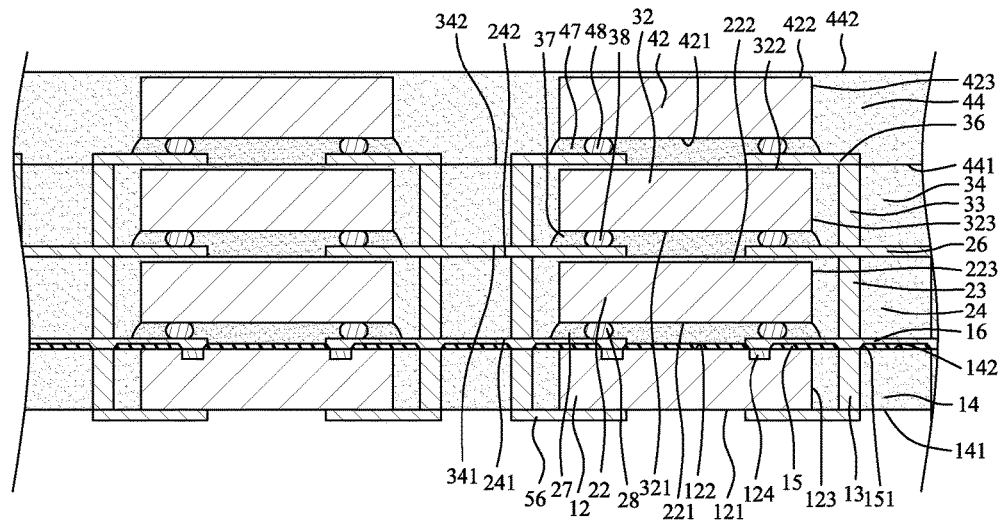

Referring to FIG. 38, a bottom circuit layer 56 is formed on at least a portion of the first surface 141 of the first encapsulant 14 and the first surface 121 of the first semiconductor die 12. The bottom circuit layer 56 is electrically connected to the first vias 13. In one or more embodiments, a passivation layer may further included between the bottom circuit layer 56 and the first surface 121 of the first semiconductor die 12.

Figure 39:
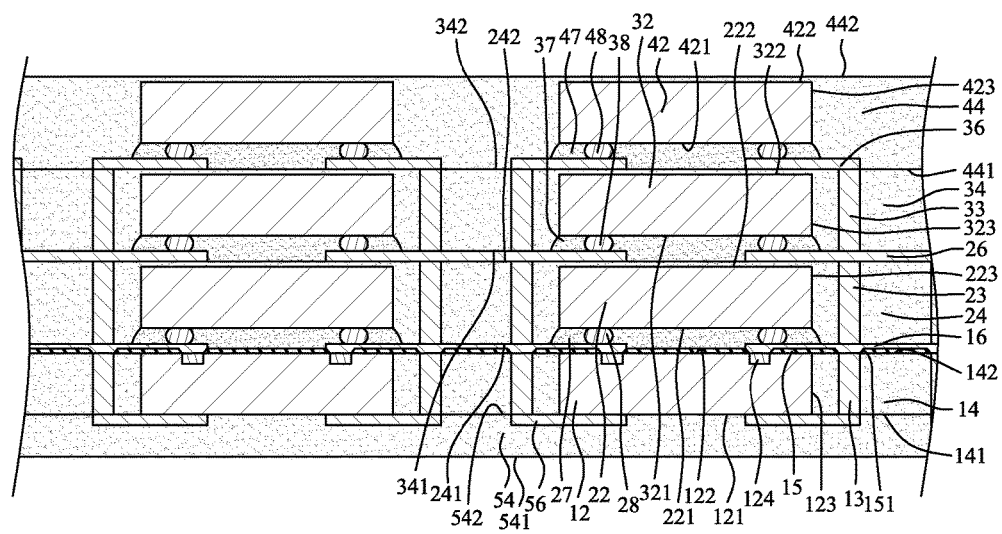

Referring to FIG. 39, a bottom encapsulant 54 is formed and covers at least a portion of the first encapsulant 14 and the bottom circuit layer 56. The bottom encapsulant 54 has a first surface 541 and a second surface 542 opposite to the first surface 541. The second surface 542 of the bottom encapsulant 54 covers at least a portion of the first surface 122 of the first semiconductor die 12, the bottom circuit layer 56 and the first surface 141 of the first encapsulant 14. The encapsulant 54 may be, for example, a mold compound, solder mask or other dielectric material.

Figure 40:
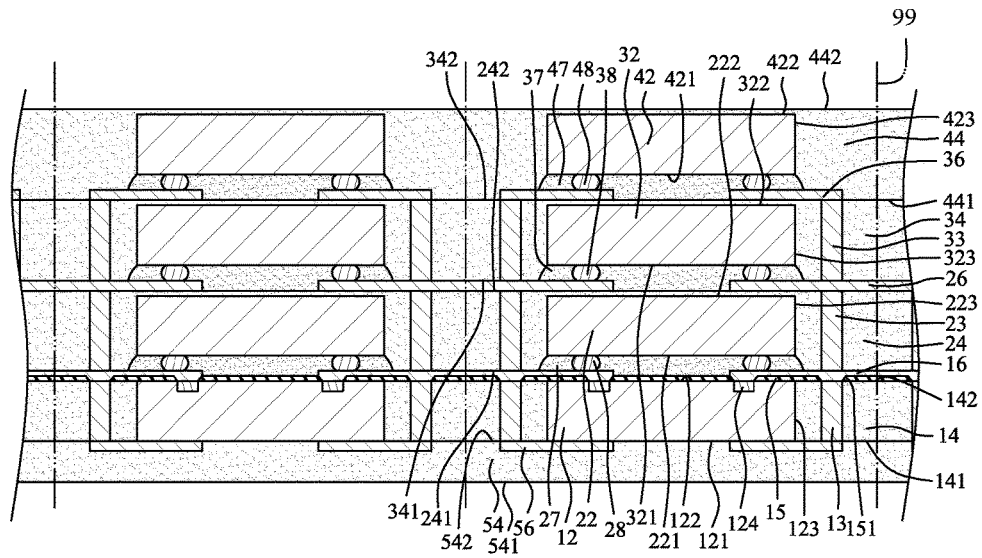

Referring to FIG. 40, a dicing or singulation process is conducted along the cutting lines 99.

Figure 41:
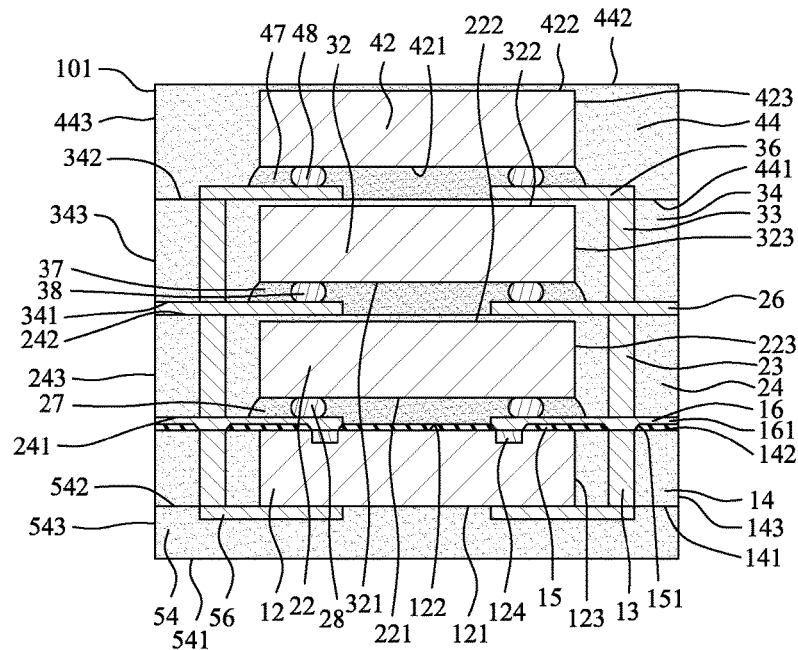

Referring to FIG. 41, the bottom encapsulant 54, the first encapsulant 14, the second encapsulant 24, the third encapsulant 34 and the fourth encapsulant 44 are singulated to form the lateral surfaces 543, 143, 243, 343, and 443, respectively. The lateral surfaces 543, 143, 243, 343, and 443 are substantially coplanar with each other, and together form a lateral surface 101 of the semiconductor package 1 (depicted in FIG. 1). The first passivation layer 15, the first redistribution layer 16 and the second circuit layer 26 are also cut. Thus, a portion of the first passivation layer 15, a portion of the first redistribution layer 16 and a portion of the second circuit layer 26, and optionally circuit layer 36, are exposed from the lateral surface 101 (including the lateral surfaces 543, 143, 243, 343, and 443) of the semiconductor package 1, and an end of the first redistribution layer 16, a lateral surface of the first passivation layer 15 and an end of the second circuit layer 26, and optionally an end of the third circuit layer 36, are substantially coplanar with the lateral surface 101 (including the lateral surfaces 543, 143, 243, 343, and 443) of the semiconductor package 1.

Then, a patterned conductive layer 60 is formed on the lateral surface 101 so as to obtain the semiconductor package 1 as shown in FIG. 1. The patterned conductive layer 60 is disposed on at least a portion of the lateral surface 101 including the lateral surface 143 of the first encapsulant 14, the lateral surface 243 of the second encapsulant 24, the lateral surface 343 of the third encapsulant 34, the lateral surface 443 of the fourth encapsulant 44 and/or the lateral surface 543 of the bottom encapsulant 54. That is, the patterned conductive layer 60 spans over two or more lateral surfaces corresponding to two or more semiconductor dice, respectively. The patterned conductive layer 60 includes a plurality of bonding pads 60a and a plurality of routing traces 60b, and is electrically connected to the first redistribution layer 16 and the second circuit layer 26 and optionally to the third circuit layer 36.

Figure 41A:
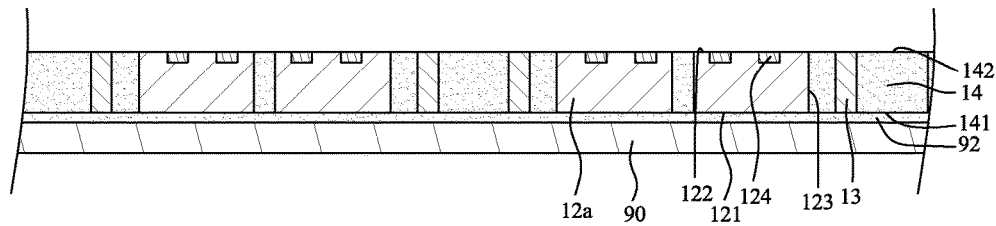
FIG. 41A, FIG. 41B, FIG. 41C and FIG. 41D depict cross-sectional views of an example semiconductor package at various stages during an example method for manufacturing the semiconductor package, according to some embodiments of the present disclosure.

FIGS. 41A-41D depict cross-sectional views of an example semiconductor package at various stages during an example method for manufacturing the semiconductor package, according to some embodiments of the present disclosure. Referring to FIG. 41A, a carrier 90 with an adhesion layer 92 disposed on a surface of the carrier 90 is provided. Then, a plurality of first semiconductor dice 12a are disposed on the adhesion layer 92 of the carrier 90. A size of the first semiconductor die 12a is smaller than a size of the first semiconductor die 12 of FIG. 27. It is noted that the adhesion layer 92 may be replaced by a metal layer. Then, a plurality of first vias 13 are formed to extend through the first encapsulant 14.

Figure 41B:
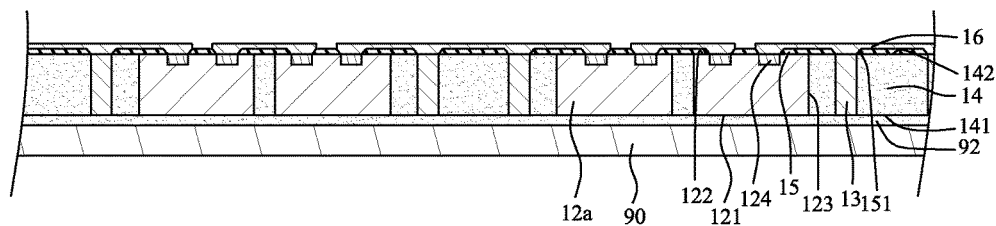

Referring to FIG. 41B, a first passivation layer 15 is formed on at least a portion of the top surface (the second surface 142) of the first encapsulant 14 and the second surface 122 of the first semiconductor die 12a, and defines a plurality of openings 151 that expose the first pads 124 of the first semiconductor die 12a and the top ends of the first vias 13. Then, a first redistribution layer 16 is formed on at least a portion of the first passivation layer 15 and in its openings 151. The first redistribution layer 16 is electrically connected to the first pads 124 of the first semiconductor dice 12a and the first vias 13.

Figure 41C:
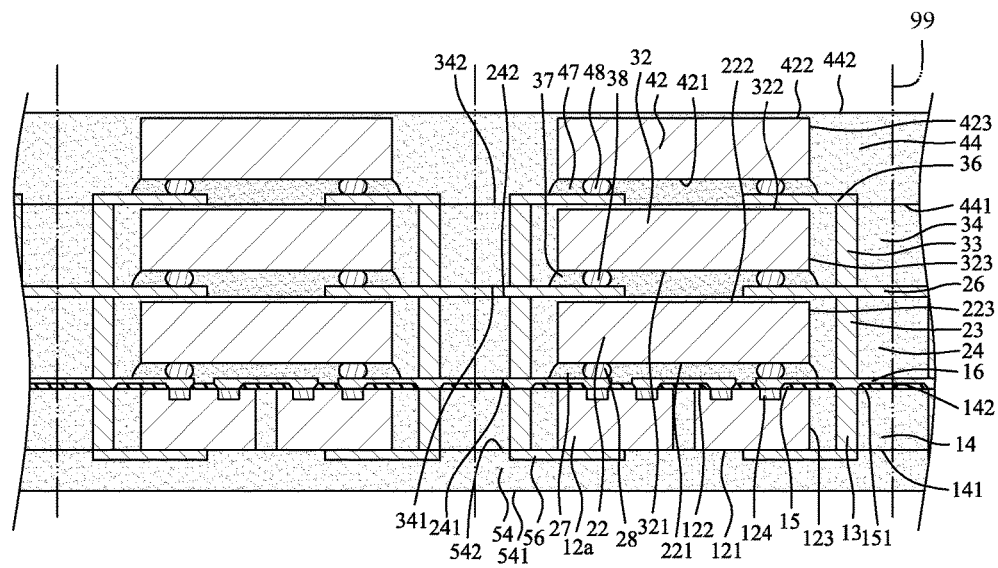

Then, the following stages of this embodiment is similar as the stages illustrated in FIGS. 31-40, so as to form the structure illustrated in FIG. 41C.

Figure 41D:
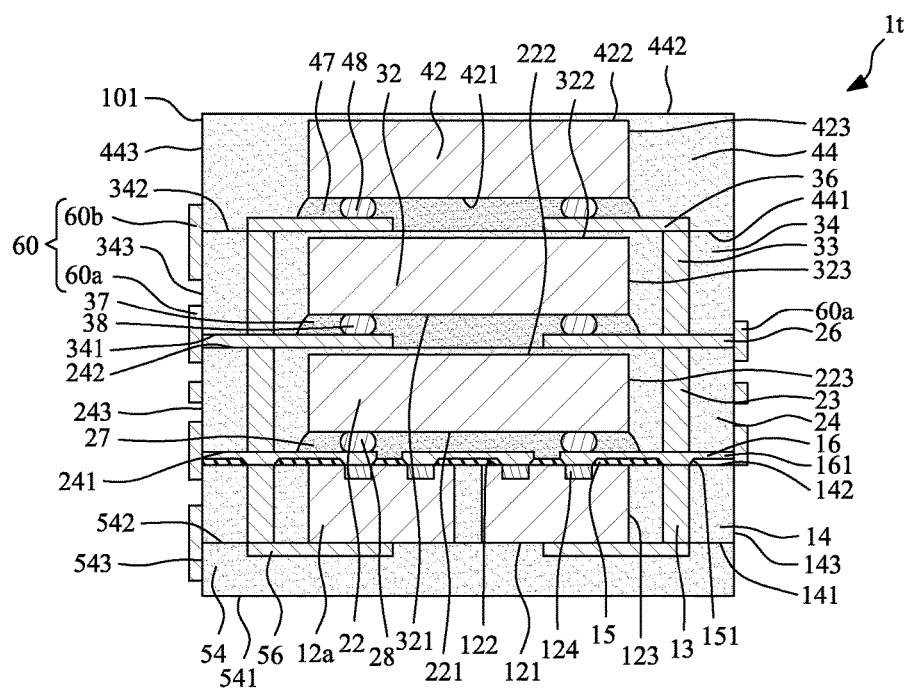

Referring to FIG. 41D, a singulation process is performed on the structure of FIG. 41C. Then, a patterned conductive layer 60 is formed on at least a portion of the lateral surface 101 so as to obtain the semiconductor package 1t as shown in FIG. 41D. The semiconductor package 1t is similar to the semiconductor package 1 shown in FIG. 1, and similar features are numbered alike and not further described with respect to FIG. 41D. In FIG. 41D, the semiconductor package 1t further includes at least two first semiconductor dice 12a. The size of the first semiconductor die 12a of FIG. 41D is smaller than the size of the first semiconductor die 12 of FIG. 1. It is noted that if the adhesion layer 92 (FIG. 41A) is replaced by a metal layer, the metal layer may be patterned to form the bottom circuit layer 56. However, the metal layer may be unpatterned, and may be used as a heat sink.

Figure 42:
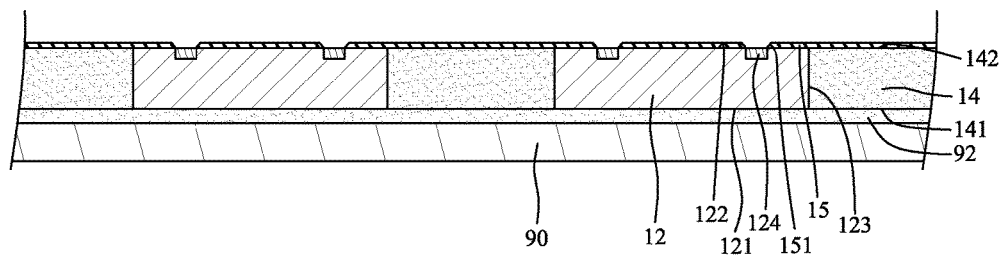
FIG. 42, FIG. 43, FIG. 44, FIG. 45, FIG. 46 and FIG. 47 depict cross-sectional views of an example semiconductor package at various stages during an example method for manufacturing the semiconductor package, according to some embodiments of the present disclosure.

FIGS. 42-47 depict cross-sectional views of an example semiconductor package at various stages during an example method for manufacturing the semiconductor package, according to some embodiments of the present disclosure. The initial stage of this embodiment is similar as the stage illustrated in FIG. 27, and FIG. 42 of this embodiment is subsequent to FIG. 27. Referring to FIG. 42, no first vias 13 are formed, and the first passivation layer 15 is formed on at least a portion of the top surface (the second surface 142) of the first encapsulant 14 and the second surface 122 of the first semiconductor die 12, and defines a plurality of openings 151 that expose the first pads 124 of the first semiconductor die 12.

Figure 43:
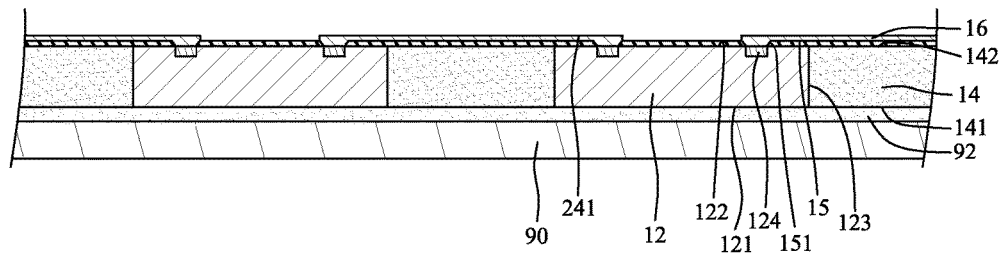

Referring to FIG. 43, the first redistribution layer 16 is formed on at least a portion of the first passivation layer 15 and in its openings 151 to electrically connect the first pads 124 of the first semiconductor die 12.

Figure 44:
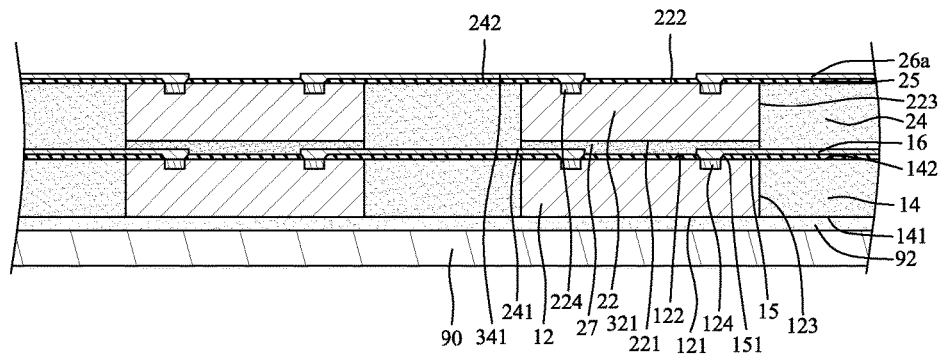

Referring to FIG. 44, the first surface 221 of the second semiconductor die 22 is a backside surface, which faces downward toward the first semiconductor die 12 with reference to the orientation shown in FIG. 44. The first surface 221 of the second semiconductor die 22 is adhered to the first passivation layer 15 and the first redistribution layer 16 through the second adhesion layer 27. The second surface 222 of the second semiconductor die 22 is an active surface, which faces upward with reference to the orientation shown in FIG. 44. The second pads 224 are disposed adjacent to the second surface 222 of the second semiconductor die 22.

Then, the second encapsulant 24 is formed and covers at least a portion of the first encapsulant 14 and the first redistribution layer 16, and encloses at least a portion of the second semiconductor die 22. The second surface 242 of the second encapsulant 24 is substantially coplanar with the second surface 222 of the second semiconductor die 22. Then, the second passivation layer 25 and the second redistribution layer 26a are formed subsequently by a similar way as the first passivation layer 15 and the first redistribution layer 16, respectively.

Figure 45:
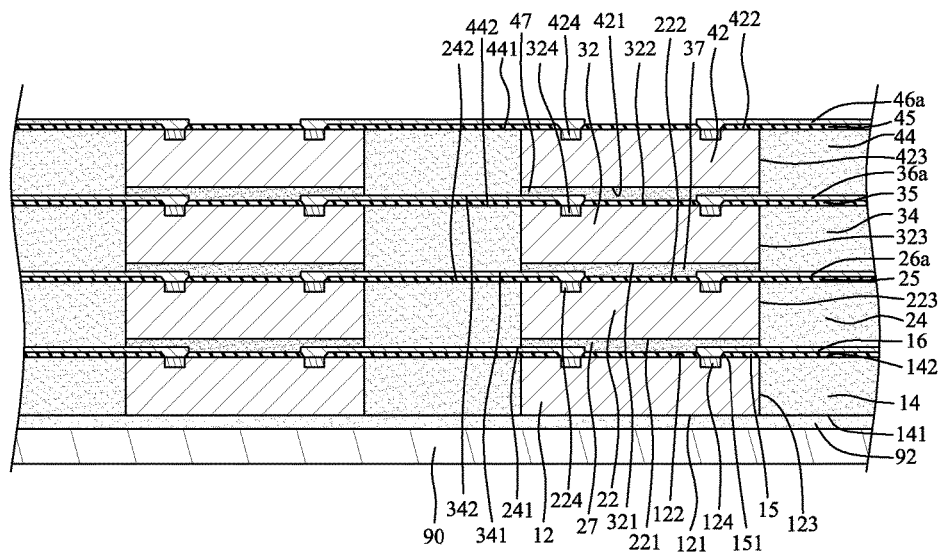

Referring to FIG. 45, the third semiconductor die 32, the third encapsulant 34, the third passivation layer 35 and the third redistribution layer 36a are formed subsequently in a similar manner as the second semiconductor die 22, the second encapsulant 24, the second passivation layer 25 and the second redistribution layer 26a, respectively. Then, the fourth semiconductor die 42, the fourth encapsulant 44, the fourth passivation layer 45 and the fourth redistribution layer 46a are formed subsequently in a similar manner as the third semiconductor die 32, the third encapsulant 34, the third passivation layer 35 and the third redistribution layer 36a, respectively.

Figure 46:
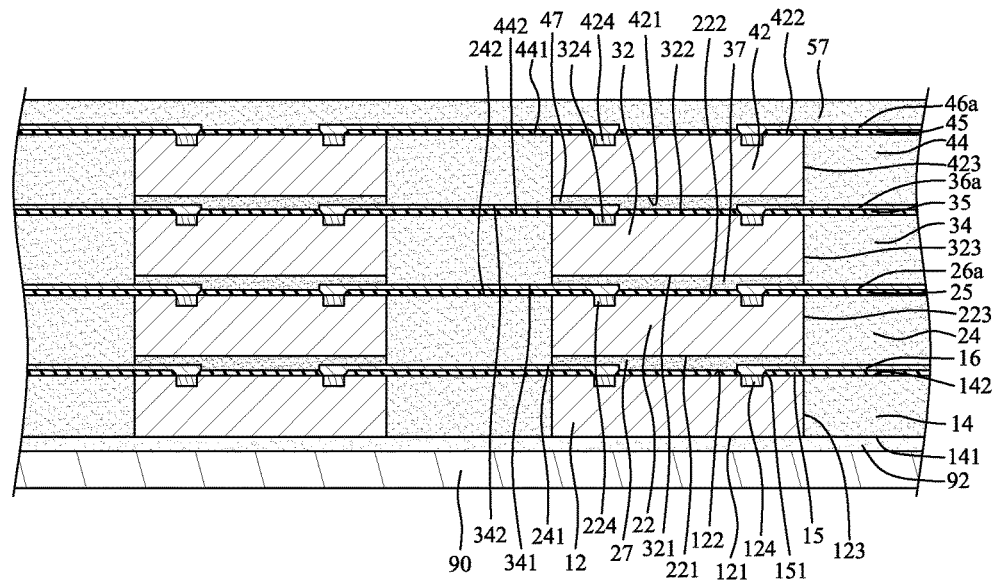

Referring to FIG. 46, the top encapsulant 57 is formed and covers at least a portion of the fourth passivation layer 45 and the fourth redistribution layer 46a.

Figure 47:
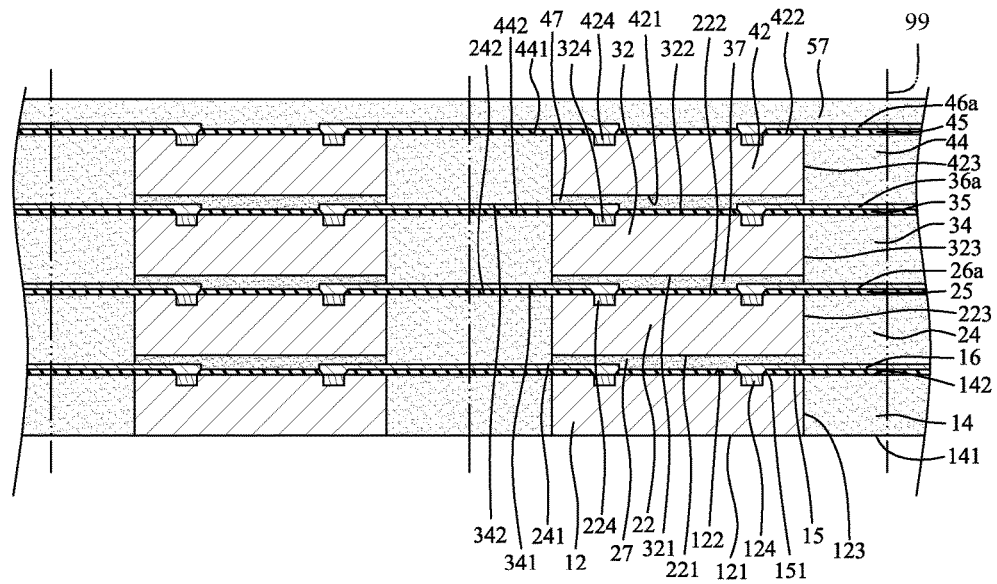

Referring to FIG. 47, the carrier 90 and the adhesion layer 92 are removed. Then, a dicing or singulation process is conducted along the cutting lines 99 to form the lateral surfaces 543, 143, 243, 343, 443 substantially coplanar with each other to form a lateral surface 101 of the semiconductor package 1j (FIG. 17). Then, the patterned conductive layer 60 is formed on at least a portion of the lateral surface 101. Then, the protection layer 65 is formed and covers at least a portion of the patterned conductive layer 60, and defines a plurality of openings 651 that expose the bonding pads 60a for external connection so as to obtain the semiconductor package 1j as shown in FIG. 17.

Figure 48:
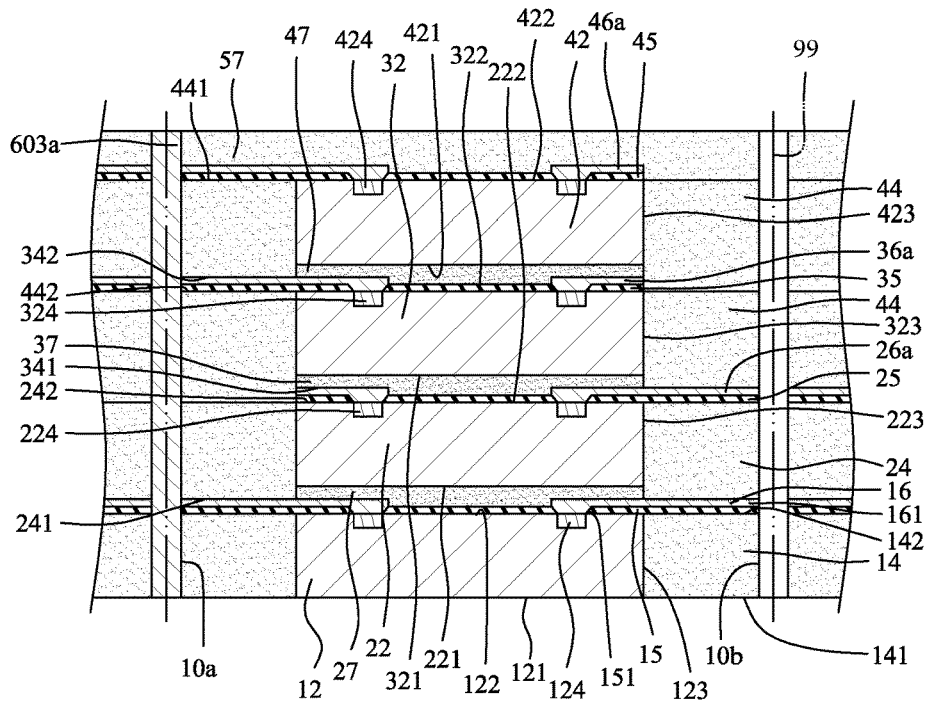
FIG. 48 and FIG. 49 depict cross-sectional views of an example semiconductor package at various stages during an example method for manufacturing the semiconductor package, according to some embodiments of the present disclosure.
Figure 49:
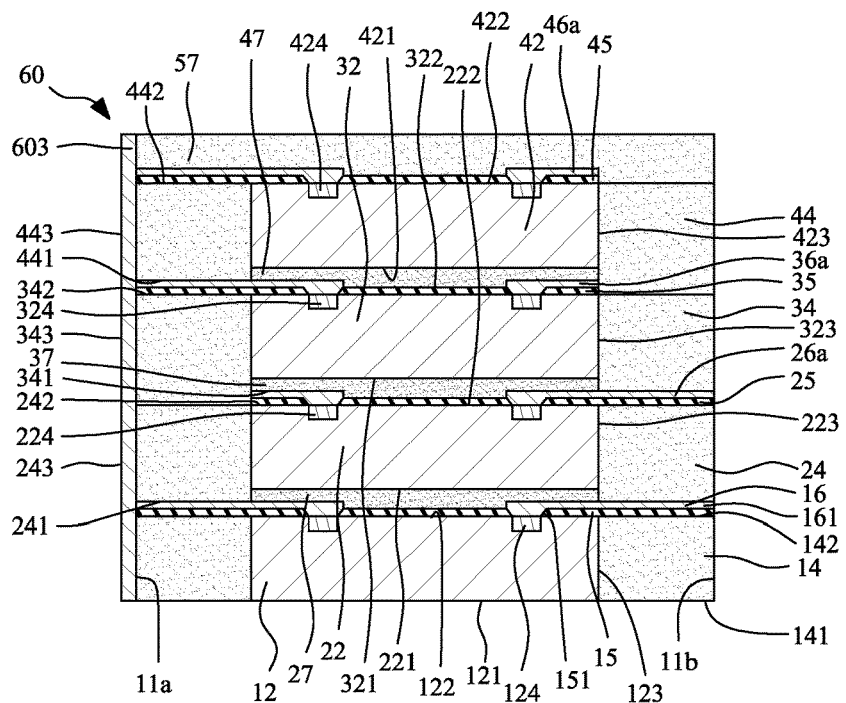

FIGS. 48-49 depict cross-sectional views of an example semiconductor package at various stages during an example method for manufacturing the semiconductor package, according to some embodiments of the present disclosure. The initial stages of this embodiment are similar to the stages illustrated in FIGS. 42 to 47, except that portions of the second passivation layer 25, the second redistribution layer 26a, the third passivation layer 35, the third redistribution layer 36a, the fourth passivation layer 45 and the fourth redistribution layer 46a are omitted. FIG. 48 of this embodiment is subsequent to FIG. 47. Referring to FIG. 48, a plurality of first through holes 10a and second through holes 10b are formed which extend through the top encapsulant 57, the first encapsulant 14, the second encapsulant 24, the third encapsulant 34 and the fourth encapsulant 44.

Then, a metal material is plated and fills the first through holes 10a to form a plurality of solid vias 603a. The second through holes 10b remains empty. Then, a dicing or singulation process is conducted along the cutting lines 99 to cut the solid vias 603a and the empty second through holes 10b. The bottom encapsulant 54, the first encapsulant 14, the second encapsulant 24, the third encapsulant 34 and the fourth encapsulant 44 are also singulated to form the lateral surfaces 543, 143, 243, 343, and 443, respectively.

Referring to FIG. 49, the solid vias 603a and the empty second through holes 10b are cut to become a plurality of first grooves 11a and second grooves 11b, respectively. The first grooves 11a and second grooves 11b extend from the top surface of the semiconductor package 1r (FIG. 24) to the bottom surface the semiconductor package 1r (FIG. 24), and are disposed on or recessed from the lateral surface (including the lateral surface 143 of the first encapsulant 14, the lateral surface 243 of the second encapsulant 24, the lateral surface 343 of the third encapsulant 34 and the lateral surface 443 of the fourth encapsulant 44) of the semiconductor package 1r (as depicted in FIG. 24). A first portion 603 of the solid via 603a that remains in the first groove 11a forms a portion of the patterned conductive layer 60. As shown in FIG. 42, the first portion 603 extends from the top surface of the semiconductor package 1r to the bottom surface the semiconductor package 1r, and electrically connects the first redistribution layer 16, the third redistribution layer 36a and the fourth redistribution layer 46a.

Then, a metal material is formed in a desired position in the groove 11b by selectively plating or jet printing to form a second portion 604 so as to obtain the semiconductor package 1r as shown in FIG. 24. The second portion 604 is also a portion of the patterned conductive layer 60. The second portion 604 does not extend from the top surface of the semiconductor package 1r to the bottom surface the semiconductor package 1r.

Figure 50:
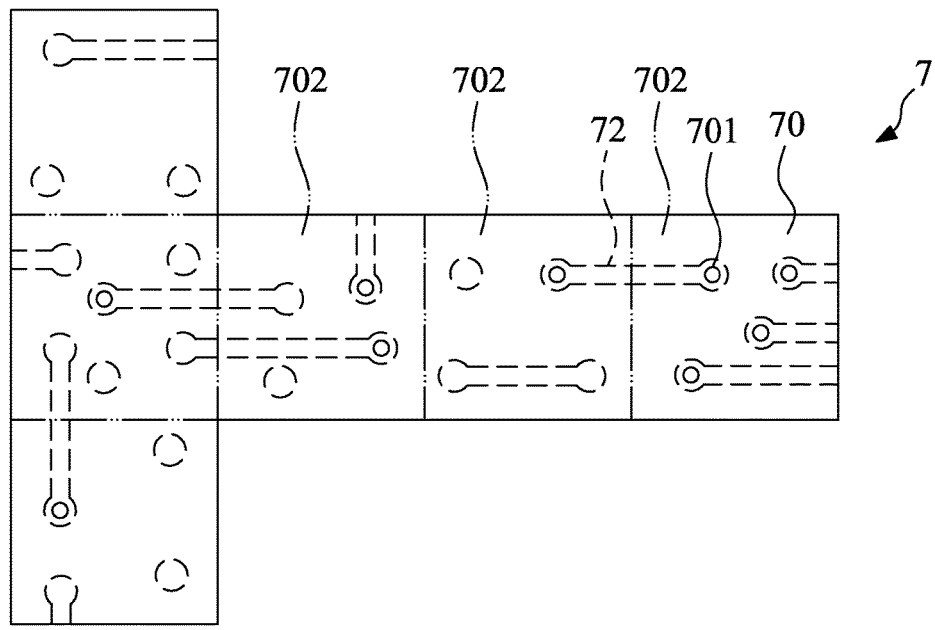
FIG. 50, FIG. 51 and FIG. 52 depict cross-sectional views of an example semiconductor package at various stages during an example method for manufacturing the semiconductor package, according to some embodiments of the present disclosure.
Figure 51:
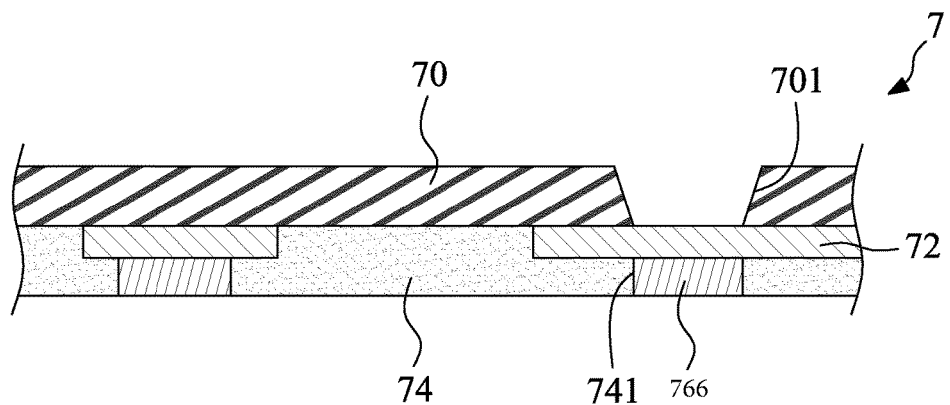
Figure 52:
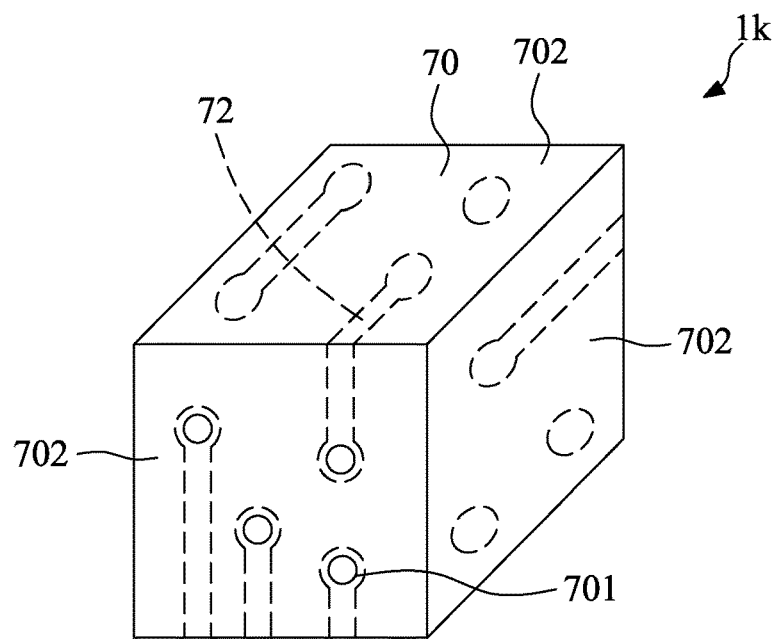

FIGS. 50-52 depict cross-sectional views of an example semiconductor package at various stages during an example method for manufacturing the semiconductor package, according to some embodiments of the present disclosure. FIG. 50 depicts a top view of an example of a substrate 7 according to some embodiments of the present disclosure. FIG. 51 depicts a partially cross-sectional view of an example of a substrate 7 according to some embodiments of the present disclosure. Referring to FIGS. 50 and 51, the substrate 7 is a flexible substrate, and includes a main layer 70, at least one circuit layer 72, an adhesion layer 74 and plurality of deposits of conductive materials 766 that can include one or more materials such as solders, conductive pastes, conductive adhesives, pillars, etc. The deposits of conductive materials 766 can be, in some embodiments, the conductive bumps 76. The main layer 70 is of a dielectric material or an insulation material, and defines a plurality of opening 701 that expose a portion of the circuit layer 72 for external connection. The circuit layer 72 is disposed on or embedded in the main layer 70. The adhesion layer 74 covers at least a portion of the main layer 70 and the circuit layer 72, and defines a plurality of openings 741 that expose a portion of the circuit layer 72. The deposits of conductive materials 766 are disposed in the openings 741 defined by the adhesion layer 74 and contact the circuit layer 72. As shown in FIG. 50, the substrate 7 includes six substrate portions 702. Each of the substrate portions 702 respectively corresponds to one of the lateral surfaces 101, the top side and the bottom side of the semiconductor package 1j (depicted in FIG. 17). At least one portion of the circuit layer 72 spans over two substrate portions 702.

Referring to FIG. 52, the substrate 7 is bonded to the semiconductor package 1j shown in FIG. 17 without the protection layer 65. Thus, the substrate 7 is bonded to the patterned conductive layer 60 of the semiconductor package 1j. That is, the semiconductor package 1j is wrapped by the substrate 7 so as to obtain the semiconductor package 1k shown in FIGS. 18 and 52. As shown in FIG. 18, the substrate 7 is attached to the semiconductor package 1j shown in FIG. 17 through the adhesion layer 74, and the deposits of conductive materials 766 are electrically connected to the patterned conductive layer 60 of the semiconductor package 1j. As shown in FIGS. 18 and 52, a portion of the circuit layer 72 is disposed over an area corresponding at least two lateral surfaces 101 of the semiconductor package 1j.

Figure 53:
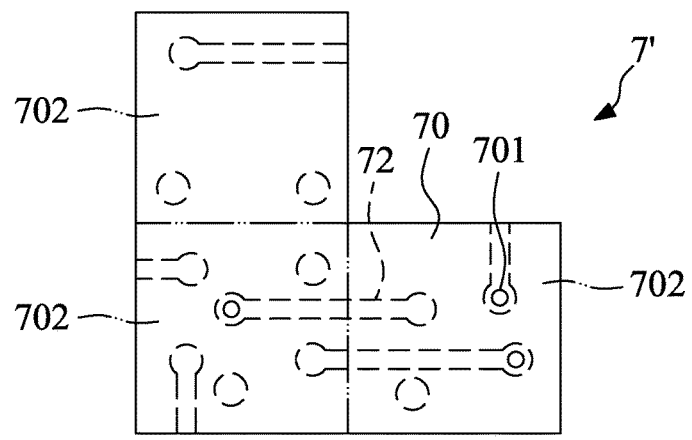
FIG. 53 depicts a top view of an example of a substrate according to some embodiments of the present disclosure.

FIG. 53 depicts a top view of an example of a substrate 7' according to some embodiments of the present disclosure. The substrate 7' is similar to the substrate 7 shown in FIG. 50, and similar features are numbered alike and not further described with respect to FIG. 53. In FIG. 50, the substrate 7 includes six substrate portions 702. In comparison, the substrate 7' of FIG. 53 includes three substrate portions 702. When the semiconductor package 1j (FIG. 17) is wrapped by the substrate 7', the semiconductor package 1n' shown in FIG. 21 is obtained.

Figure 54:
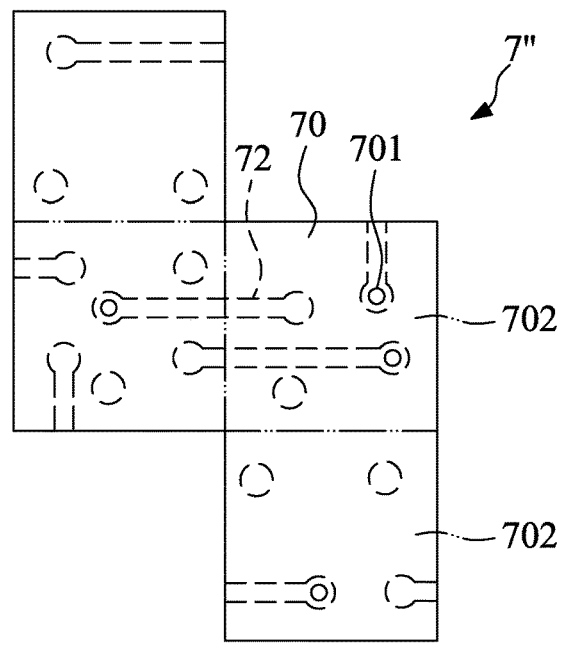
FIG. 54 depicts a top view of an example of a substrate according to some embodiments of the present disclosure.

FIG. 54 depicts a top view of an example of a substrate 7" according to some embodiments of the present disclosure. The substrate 7" is similar to the substrate 7' shown in FIG. 53, and similar features are numbered alike and not further described with respect to FIG. 54. In FIG. 54, the substrate 7" includes four substrate portions 702.

Figure 55:
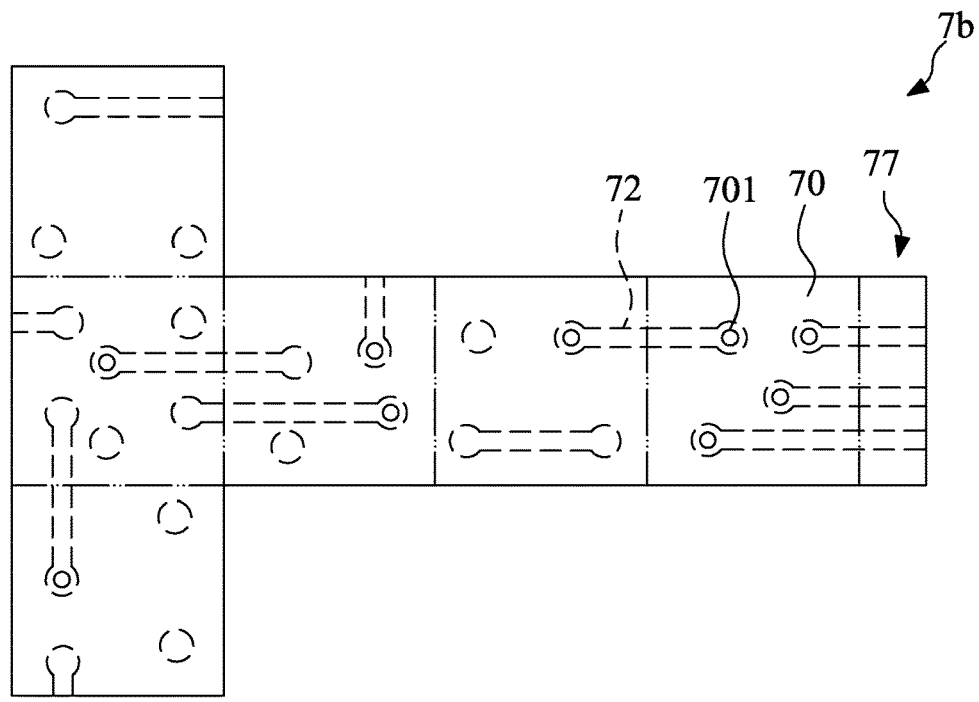
FIG. 55 and FIG. 56 depict cross-sectional views of an example semiconductor package at various stages during an example method for manufacturing the semiconductor package, according to some embodiments of the present disclosure.
Figure 56:
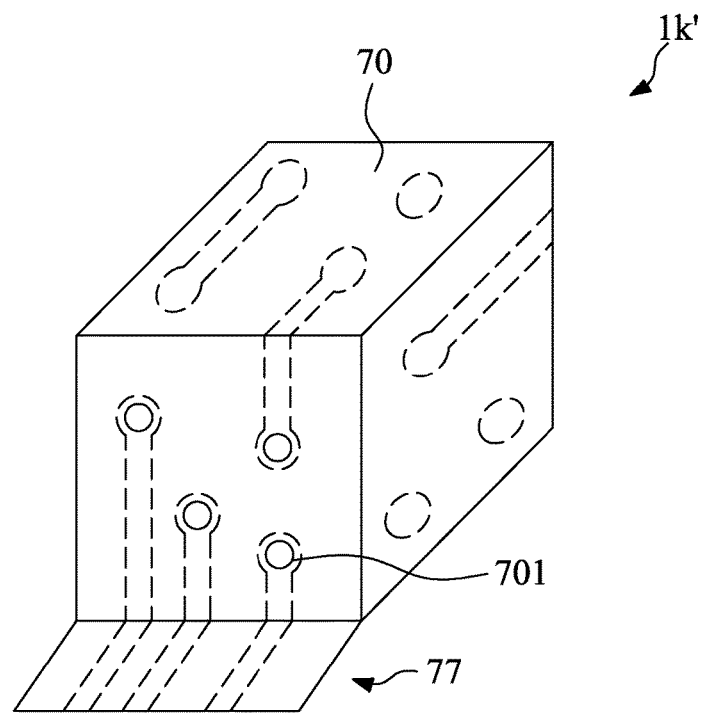

FIGS. 55-56 depict cross-sectional views of an example semiconductor package at various stages during an example method for manufacturing the semiconductor package, according to some embodiments of the present disclosure. FIG. 55 depicts a top view of an example of a substrate 7b according to some embodiments of the present disclosure. The substrate 7b is similar to the substrate 7 shown in FIG. 50, and similar features are numbered alike and not further described with respect to FIG. 55. In FIG. 55, the substrate 7b further includes an extending portion 77. The circuit layer 72 further extends to the extending portion 77, and may be used for external connection.

Referring to FIG. 56, the substrate 7b is bonded to the semiconductor package 1j shown in FIG. 17 without the protection layer 65. Thus, the substrate 7b is bonded to the patterned conductive layer 60 of the semiconductor package 1j. That is, the semiconductor package 1j is wrapped by the substrate 7b so as to obtain the semiconductor package 1k' shown in FIG. 56. The semiconductor package 1k' is similar to the semiconductor package 1k shown in FIG. 52, and similar features are numbered alike and not further described with respect to FIG. 56. In FIG. 56, the semiconductor package 1k' further includes the extending portion 77 extending from the semiconductor package 1k'. In one or more embodiments, the extending portion 77 may be inserted into a slot of another electrical device or bonded to the surface of another device.

The flexible circuit may be bonded to any number or all surfaces of a CuP. A lay-out of the flexible circuit can accommodate connection to traces of different faces of the CuP. Hence, traces on the flexible circuit may extend over the fold lines of one, two or more faces (e.g., can extend from one face to another).

Figure 57:
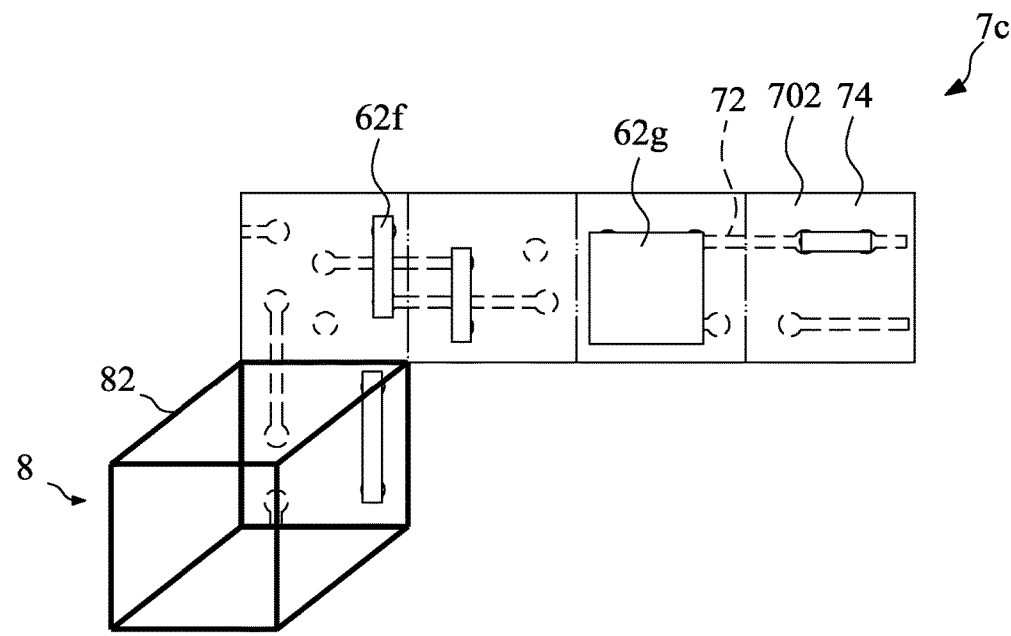
FIG. 57 and FIG. 58 depict cross-sectional views of an example semiconductor package at various stages during an example method for manufacturing a semiconductor package according to some embodiments of the present disclosure.
Figure 58:
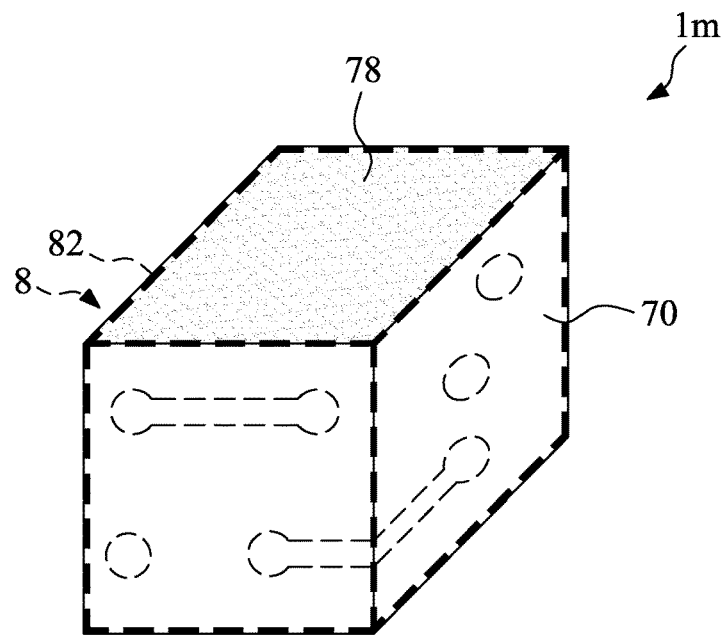

FIGS. 57-58 depict cross-sectional views of an example semiconductor package at various stages during an example method for manufacturing a semiconductor package according to some embodiments of the present disclosure. Referring to FIG. 57, a substrate 7c and a frame 8 are provided. The substrate 7c is similar to the substrate 7 shown in FIG. 50, and similar features are numbered alike and not further described with respect to FIG. 57. In FIG. 57, the substrate 7c includes five substrate portions 702. In addition, the substrate 7c further includes at least one passive component 62f and at least one semiconductor die 62g bonded to the adhesion layer 74 and electrically connected to the circuit layer 72. The frame 8 includes twelve strips 82 forming a cubic structure. Sets of four strips 82 can respectively define an area corresponding to a substrate portions 702 of the substrate 7c.

Referring to FIG. 58, the frame 8 is wrapped by the substrate 7c and forms an accommodating space to accommodate the passive component 62f and the semiconductor die 62g. Then, an encapsulant 78 is applied in the accommodating space to cover the passive component 62f and the semiconductor die 62g to obtain a semiconductor package 1m. It is noted that the encapsulant 78 can increase the structure strength of the semiconductor package 1m.

Figure 59:
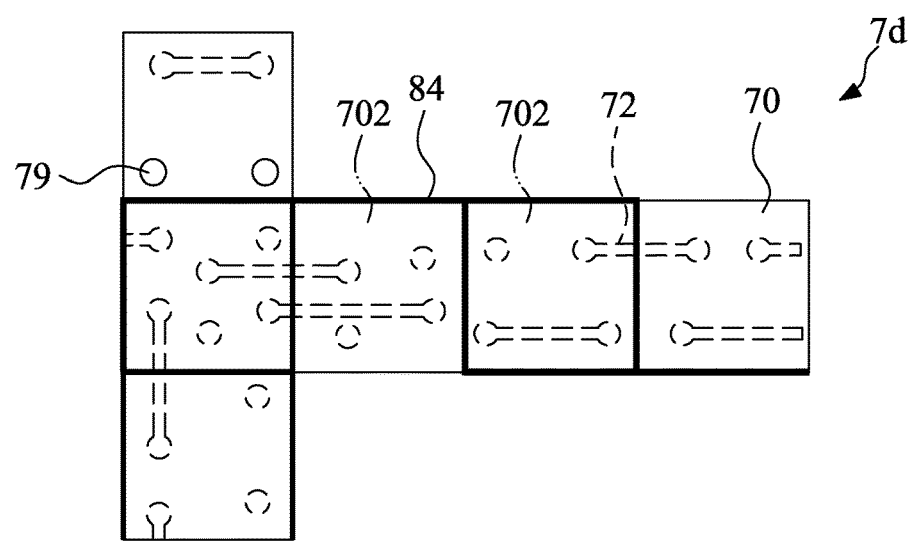
FIG. 59 and FIG. 60 depict cross-sectional views of an example semiconductor package at various stages during an example method for manufacturing a semiconductor package according to some embodiments of the present disclosure.
Figure 60:
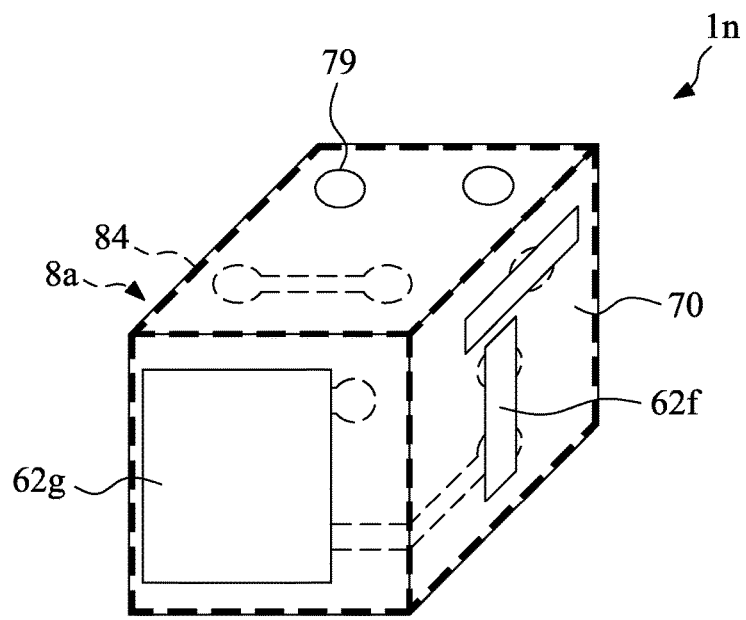

FIGS. 59-60 depict cross-sectional views of an example semiconductor package at various stages during an example method for manufacturing a semiconductor package according to some embodiments of the present disclosure. Referring to FIG. 59, a substrate 7d is provided. The substrate 7d is similar to the substrate 7 shown in FIG. 50, and similar features are numbered alike and not further described with respect to FIG. 59. In FIG. 59, the substrate 7d includes a plurality of strips 84 disposed on the edges of the substrate portions 702. In addition, the substrate 7d further defines at least a portion of at least one through hole 79 in a substrate portion 702.

Referring to FIG. 60, the substrate 7d is folded along the strips 84 so as to form a cubic structure. Meanwhile, the strips 84 form a frame 8a. Sets of four strips 84 can define an area corresponding to substrate portions 702 of the substrate 7d. It is noted that the center of the cubic structure is empty. Then, an encapsulant 78 or other suitable material is applied to the center of the cubic structure through the through hole 79 so as to increase the structure strength of the cubic structure. Then, the passive component 62f and the semiconductor die 62g are bonded to the main layer 70 and are electrically connected to the circuit layer 72 so as to obtain a semiconductor package 1n.

Figure 61:
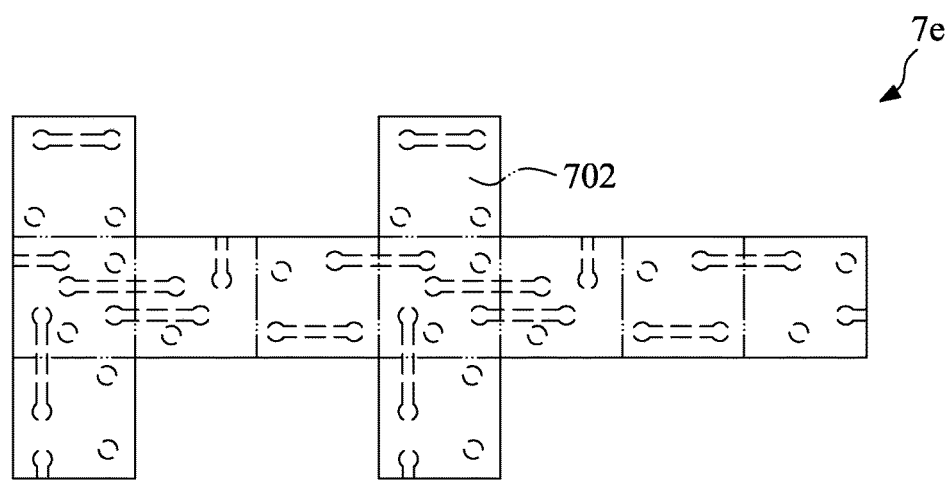
FIG. 61, FIG. 62 and FIG. 63 depict cross-sectional views of an example semiconductor package at various stages during an example method for manufacturing a semiconductor package according to some embodiments of the present disclosure.
Figure 62:
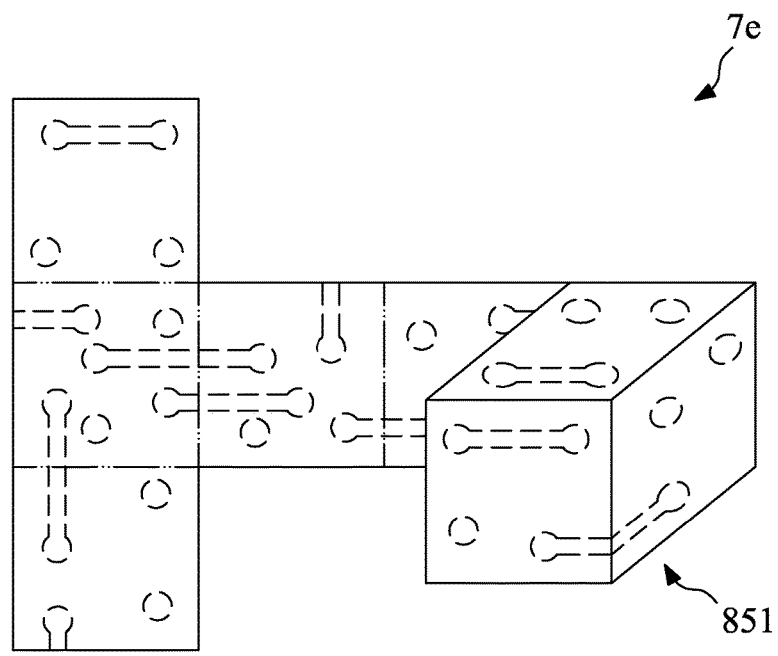
Figure 63:
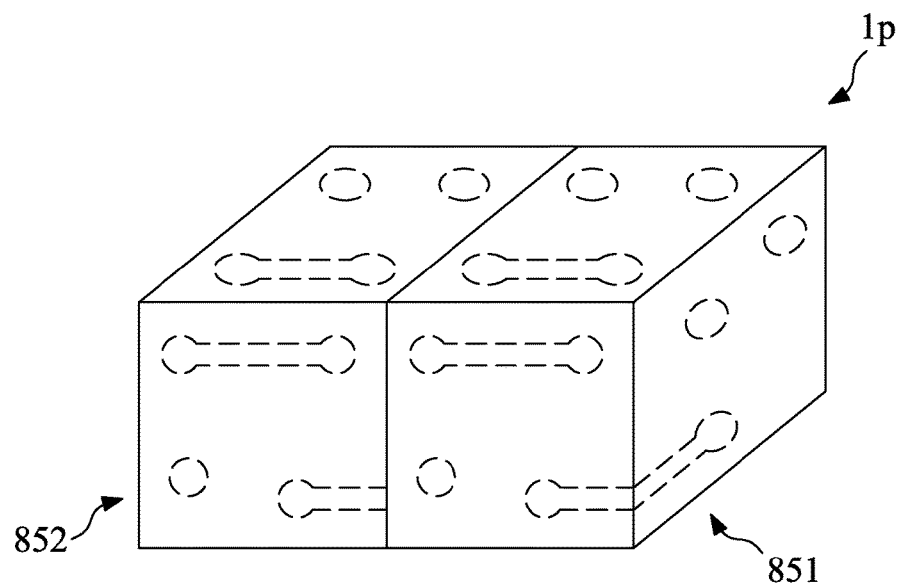

FIGS. 61-63 depict cross-sectional views of an example semiconductor package at various stages during an example method for manufacturing a semiconductor package according to some embodiments of the present disclosure. Referring to FIG. 61, a substrate 7e is provided. The substrate 7e is similar to the substrate 7 shown in FIG. 50, and similar features are numbered alike and not further described with respect to FIG. 61. In FIG. 61, the substrate 7e includes eleven substrate portions 702.

Referring to FIG. 62, substrate portions on a right side of the substrate 7e are folded so as to form a first cubic structure 851.

Referring to FIG. 63, substrate portions on the left side of the substrate 7e are folded so as to form a second cubic structure 852 connecting the first cubic structure 851. This forms a semiconductor package 1p. The semiconductor package 1p includes the first cubic structure 851 and the second cubic structure 852 bonded together, wherein the first cubic structure 851 and the second cubic structure 852 share one substrate portion 702.

Figure 64A:
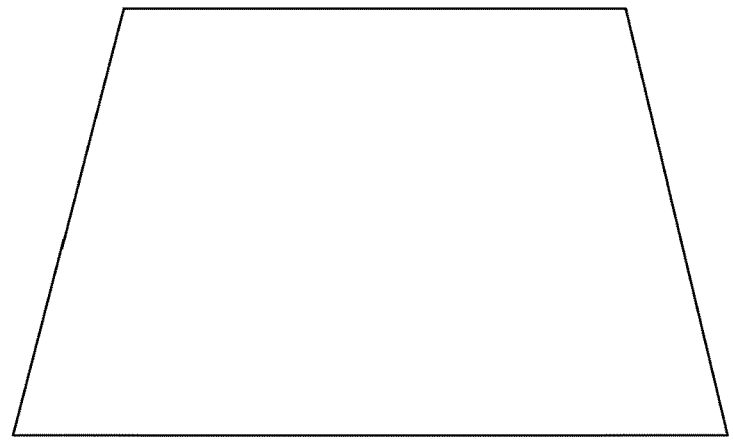
FIG. 64a depicts a front view of an example lateral surface of a semiconductor package according to some embodiments of the present disclosure.

FIGS. 64a depicts a front view of an example lateral surface of a semiconductor package according to some embodiments of the present disclosure. The front view of the lateral surfaces of the semiconductor packages described above are square or rectangular. However, the front view of the lateral surface of the semiconductor packages described herein can be in other shape, for example, a pyramidal shape such as a trapezoid, as shown in FIG. 64a.

Figure 64B:
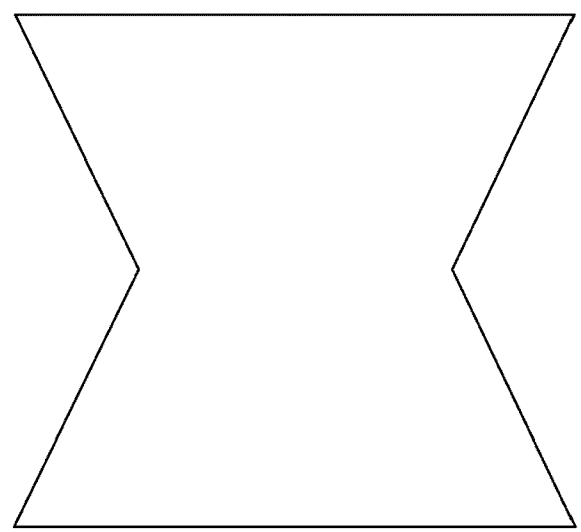
FIG. 64b depicts a front view of an example lateral surface of a semiconductor package according to some embodiments of the present disclosure.

FIGS. 64b depicts a front view of an example lateral surface of a semiconductor package according to some embodiments of the present disclosure. The front view of the lateral surface of the semiconductor package described above may be a combination of two trapezoids joined together at a top surface of one trapezoid and a bottom surface of another trapezoid.

Figure 64C:
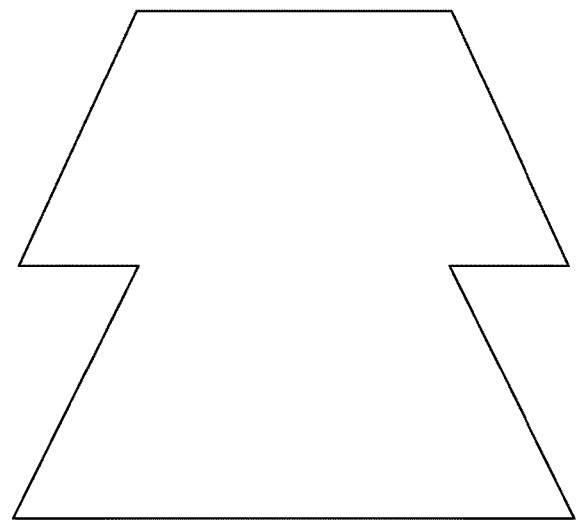
FIG. 64c depicts a front view of an example lateral surface of a semiconductor package according to some embodiments of the present disclosure.

FIGS. 64c depicts a front view of an example lateral surface of a semiconductor package according to some embodiments of the present disclosure. The front view of the lateral surface of the semiconductor package described above may be a combination of two stacked trapezoids.

Figure 64D:
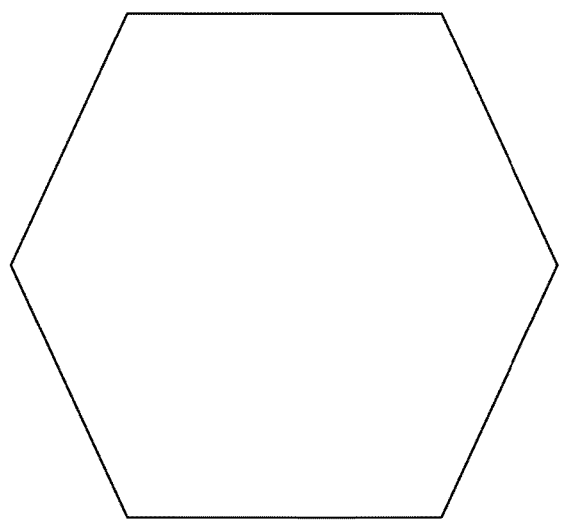
FIG. 64d depicts a front view of an example lateral surface of a semiconductor package according to some embodiments of the present disclosure.

FIGS. 64d depicts a front view of an example lateral surface of a semiconductor package according to some embodiments of the present disclosure. The front view of the lateral surface of the semiconductor package described above may be a hexahedron.

Figure 64E:
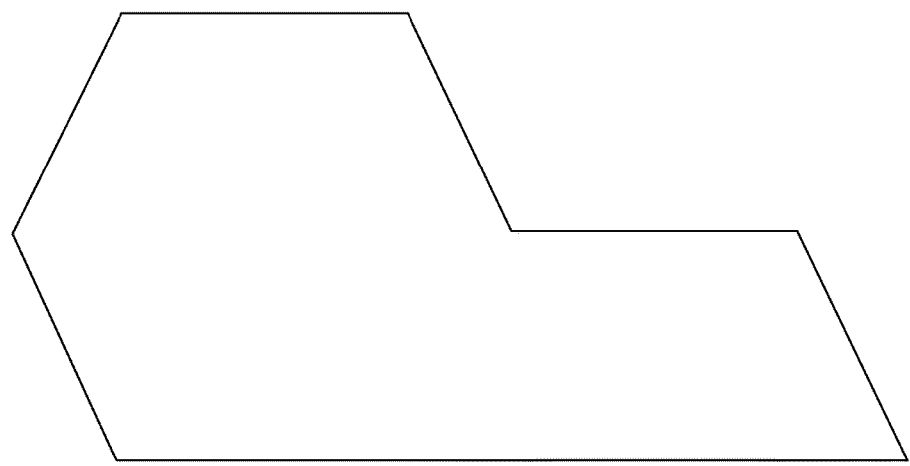
FIG. 64e depicts a front view of an example lateral surface of a semiconductor package according to some embodiments of the present disclosure.

FIGS. 64e depicts a front view of an example lateral surface of a semiconductor package according to some embodiments of the present disclosure. The front view of the lateral surface of the semiconductor package described above may be a combination of a hexahedron and a trapezoid in which the hexahedron and the trapezoid are joined together.

Optionally, the stacked trapezoids or other CuPs may be formed individually and assembled to each other or to motherboards or chassis as desired. The framed or wrapped CuPs may be of any shape that can be formed by folding a substrate around a frame, such as, for example, a tetrahedron, a pentahedron, a hexahedron, or an octahedron. CuPs of the same or different shape can be bonded to each other, and CuPs of different sizes can be bonded together.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not lost by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

In the description of some embodiments, a component provided "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such a range format is used for convenience and brevity and should be understood flexibly to include numerical values explicitly specified as limits of a range, and also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

The invention claimed is:

1. A semiconductor package, comprising:
a first semiconductor die;
a first encapsulant enclosing the first semiconductor die and having a top surface and a lateral surface;
a first redistribution layer disposed on the top surface of the first encapsulant and electrically connected to the first semiconductor die, wherein a portion of the first redistribution layer is exposed from the lateral surface of the first encapsulant;
a second encapsulant covering the first encapsulant and the first redistribution layer; and
a patterned conductive layer disposed on at least one of the lateral surface of the first encapsulant or a lateral surface of the second encapsulant, wherein the patterned conductive layer is electrically connected to the first redistribution layer and comprises a plurality of bonding pads.

2. The semiconductor package of claim 1, wherein a bottom surface of the first encapsulant is substantially coplanar with a bottom surface of the first semiconductor die.

3. The semiconductor package of claim 1, further comprising at least one second semiconductor die, wherein the second encapsulant encloses the second semiconductor die.

4. The semiconductor package of claim 3, wherein the patterned conductive layer is disposed on the lateral surface of the first encapsulant corresponding to a lateral surface of the first semiconductor die, and on the lateral surface of the second encapsulant corresponding to a lateral surface of the second semiconductor die.

5. The semiconductor package of claim 1, wherein the patterned conductive layer includes a plurality of routing traces.

6. The semiconductor package of claim 1, wherein the patterned conductive layer includes a first laminated circuit layer and a second laminated circuit layer, wherein a line width or line space of the first laminated circuit layer is greater than a line width or line space of the second laminated circuit layer, wherein the first laminated circuit layer is closer to the first encapsulant or the second encapsulant than is the second laminated circuit layer.

7. The semiconductor package of claim 6, further comprising at least one fan-out wafer level device bonded to the second laminated circuit layer.

8. The semiconductor package of claim 1, further comprising at least one side electrical component bonded to the patterned conductive layer.

9. The semiconductor package of claim 1, further comprising at least one substrate bonded to the patterned conductive layer.

10. The semiconductor package of claim 9, wherein the substrate is a flexible substrate.

11. The semiconductor package of claim 9, wherein the semiconductor package has a plurality of lateral surfaces, wherein one of the lateral surfaces of the semiconductor package is exposed from the substrate.

12. The semiconductor package of claim 9, wherein the semiconductor package has a plurality of lateral surfaces, wherein the substrate includes at least one circuit layer, and a portion of the circuit layer extends over an area corresponding to at least two lateral surfaces of the semiconductor package.

13. The semiconductor package of claim 1, wherein the semiconductor package has a plurality of lateral surfaces, wherein the patterned conductive layer is disposed on all of the lateral surfaces.

14. The semiconductor package of claim 1, wherein an end of the first redistribution layer is substantially coplanar with the lateral surface of the first encapsulant and the lateral surface of the second encapsulant.

15. The semiconductor package of claim 1, further comprising:
a bottom circuit layer disposed on a bottom surface of the first encapsulant;
a bottom encapsulant covering the first encapsulant and the first redistribution layer; and
a plurality of first vias extending through the first encapsulant and electrically connecting the first redistribution layer and the bottom circuit layer, wherein the first vias surround the first semiconductor die.

16. The semiconductor package of claim 1, wherein the lateral surface of the first encapsulant and the lateral surface of the second encapsulant define a groove, and the patterned conductive layer is disposed in a portion of the groove on the lateral surface of the first encapsulant and on the lateral surface of the second encapsulant.

17. The semiconductor package of claim 1, further comprising a first passivation layer disposed between the first encapsulant and the second encapsulant.

18. The semiconductor package of claim 17, wherein the first passivation layer has a lateral surface, and wherein an end of the first redistribution layer, the lateral surface of the first passivation layer, the lateral surface of the first encapsulant and the lateral surface of the second encapsulant are substantially coplanar.

19. The semiconductor package of claim 17, wherein the first semiconductor die includes a plurality of first pads, and wherein the first passivation layer is disposed on the top surface of the first encapsulant and the first semiconductor die, and defines a plurality of openings that expose the plurality of first pads of the first semiconductor die, wherein the first redistribution layer is disposed on the first passivation layer and in the openings.

20. A semiconductor package, comprising:
a first semiconductor die having a bottom surface and a plurality of pads;
an encapsulant having a lateral surface and encapsulating the first semiconductor die, wherein the bottom surface of the first semiconductor die is exposed from the encapsulant;
a first redistribution layer electrically connected to the pads of the first semiconductor die, wherein a portion of the first redistribution layer is exposed from the lateral surface of the encapsulant; and
a patterned conductive layer disposed on the lateral surface of the encapsulant, wherein the patterned conductive layer is electrically connected to the first redistribution layer and comprises a plurality of bonding pads.

21. The semiconductor package of claim 20, wherein the encapsulant includes a first encapsulant and a second encapsulant, and the first redistribution layer is disposed between the first encapsulant and the second encapsulant.

22. The semiconductor package of claim 21, further comprising a second semiconductor die, wherein the second encapsulant encloses the second semiconductor die and the first encapsulant encloses the first semiconductor die.

23. The semiconductor package of claim 20, wherein an end of the first redistribution layer is substantially coplanar with the lateral surface of the encapsulant.

24. A semiconductor manufacturing process, comprising:
(a) disposing a first semiconductor die on a carrier;
(b) forming a first encapsulant having a lateral surface, the first encapsulant enclosing the first semiconductor die;

(c) forming a first redistribution layer disposed over the first encapsulant and the first semiconductor die which is electrically connected to the first semiconductor die;

(d) forming a second encapsulant having a lateral surface, the second encapsulant covering the first encapsulant and the first redistribution layer;

(e) singulating the first encapsulant and the second encapsulant such that a portion of the first redistribution layer is exposed from the lateral surface of the first encapsulant and the lateral surface of the second encapsulant; and (f) forming a patterned conductive layer on at least one of the lateral surface of the first encapsulant or the lateral surface of the second encapsulant, wherein the patterned conductive layer is electrically connected to the first redistribution layer and comprises a plurality of bonding pads.

25. The semiconductor manufacturing process of claim 24, wherein the first semiconductor die includes a plurality of first pads, and wherein after (b), the semiconductor manufacturing process further comprises:

(b1) forming a first passivation layer on the first encapsulant and the first semiconductor die, wherein the first passivation layer defines a plurality of openings that expose the plurality of first pads of the first semiconductor die;

wherein in (c), the first redistribution layer is formed on the first passivation layer and in the openings thereof.

26. The semiconductor manufacturing process of claim 25, wherein the first passivation layer has a lateral surface, wherein in (e), the first encapsulant and the second encapsulant are singulated such that an end of the first redistribution layer, the lateral surface of the first passivation layer, the lateral surface of the first encapsulant and the lateral surface of the second encapsulant are substantially coplanar.

27. The semiconductor manufacturing process of claim 24, wherein after (b), the semiconductor manufacturing process further comprises:

(b1) forming a plurality of first vias that extend through the first encapsulant;

wherein in (c), the first redistribution layer is electrically connected to the first vias.

28. The semiconductor manufacturing process of claim 24, wherein after (c), the semiconductor manufacturing process further comprises:

(c1) bonding a second semiconductor die to the first redistribution layer;

wherein in (d), the second encapsulant covers the second semiconductor die.

29. The semiconductor manufacturing process of claim 28, wherein an active surface of the second semiconductor die faces an active surface of the first semiconductor die.

30. The semiconductor manufacturing process of claim 28, wherein a backside surface of the second semiconductor die faces an active surface of the first semiconductor die.

31. The semiconductor manufacturing process of claim 24, wherein after (d), the semiconductor manufacturing process further comprises:

(d1) forming a plurality of second vias that extend through the second encapsulant, wherein the second vias are electrically connected to the first redistribution layer.

32. The semiconductor manufacturing process of claim 24, wherein after (d), the semiconductor manufacturing process further comprises:

(d1) forming a circuit layer on the second encapsulant.

33. The semiconductor manufacturing process of claim 24, wherein after (f), the semiconductor manufacturing process further comprises:

(g) bonding at least one substrate to the patterned conductive layer.

34. A semiconductor package, comprising:

a first semiconductor die;

a first encapsulant enclosing the first semiconductor die and having a top surface and a lateral surface;

a first redistribution layer disposed over the top surface of the first encapsulant and electrically connected to the first semiconductor die, wherein a portion of the first redistribution layer is exposed from the lateral surface of the first encapsulant;

a second encapsulant covering the first encapsulant and the first redistribution layer, and having a lateral surface;

a patterned conductive layer disposed on at least one of the lateral surface of the first encapsulant or the lateral surface of the second encapsulant, and comprising a plurality of bonding pads; and a flexible substrate disposed on at least one of the bonding pads of the patterned conductive layer, and electrically connected to the first redistribution layer.

35. The semiconductor package of claim 34, wherein the flexible substrate includes a main layer, at least one circuit layer, an adhesion layer and plurality of conductive bumps, the main layer defines a plurality of openings that expose a portion of the circuit layer for external connection, the circuit layer is disposed on or embedded in the main layer, the adhesion layer covers the main layer and the circuit layer, and defines a plurality of openings that expose a portion of the circuit layer, the conductive bumps are disposed in the openings of the adhesion layer and contact the circuit layer, and the flexible substrate is attached to at least one of the first encapsulant or the second encapsulant through the adhesion layer.

36. The semiconductor package of claim 35, wherein the patterned conductive layer is electrically connected to the first redistribution layer, and the conductive bumps of the flexible substrate are electrically connected to the patterned conductive layer.

37. The semiconductor package of claim 36, wherein a line width or line space of the patterned conductive layer is substantially equal to a line width or line space of the circuit layer of the flexible substrate.

38. The semiconductor package of claim 35, wherein the at least one circuit layer is a first circuit layer, the substrate further includes a second circuit layer electrically connected to the first circuit layer, the first circuit layer and the second circuit layer are embedded in or on the main layer, the openings of the main layer expose a portion of the second circuit layer for external connection, the first circuit layer is closer to the first encapsulant or the second encapsulant than is the second circuit layer, and a line width or line space of the first circuit layer is greater than a line width or line space of the second circuit layer.

39. The semiconductor package of claim 34, further comprising a side package bonded to the flexible substrate.

40. A semiconductor package, comprising:

a first semiconductor die having a bottom surface and a plurality of pads;

an encapsulant encapsulating the first semiconductor die and having a lateral surface, wherein the bottom surface of the first semiconductor die is exposed from the encapsulant;

a first redistribution layer electrically connected to the pads of the first semiconductor die, wherein a portion of the first redistribution layer is exposed from the lateral surface of the encapsulant;

a patterned conductive layer disposed on the lateral surface of the encapsulant and comprising a plurality of bonding pads; and a flexible substrate disposed on at least one of the bonding pads of the patterned conductive layer, and electrically connected to the first redistribution layer.

41. The semiconductor package of claim 40, wherein the flexible substrate includes a main layer, at least one circuit layer, an adhesion layer and plurality of conductive bumps, the main layer defines a plurality of openings that expose a portion of the circuit layer for external connection, the circuit layer is disposed on or embedded in the main layer, the adhesion layer covers the main layer and the circuit layer, and defines a plurality of openings that expose a portion of the circuit layer, the conductive bumps are disposed in the openings of the adhesion layer and contact the circuit layer, and the flexible substrate is attached to the encapsulant through the adhesion layer.

42. The semiconductor package of claim 41, wherein the patterned conductive layer is electrically connected to the first redistribution layer, and the conductive bumps of the flexible substrate are electrically connected to the patterned conductive layer.

43. The semiconductor package of claim 42, wherein a line width or line space of the patterned conductive layer is substantially equal to a line width or line space of the circuit layer of the flexible substrate.

44. The semiconductor package of claim 41, wherein the at least one circuit layer is a first circuit layer, the substrate further includes a second circuit layer electrically connected to the first circuit layer, the first circuit layer and the second circuit layer are embedded in or on the main layer, the openings of the main layer expose a portion of the second circuit layer for external connection, the first circuit layer is closer to the encapsulant than is the second circuit layer, and a line width or line space of the first circuit layer is greater than a line width or line space of the second circuit layer.

45. The semiconductor package of claim 40, further comprising a side package bonded to the flexible substrate.

46. The semiconductor package of claim 40, wherein the flexible substrate covers all four lateral surfaces, a top side and a bottom side of the encapsulant.

47. The semiconductor package of claim 40, wherein at least one lateral surface of the encapsulant is exposed from the flexible substrate.

* * * * *